(12) United States Patent
Huang et al.

(10) Patent No.: US 12,414,441 B2
(45) Date of Patent: Sep. 9, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Binyan Wang, Beijing (CN); Yudiao Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/788,555

(22) PCT Filed: Apr. 30, 2021

(86) PCT No.: PCT/CN2021/091465
§ 371 (c)(1),
(2) Date: Jun. 23, 2022

(87) PCT Pub. No.: WO2022/226994
PCT Pub. Date: Nov. 3, 2022

(65) Prior Publication Data
US 2024/0172509 A1 May 23, 2024

(51) Int. Cl.
*H01L 23/64* (2006.01)
*H01L 21/02* (2006.01)
(Continued)

(52) U.S. Cl.
CPC ..... *H10K 59/1216* (2023.02); *H10K 59/1315* (2023.02); *H10K 59/131* (2023.02)

(58) Field of Classification Search
CPC ........ G02F 1/13452; G09G 2300/0426; H10K 59/131; H10K 59/1315
See application file for complete search history.

(56) References Cited

U.S. PATENT DOCUMENTS 10,854,124 B2 12/2020 Yang et al.
10,997,888 B2 5/2021 Yang et al.
(Continued)

FOREIGN PATENT DOCUMENTS

CN 107610636 A 1/2018
CN 107611142 A 1/2018
(Continued)

OTHER PUBLICATIONS

Chinese Office Action cited in corresponding Chinese Application No. 202180001042.5, dated Aug. 10, 2024 with English translation, 10 pages.
(Continued)

*Primary Examiner* — John A Bodnar
(74) *Attorney, Agent, or Firm* — LEASON ELLIS LLP

(57) ABSTRACT

A display panel and a display device are provided. The display panel includes: a base substrate having a display region and a peripheral region, the peripheral region being located on at least one side of the display region; a pixel unit located on the base substrate and including a pixel circuit and a light-emitting element, the pixel circuit being configured to drive the light-emitting element, the pixel circuit including a driving transistor and a data writing transistor, and the driving transistor being connected to the data writing transistor; a data line connected to the data writing transistor and configured to provide a data signal to the pixel circuit; and a compensation structure connected to the data line and located in the peripheral region, the compensation structure (Continued)

including at least one of a resistance compensation unit or a capacitance compensation unit.

20 Claims, 40 Drawing Sheets

(51) Int. Cl.
  *H01L 21/68* (2006.01)
  *H10K 59/121* (2023.01)
  *H10K 59/131* (2023.01)

(56) References Cited

U.S. PATENT DOCUMENTS

| | | | |
|---|---|---|---|
| 2011/0241014 A1* | 10/2011 | Yoon | H10K 59/131 257/72 |
| 2017/0053975 A1* | 2/2017 | Cho | H01L 27/1288 |
| 2018/0357960 A1 | 12/2018 | Yang et al. | |
| 2021/0266483 A1* | 8/2021 | Cheng | G06V 40/12 |

FOREIGN PATENT DOCUMENTS

| | | | |
|---|---|---|---|
| CN | 107670636 | * | 1/2018 |
| CN | 108010942 A | | 5/2018 |
| CN | 108646486 A | | 10/2018 |
| CN | 109698226 A | | 4/2019 |
| CN | 109904214 A | | 6/2019 |
| CN | 110060575 A | | 7/2019 |
| CN | 112310163 A | | 2/2021 |
| KR | 1020090005651 A | | 1/2009 |

OTHER PUBLICATIONS

International Search Report cited in PCT/CN2021/091465 dated Dec. 10, 2021 with English translation, 4 pages.

* cited by examiner

DISPLAY PANEL AND DISPLAY DEVICE

CROSS-REFERENCE TO RELATED PATENT APPLICATIONS

This application is a U.S. National Phase Entry of International Application No. PCT/CN2021/091465 filed on Apr. 30, 2021. The present application claims priority to and the benefit of the above-identified application and the above-identified application is incorporated by reference herein in its entirety.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure provides a display panel and a display device.

At least one embodiment of the present disclosure provides a display panel, which includes: a base substrate having a display region and a peripheral region, the peripheral region being located on at least one side of the display region; a pixel unit located on the base substrate and including a pixel circuit and a light-emitting element, the pixel circuit being configured to drive the light-emitting element, the pixel circuit including a driving transistor and a data writing transistor, and the driving transistor being connected to the data writing transistor; a data line connected to the data writing transistor and configured to provide a data signal to the pixel circuit; and a compensation structure connected to the data line and located in the peripheral region, the compensation structure including at least one of a resistance compensation unit or a capacitance compensation unit.

For example, the capacitance compensation unit includes at least one compensation capacitor.

For example, the capacitance compensation unit includes a plurality of compensation capacitors, and the plurality of compensation capacitors are connected in parallel.

For example, the compensation capacitor includes a compensation portion connected to the data line and at least one compensation electrode-plate forming a compensation capacitor with the compensation portion.

For example, the compensation structure includes a resistance compensation unit, the resistance compensation unit includes a first compensation portion connected to the data line and a second compensation portion connected to the first compensation portion, the first compensation portion and the second compensation portion are located in different layers, and an orthographic projection of the first compensation portion on the base substrate at least partially overlaps with an orthographic projection of the second compensation portion on the base substrate.

For example, the first compensation portion and the second compensation portion are connected through a via hole.

For example, the compensation structure includes a capacitance compensation unit, the capacitance compensation unit includes a first compensation portion, a first electrode-plate, a second compensation portion, and a second electrode-plate, the first compensation portion is connected to the data line, the first compensation portion overlaps with the first electrode-plate to form a first compensation capacitor, and the second compensation portion overlaps with the first electrode-plate to form a second compensation capacitor, the second compensation portion overlaps with the second electrode-plate to form a third compensation capacitor, and the first compensation capacitor, the second compensation capacitor, and the third compensation capacitor are connected in parallel.

For example, the first compensation portion is located in a first conductive layer, the first electrode-plate is located in a second conductive layer, the second compensation portion is located in a third conductive layer, and the second electrode-plate is located in a fourth conductive layer, the first conductive layer is located on a first insulating layer, a second insulating layer is disposed between the first conductive layer and the second conductive layer, a third insulating layer is disposed between the second conductive layer and the third conductive layer, and a fourth insulating layer is disposed between the third conductive layer and the fourth conductive layer.

For example, the first compensation portion and the second compensation portion form the resistance compensation unit.

For example, an orthographic projection of the first compensation portion on the base substrate at least partially overlaps with an orthographic projection of the second compensation portion on the base substrate.

For example, a width of the first compensation portion in a first direction is same as a width of the second compensation portion in the first direction, the first direction intersects with an extending direction of the first compensation portion and intersects with an extending direction of the second compensation portion.

The first compensation portion and the second compensation portion are connected through a via hole penetrating both the third insulating layer and the second insulating layer.

For example, the display panel further includes a first connection structure, the data line is connected to the first compensation portion through the first connection structure.

For example, the third conductive layer further includes a signal line, the signal line extends in a first direction, and an orthographic projection of the signal line on the base substrate overlaps with an orthographic projection of the first compensation portion on the base substrate.

For example, the first electrode-plate and the second electrode-plate are both connected to a constant voltage terminal, and the constant voltage terminal includes at least one of a first power terminal and a second power terminal.

For example, the display panel further includes a second connection structure, the data line is connected to a plurality of capacitance compensation units through the second connection structure, and capacitors of the plurality of capacitance compensation units connected to the data line are connected in parallel.

For example, the first electrode-plates of different capacitance compensation units are of an integrated structure, or the second electrode-plates of different capacitance compensation units are of an integrated structure.

For example, a plurality of capacitance compensation units are arranged in a first direction; at one side of a center line of the display panel, a size of the first electrode-plate in a second direction gradually changes, and a size of the second electrode-plate in the second direction gradually changes; the first direction intersects with the second direction, and the center line is parallel with the second direction.

For example, the display region includes a first display region and a second display region, the first display region is located on at least one side of the second display region, and the data line is not located in the second display region.

For example, the data line includes a first-type data line and a second-type data line, the compensation structure includes a first compensation structure and a second compensation structure, and a compensation amount of the first compensation structure connected to the first-type data line is greater than a compensation amount of the second compensation structure connected to the second-type data line.

For example, a plurality of first-type data lines and a plurality of first compensation structures are provided, the plurality of first compensation structures are arranged in sequence, and among the plurality of first compensation structures, the closer the first compensation structure is to an edge of the display panel, the smaller the compensation amount of the first compensation structure is.

For example, a plurality of second-type data lines and a plurality of second compensation structures are provided, each of the plurality of second-type data lines includes a first portion, a second portion, and a third portion, the first portion and the second portion are connected through the third portion, an extending direction of the third portion is different from an extending direction of the first portion, and the extending direction of the third portion is different from an extending direction of the second portion, the third portion is located in the display region, and a compensation amount of the second compensation structure is inversely proportional to a length of the third portion.

For example, the pixel unit includes a first pixel unit and a second pixel unit, the pixel circuit and the light-emitting element of the first pixel unit are both located in the first display region, the pixel circuit of the second pixel unit is located in the first display region, the light-emitting element of the second pixel unit is located in the second display region, the pixel circuit of the second pixel unit is connected to the light-emitting element of the second pixel unit through a conductive line, and an orthographic projection of the conductive line on the base substrate partially overlaps with an orthographic projection of the pixel circuit of the first pixel unit on the base substrate.

At least one embodiment of the present disclosure further provides display device, including any one of the display panels as described above.

For example, the display device further includes a photosensitive sensor, the photosensitive sensor is located on one side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

FIG. 14G is an enlarged schematic diagram of the compensation structure in FIG. 14I;

DETAILED DESCRIPTION

Figure 1:
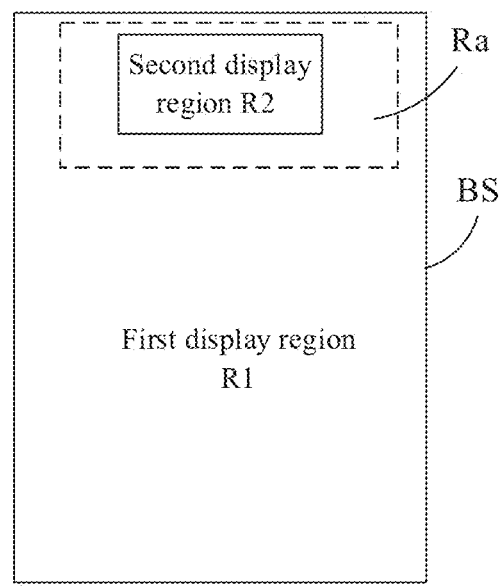
FIG. 1 is a schematic structural diagram of a display panel provided by an embodiment of the present disclosure.

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

With the development of display technology, the existing notch screen or water drop screen design gradually cannot meet user's demand for a high screen-to-body ratio of a display panel, and a series of display panels with light-transmitting display regions have emerged as the times require. In this type of display panel, hardware such as a photosensitive sensor (for example, a camera) can be disposed in the light-transmitting display region. Because there is no need to punch holes, it is possible to realize a true full screen on the premise of ensuring the practicability of the display panel.

In a related art, a display panel with an under-screen camera generally includes a first display region for normal display and a second display region for disposing a camera. The second display region generally includes a plurality of light-emitting elements and a plurality of pixel circuits. Each pixel circuit is connected to a light-emitting element and used to drive the light-emitting element to emit light, and the pixel circuit and the light-emitting element connected to each other overlap with each other in a direction perpendicular to the display panel.

Because pixel circuits are also disposed in the second display region in the related art, the light transmittance of the second display region is poor, and accordingly, the display effect of the display panel is poor.

FIG. 1 is a schematic structural diagram of a display panel provided by an embodiment of the present disclosure. As illustrated in FIG. 1, the display panel includes a base substrate BS. The display panel includes a first display region R1 and a second display region R2, and the first display region R1 may be located on at least one side of the second display region R2. For example, in some embodiments, the first display region R1 surrounds the second display region R2. That is, the second display region R2 may be surrounded by the first display region R1. The second display region R2 can also be arranged at other positions, and the arrangement position of the second display region R2 can be determined according to needs. For example, the second display region R2 may be located at the top middle position of the base substrate BS, or may be located at the upper left position or the upper right position of the base substrate BS. For example, hardware such as a photosensitive sensor (for example, a camera) is disposed in the second display region R2 of the display panel. For example, the second display region R2 is a light-transmitting display region, and the first display region R1 is a display region. For example, the first display region R1 is opaque and only used for display.

Figure 2:
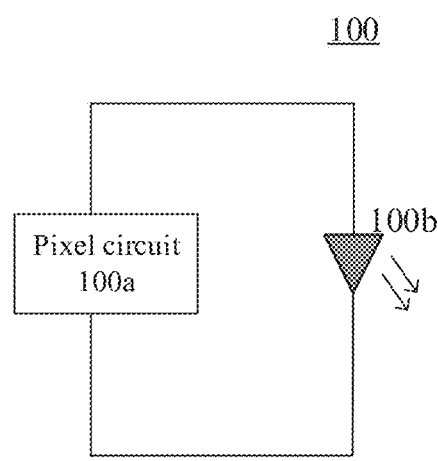
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100, and the pixel unit 100 is located on a base substrate. As illustrated in FIG. 2, the pixel unit 100 includes a pixel circuit 100a and a light-emitting element 100b, and the pixel circuit 100a is configured to drive the light-emitting element 100b. For example, the pixel circuit 100a is configured to provide a driving current to drive the light-emitting element 100b to emit light. For example, the light-emitting element 100b is an organic light-emitting diode (OLED), and the light-emitting element 100b emits red light, green light, blue light, or white light under the driving of its corresponding pixel circuit 100b. The light-emitting color of the light-emitting element 100b can be determined according to needs.

In order to increase the light transmittance of the second display region R2, only light-emitting elements may be disposed in the second display region R2, and pixel circuits for driving the light-emitting elements of the second display region R2 may be disposed in the first display region R1. That is, the light transmittance of the second display region R2 is improved by the way that the light-emitting elements and the pixel circuits are separately disposed.

Figure 3:
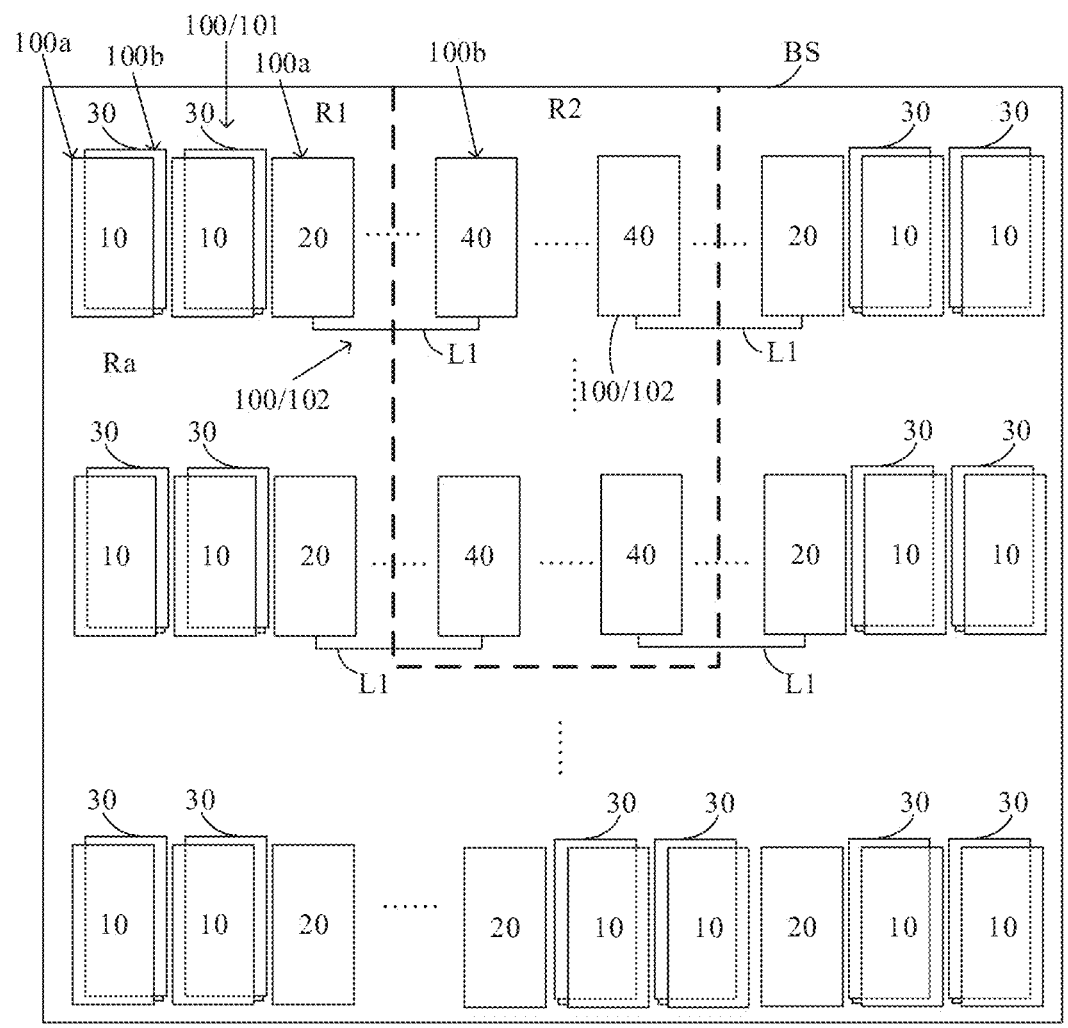
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes a plurality of first pixel circuits 10, a plurality of second pixel circuits 20, and a plurality of first light-emitting elements 30 located in a first display region R1, and a plurality of second light-emitting elements 40 located in a second display region R2. For example, the plurality of second pixel circuits 20 may be distributed among the plurality of first pixel circuits 10 at intervals.

For example, as illustrated in FIG. 3, at least one first pixel circuit 10 of the plurality of first pixel circuits 10 is connected to at least one first light-emitting element 30 of the plurality of first light-emitting elements 30, and an orthographic projection of the at least one first pixel circuit 10 on the base substrate BS at least partially overlaps with an orthographic projection of the at least one first light-emitting element 30 on the base substrate BS. The at least one first pixel circuit 10 can be used to provide a driving signal for the connected first light-emitting element 30 to drive the first light-emitting element 30 to emit light.

For example, as illustrated in FIG. 3, at least one second pixel circuit 20 of the plurality of second pixel circuits 20 is connected to at least one second light-emitting element 40 of the plurality of second light-emitting elements 40 through a conductive line L1, and the at least one second pixel circuit 20 can be used to provide a driving signal for the connected second light-emitting element 40 to drive the second light-emitting element 40 to emit light. As illustrated in FIG. 3, because the second light-emitting element 40 and the second pixel circuit 20 are located in different regions, there is no overlap between an orthographic projection of the at least one second pixel circuit 20 on the base substrate BS and an orthographic projection of the at least one second light-emitting element 40 on the base substrate BS.

For example, in the embodiments of the present disclosure, the first display region R1 can be set as an opaque display region, and the second display region R2 can be set as a light-transmitting display region. For example, the first display region R1 cannot transmit light, and the second display region R2 can transmit light. In this way, the display panel provided by the embodiment of the present disclosure does not need to perform drilling processing on the display panel, and the required hardware structure such as the photosensitive sensor can be directly arranged at a position corresponding to the second display region R2 on one side of the display panel, which lays a solid foundation for the realization of a true full screen. In addition, because the second display region R2 only includes light-emitting elements and does not include pixel circuits, it is beneficial to increase the light transmittance of the second display region R2, so that the display panel has a better display effect.

As illustrated in FIG. 3, the pixel unit 100 includes a first pixel unit 101 and a second pixel unit 102. A pixel circuit 100a and a light-emitting element 100b of the first pixel unit 101 are both located in the first display region R1, a pixel circuit 100a of the second pixel unit 102 is located in the first display region R1, and a light-emitting element 100b of the second pixel unit 102 is located in the second display region R2. In the embodiments of the present disclosure, the pixel circuit 100a of the first pixel unit 101 is the first pixel circuit 10, the light-emitting element 100b of the first pixel unit 101 is the first light-emitting element 30, the pixel circuit 100a of the second pixel unit 101 is the second pixel circuit 20, and the light-emitting element 100b of the second pixel unit 102 is the second light-emitting element 40. For example, the first light-emitting element 30 may be referred to as an in-situ light-emitting element. For example, the first pixel circuit 10 may be referred to as an in-situ pixel circuit, and the second pixel circuit 20 may be referred to as an ex-situ pixel circuit.

For example, as illustrated in FIG. 3, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line.

As illustrated in FIG. 3, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of conductive oxide material. For example, the conductive oxide material includes indium tin oxide (ITO), but is not limited thereto.

As illustrated in FIG. 3, one end of the conductive line L1 is connected to the second pixel circuit 20, and the other end of the conductive line L1 is connected to the second light-emitting element 40. As illustrated in FIG. 3, the conductive line L1 extends from the first display region R1 to the second display region R2.

As illustrated in FIG. 1 and FIG. 3, in some embodiments, the display panel further includes an auxiliary region Ra, and the auxiliary region Ra can be provided with the second pixel circuit 20 that is connected to the second light-emitting element in the second display region R2.

Figure 4:
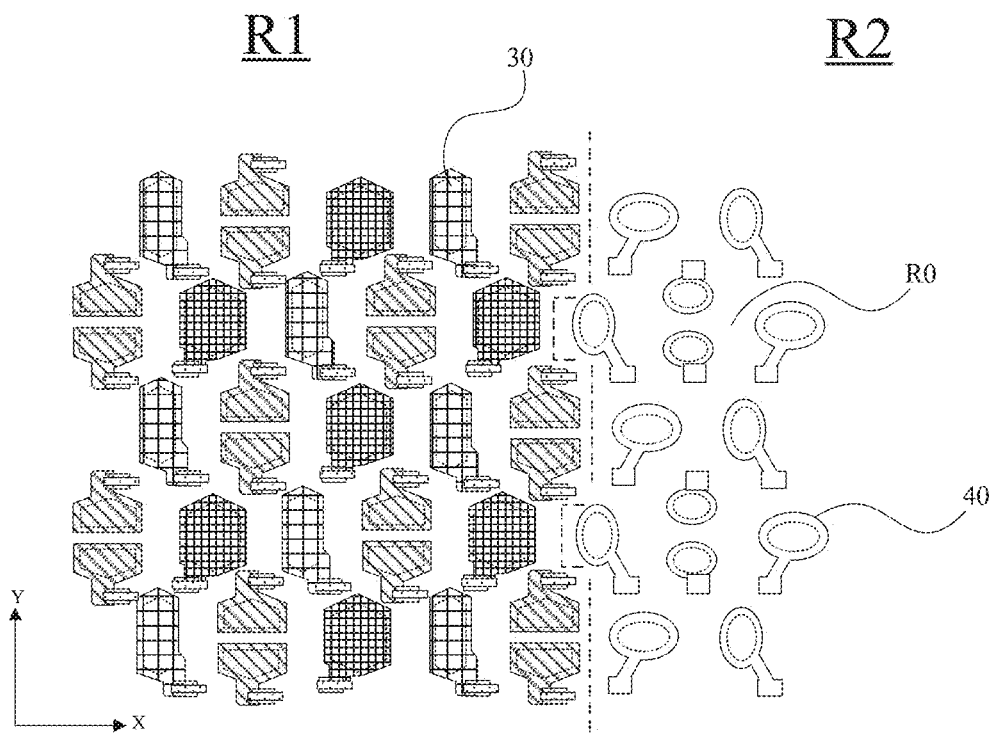
FIG. 4 is a schematic diagram of a first display region and a second display region in a display panel provided by an embodiment of the present disclosure.

FIG. 4 is a schematic diagram of the first display region and the second display region in the display panel provided by an embodiment of the present disclosure. As illustrated in FIG. 4, in the second display region R2, a light-transmitting region R0 is disposed between adjacent second light-emitting elements 40. For example, as illustrated in FIG. 4, a plurality of light-transmitting regions R0 are connected to each other to form a continuous light-transmitting region separated by a plurality of second light-emitting elements 40. The conductive wire L1 is made of a transparent conductive material to increase the light transmittance of the light-transmitting region R0 as much as possible. As illustrated in FIG. 4, the region of the second display region R2 except for the second light-emitting element 40 may be a light-transmitting region.

FIG. 5A to FIG. 5E are partial plan views of a display panel provided by an embodiment of the present disclosure. FIG. 5A to FIG. 5E are described below.

Figure 5A:
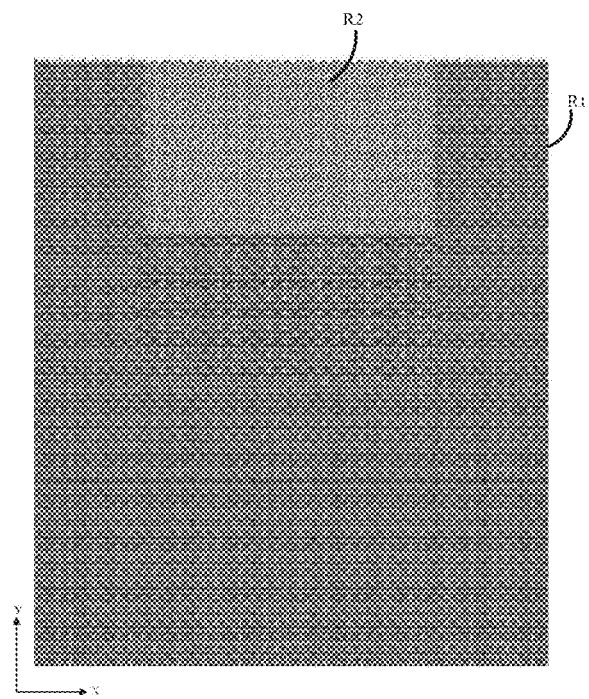
FIG. 5A to FIG. 5E are partial plan views of a display panel provided by an embodiment of the present disclosure.

FIG. 5A is a schematic diagram of a first display region and a second display region of a display panel provided by an embodiment of the present disclosure. As illustrated in FIG. 5A, the second display region R2 is a light-transmitting display region, and the first display region R1 is a display region.

Figure 5B:
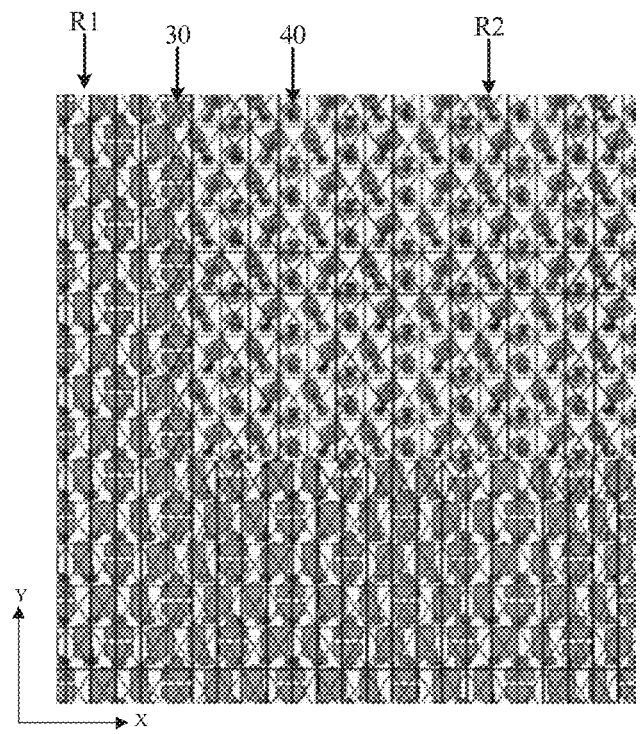

FIG. 5B is a schematic diagram of a first light-emitting element in a first display region and a second light-emitting element in a second display region of a display panel provided by an embodiment of the present disclosure. FIG. 5B illustrates the first light-emitting element 30 and the second light-emitting element 40.

Referring to FIG. 5A, FIG. 5B, and FIG. 3, in order to improve the display effect, the density of the second light-emitting element 40 may be equal to the density of the first light-emitting element 30. That is, the resolution of the second display region R2 is the same as the resolution of the first display region R1. Of course, in other embodiments, the density of the second light-emitting element 40 may be greater or less than the density of the first light-emitting element 30. That is, the resolution of the second display region R2 may be greater or less than the resolution of the first display region R1. For example, as illustrated in FIG. 5B and FIG. 4, the light-emitting area of the second light-emitting element 40 is smaller than the light-emitting area of the first light-emitting element 30. FIG. 4 illustrates the light-emitting area of the second light-emitting element 40 and the light-emitting area of the first light-emitting element 30 with broken lines. For example, the light-emitting area of a light-emitting element may correspond to the area of the opening of a pixel definition layer.

Figure 5C:
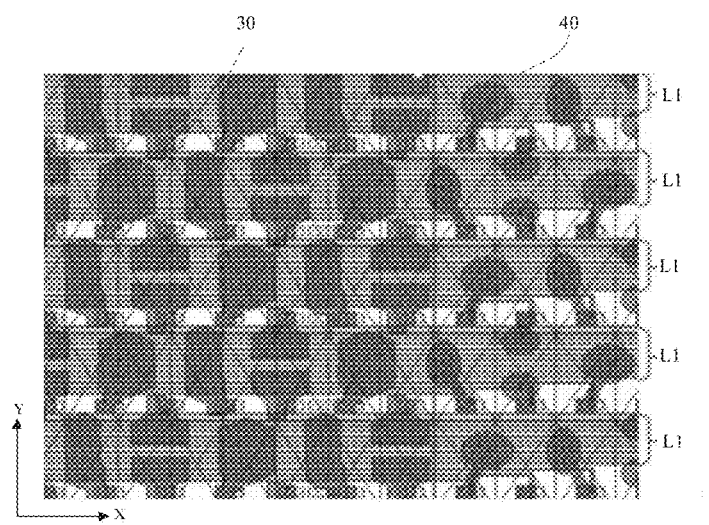

FIG. 5C is a schematic diagram of conductive lines in a display panel provided by an embodiment of the present disclosure. FIG. 5C illustrates a plurality of conductive lines L1.

Figure 5D:
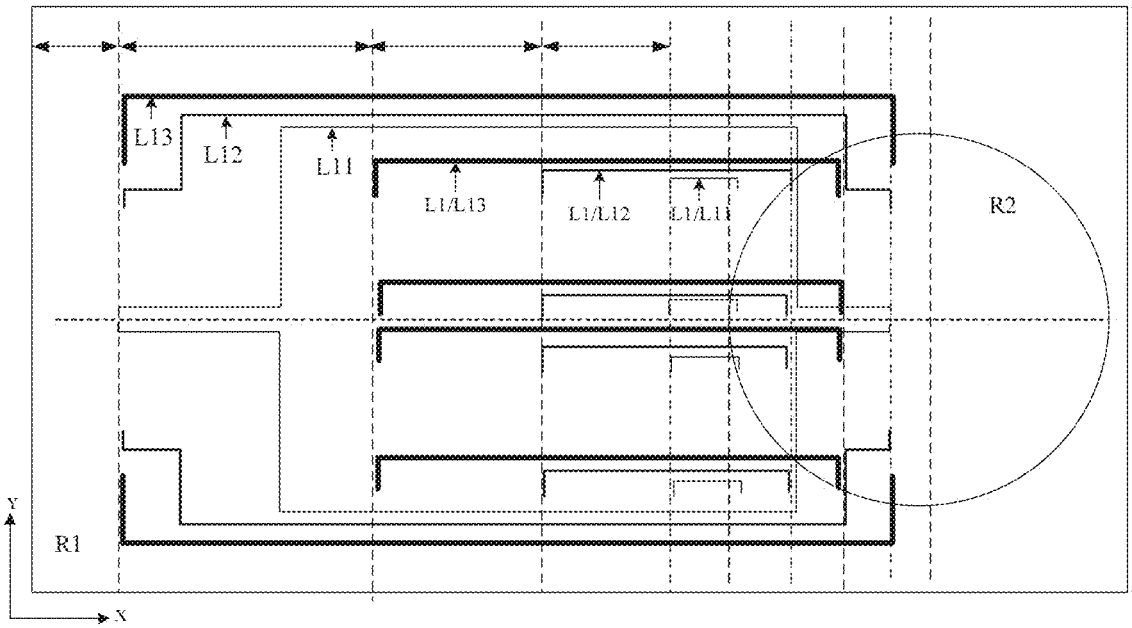

FIG. 5D is a schematic diagram of conductive lines in a display panel provided by an embodiment of the present disclosure. FIG. 5D illustrates the conductive line L1. As illustrated in FIG. 5D, the conductive line L1 includes a first conductive line L11, a second conductive line L12, and a third conductive line L13. In a display panel with a high PPI, in order to avoid too dense conductive lines, a plurality of conductive line pattern layers may be formed, and an insulating layer is arranged between the different conductive line pattern layers. For example, the first conductive line L11 is located in a first conductive line pattern layer, the second conductive line L12 is located in a second conductive line pattern layer, and the third conductive line L13 is located in a third conductive line pattern layer. Of course, in other embodiments, a plurality of conductive lines in other forms can also be provided. For example, one conductive line L1 is formed by several conductive parts located in different conductive line pattern layers. For example, the several conductive parts located in different conductive line pattern layers may be connected to one another through via holes penetrating an insulating layer.

Figure 5E:
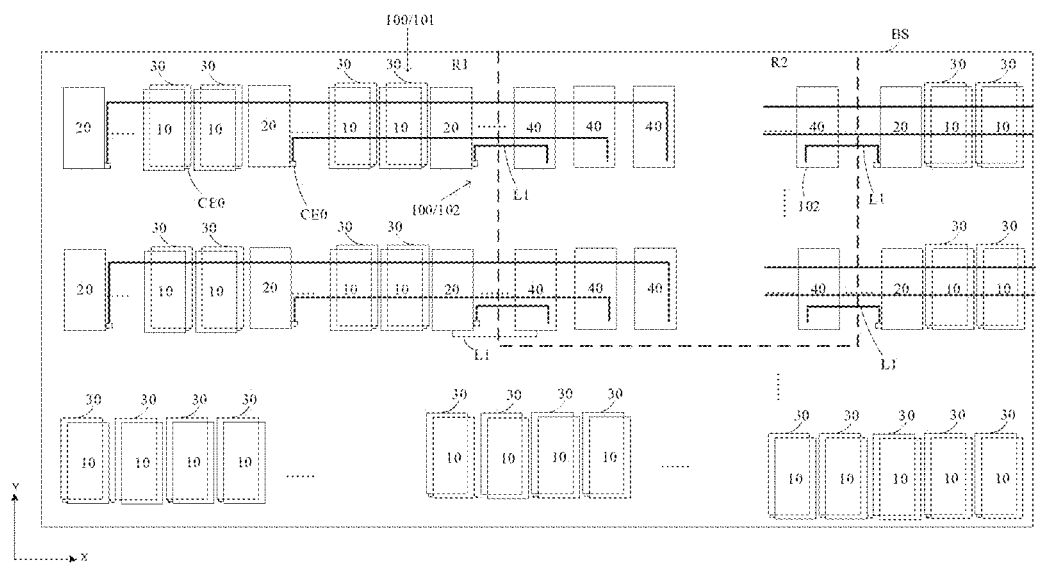

FIG. 5E illustrates the first light-emitting element 30, the second light-emitting element 40, the first pixel circuit 10, the second pixel circuit 20, a connecting element CE0, and the conductive line L1. Each pixel circuit is connected to a light-emitting element through a connecting element CE0. That is, each pixel unit has one connection element CE0. That is, the first pixel circuit 10 is connected to the first light-emitting element 30 through the connecting element CE0, and the second pixel circuit 20 is connected to the second light-emitting element 40 through the connecting element CE0. For example, one end of the conductive line L1 is connected to the second pixel circuit 20 through the connecting element CE0, and the other end of the conductive line L1 is connected to the second light-emitting element 40.

As illustrated in FIG. 5E, one conductive line L1 passes through the region where the pixel circuit of the pixel unit is located to respectively connect the second pixel circuit 20 and the second light-emitting element 40 on both sides of the pixel unit. For example, the region where the pixel circuit of the pixel unit is located overlaps with a plurality of conductive lines L1 passing through the region, so that the pixel circuit and the conductive lines overlapping with the pixel circuit are coupled to form a parasitic capacitance, which causes a difference in brightness to form a display defect such as stripes (Mura). The region in the first display region R1 where the second pixel circuit 20 connected to the second light-emitting element 40 is disposed can be called the auxiliary region Ra (as illustrated in FIG. 1 and FIG. 3), and the auxiliary region Ra can also be called a transition region, due to the coupling of the conductive line and the pixel circuit, the auxiliary region (transition region) tends to have darker brightness, and the darker pixel unit is the pixel unit (first pixel unit) in the first display region R1, not the second light-emitting element 40 in the second display region R2. For example, the case of that the auxiliary region is darker is more obvious in the case of high gray scale than in the case of low gray scale. In FIG. 5E, one first pixel circuit 10 overlaps with two conductive lines L1 at most as an example. In other embodiments, one first pixel circuit 10 may also overlap with more conductive lines L1. For example, as illustrated in FIG. 5C, in some embodiments, one first pixel circuit 10 may overlap with 10-15 conductive lines L1. How many conductive lines L1 overlap with one first pixel circuit 10 can be determined according to needs.

In some embodiments, the size of the first pixel circuit 10 can be compressed in the first direction X to obtain the region where the second pixel circuit 20 is disposed. For example, as illustrated in FIG. 5E, in the auxiliary region, one column of second pixel circuits 20 is arranged every other predetermined column of first pixel circuits 10. For example, the number of columns of first pixel circuits 10 between two adjacent columns of second pixel circuits 20 can be determined according to needs.

Figure 6:
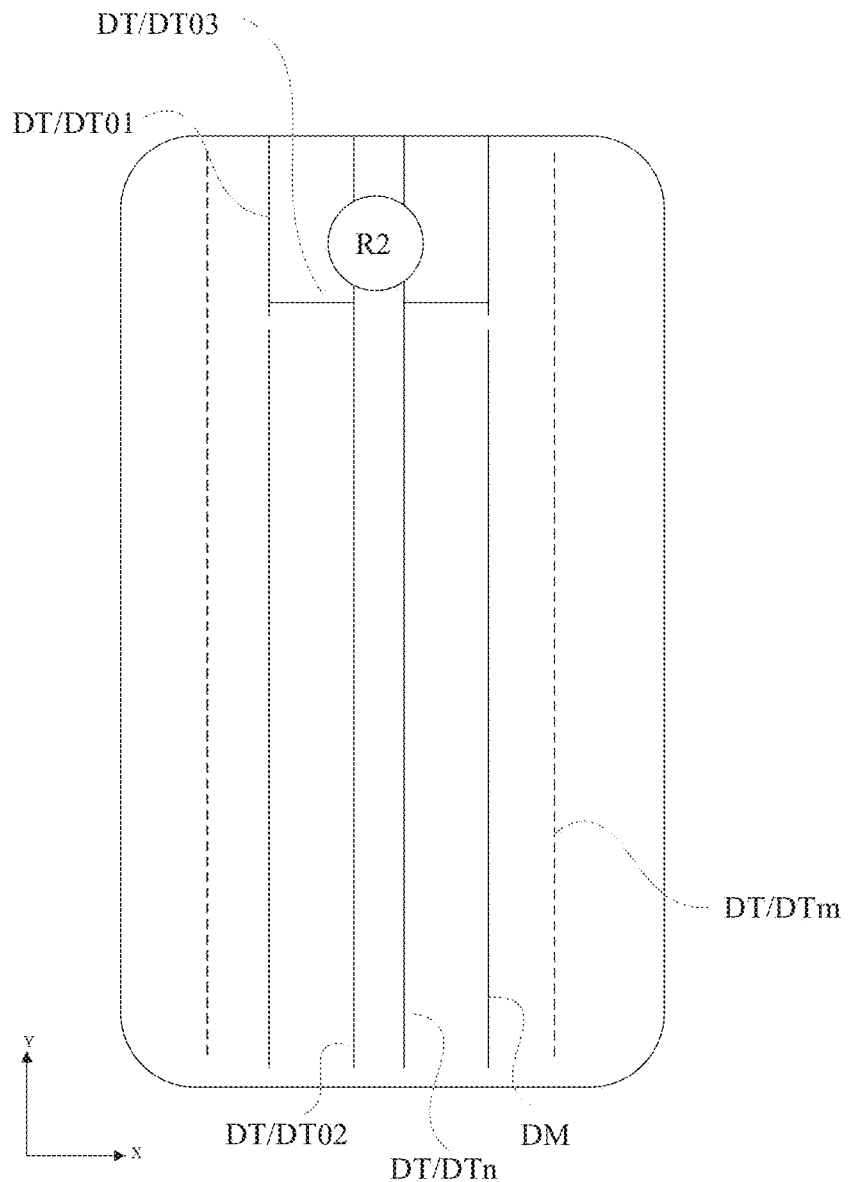
FIG. 6 is a schematic diagram of data lines in a display panel.
Figure 7:
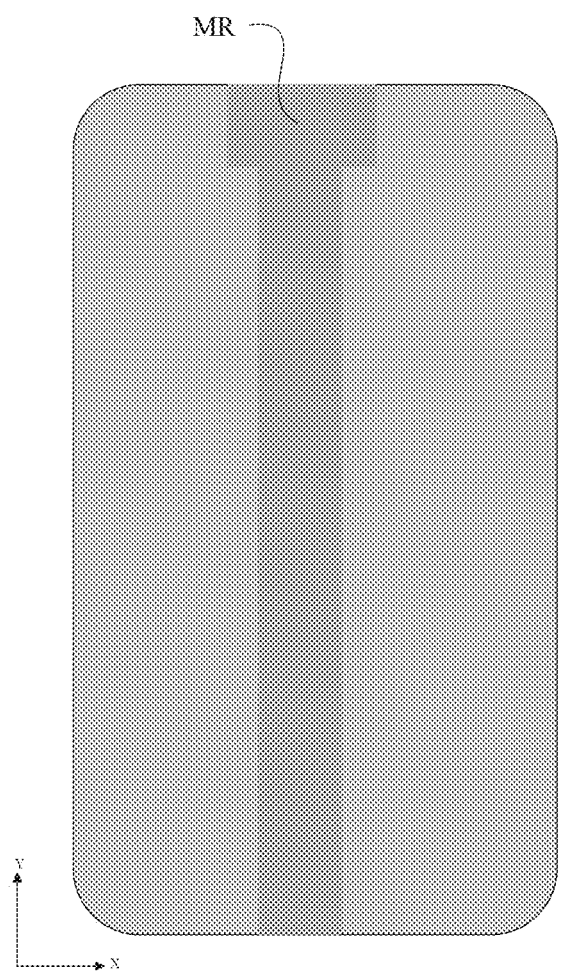
FIG. 7 is a schematic diagram of mura of a display panel.
Figure 8:
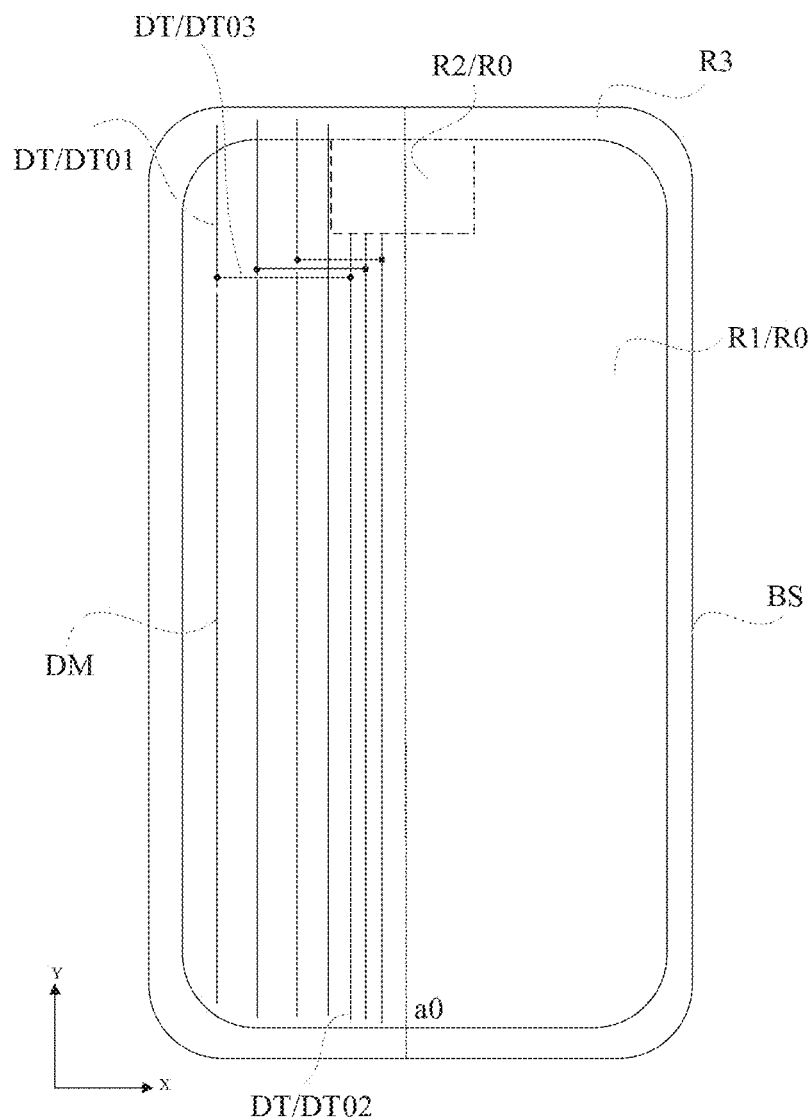
FIG. 8 is a schematic diagram of data lines in a display panel.
Figure 9A:
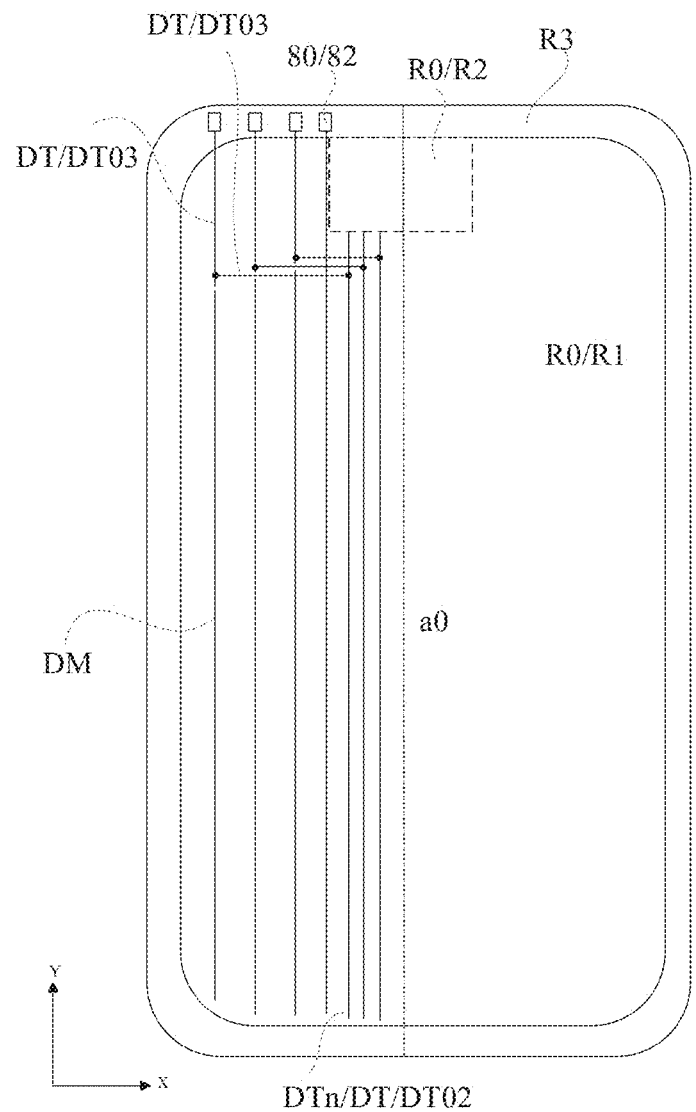
FIG. 9A is a schematic diagram of a display panel provided by an embodiment of the present disclosure.
Figure 9B:
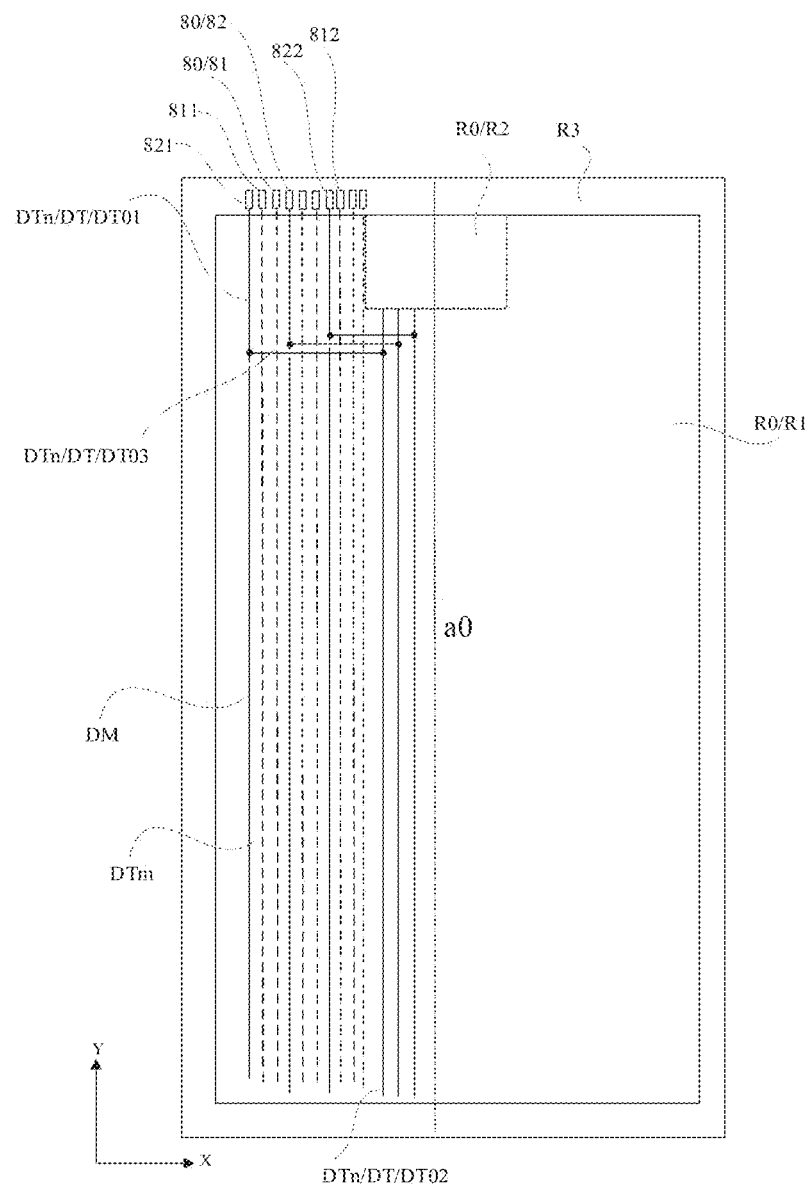
FIG. 9B is a schematic diagram of a display panel provided by another embodiment of the present disclosure.
Figure 9C:
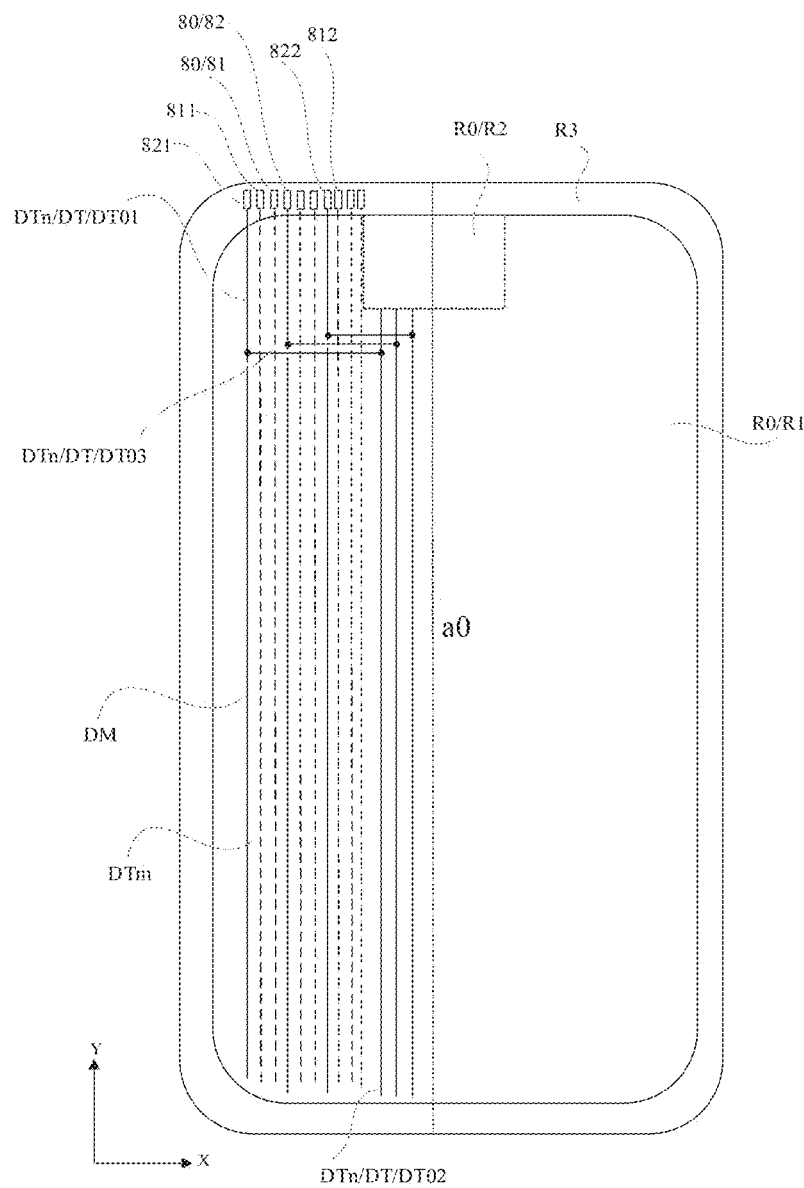
FIG. 9C is a schematic diagram of a display panel provided by another embodiment of the disclosure.

FIG. 6 is a schematic diagram of data lines in a display panel. FIG. 7 is a schematic diagram of mura of a display panel. FIG. 8 is a schematic diagram of data lines in a display panel. FIG. 9A is a schematic diagram of a display panel provided by an embodiment of the present disclosure. FIG. 9B is a schematic diagram of a display panel provided by another embodiment of the present disclosure. FIG. 9C is a schematic diagram of a display panel provided by another embodiment of the present disclosure. FIG. 10A is a schematic diagram of a display panel provided by an embodiment of the present disclosure. FIG. 10B is a schematic diagram of a display panel provided by another embodiment of the present disclosure. FIG. 8-FIG. 10B illustrate the center line a0 of the display panel. For example, the center line a0 extends in the second direction Y. For example, the center line a0 is parallel with the second direction Y. For example, the display panel is symmetrically arranged with respect to the center line a0. FIG. 8-FIG. 9C take that the second display region R2 is located at one side of the first display region R1 as an example, and FIG. 10A-FIG. 10B take that the first display region R1 surrounds the second display region R2 as an example.

As illustrated in FIG. 6, the second display region R2 is a light-transmitting display region. Referring to FIG. 3 and FIG. 6, the second pixel circuit 20 is separated from the second light-emitting element 40, the second pixel circuit 20 is disposed in the first display region R1, and the data line of the second pixel unit 102 (see FIG. 3) are formed in segments. That is, as illustrated in FIG. 6, the data line DTn includes a first portion DT01, a second portion DT02 and a third portion DT03. As illustrated in FIG. 6, the first portion DT01 and the second portion DT02 both extend in the second direction Y, the third portion DT03 extends in the first direction X, and the first portion DT01 and the second portion DT02 are connected through the third portion DT03. The extending direction of the third portion DT03 is different from the extending direction of the first portion DT01, and the extending direction of the third portion DT03 is different from the extending direction of the second portion DT02, and the third portion DT03 is located in the display region R0. The third portion DT03 is located in the first display region R1. The data line DTn includes a vertical part and a horizontal part, and the length of the data line DTn is greater than the length of the data line DTm of the first pixel unit 101 (see FIG. 3), so that the loading of the data line DTn is greater than the loading of the data line DTm. And thus, as illustrated in FIG. 7, the display panel has mura of a dark vertical stripe during display. FIG. 7 illustrates the dark vertical stripe MR. In the embodiments of the present disclosure, the data lines can be divided into a data line DTm and a data line DTn, the data line DTm can be referred to as a first-type data line DTm, and the data line DTn can be referred to as a second-type data line DTn. For example, the first-type data line DTm extends in the second direction Y, and the second-type data line DTn includes both a part extending in the first direction X and a part extending in the second direction Y. For example, in the embodiments of the present disclosure, the first direction X is the row direction of the pixel units and the second direction Y is the column direction of the pixel units, but it is not limited to this case.

For example, in some embodiments, no metal line is provided in the second display region R2, but it is not limited to this case. For example, in some other embodiments, metal lines can also be provided in the second display region R2. The structure in the second display region R2 can be set as needed.

As illustrated in FIG. 8, the display panel includes a display region R0 and a peripheral region R3, and the display region R0 includes a first display region R1 and a second display region R2. In other words, the base substrate BS has a display region R0 and a peripheral region R3, and the peripheral region R3 is located on at least one side of the display region R0. The peripheral region R3 is a non-display region.

For example, referring to FIG. 2 and FIG. 3, the pixel unit 100 is located on the base substrate BS and includes a pixel circuit 100a and a light-emitting element 100b, the pixel circuit 100a is configured to drive the light-emitting element 100b, the pixel circuit 100b includes a driving transistor T1 (see FIG. 16A) and a data writing transistor T2 (see FIG. 16A), and the driving transistor T1 and the data writing transistor T2 are connected to each other.

Figure 16A:
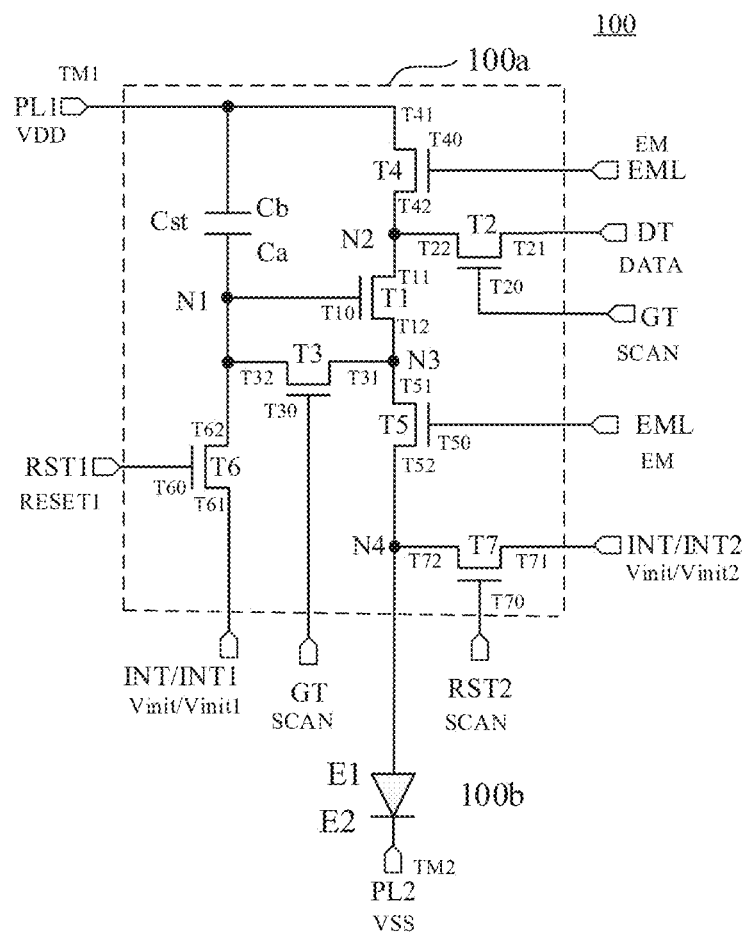
FIG. 16A is a schematic diagram of a pixel circuit provided by an embodiment of the present disclosure.
Figure 16B:
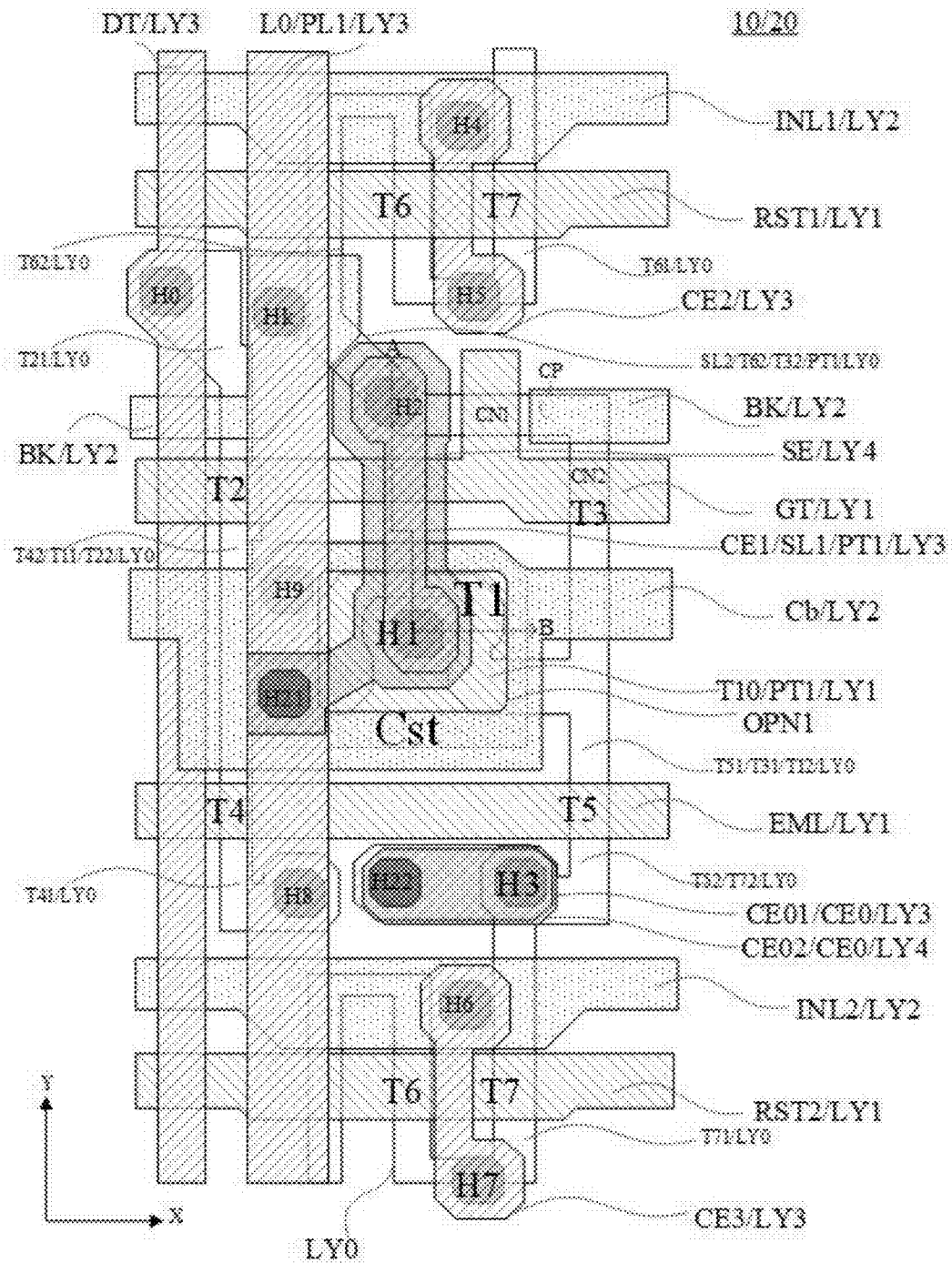
FIG. 16B is a layout diagram of a pixel circuit provided by an embodiment of the present disclosure.

For example, referring to FIG. 16A and FIG. 16B, the data line DT is connected to the data writing transistor T2 and is configured to provide a data signal to the pixel circuit 100a.

For example, in a display panel provided by some embodiments of the present disclosure, as illustrated in FIG. 9A and FIG. 9B, the display panel includes a compensation structure 80, the compensation structure 80 is connected to the data line DT and located in the peripheral region R3, and the compensation structure 80 includes at least one selected from the group consisting of a resistance compensation unit and a capacitance compensation unit. The embodiments of the present disclosure are illustrated by taking that the compensation structure 80 includes both a resistance compensation unit and a capacitance compensation unit as an example.

In the display panel provided by the embodiments of the present disclosure, by arranging the compensation structure, the capacitance/resistance difference between data lines can be reduced, so as to alleviate mura, and alleviate or avoid the occurrence of the dark vertical stripe during display. For example, in the display panel provided by the embodiments of the present disclosure, by arranging the compensation structure, the capacitance/resistance difference between the first-type data lines DTm can be reduced, the capacitance/resistance difference between the second-type data lines DTn can be reduced, and the capacitance/resistance difference between the first-type data line DTm and the second-type data line DTn can be reduced.

For example, when arranging the compensation structure, the compensation amount of each data line can be determined according to the data line with the largest loading in the display panel before compensation. For example, in the display panel provided by some embodiments of the present disclosure, the loading difference between the data lines is small due to the compensation structure.

As illustrated in FIG. 9A, the second-type data line DTn of the display panel is connected to the compensation structure 80. As illustrated in FIG. 9B, one second-type data line DTn of the display panel is connected to one compensation structure 80 (second compensation structure 82).

As illustrated in FIG. 9B, one first-type data line DTm of the display panel is connected to one compensation structure 80 (first compensation structure 81). For example, the compensation amount of the first compensation structure 81 is different from the compensation amount of the second compensation structure 82. For example, the compensation amount of the first compensation structure 81 is greater than the compensation amount of the second compensation structure 82. For example, the compensation amount of the capacitance of the first compensation structure 81 is different from the compensation amount of the capacitance of the second compensation structure 82.

For example, the compensation amount of the capacitance of the first compensation structure 81 is greater than the compensation amount of the capacitance of the second compensation structure 82. For example, the compensation amount of the resistance of the first compensation structure 81 is greater than the compensation amount of the resistance of the second compensation structure 82. For example, the compensation amount of the capacitance of the first compensation structure 81 is greater than the compensation amount of the second compensation structure 82, and the compensation amount of the resistance of the first compensation structure 81 is greater than the compensation amount of the resistance of the second compensation structure 82.

For example, in some embodiments, as illustrated in FIG. 9B, for a plurality of first-type data lines DTm located at one side of the center line a0, each first-type data line DTm is connected to one first compensation structure 81, so that a plurality of first compensation structures 81 are sequentially arranged. For example, the plurality of first compensation structures 81 are arranged in the first direction X. For example, in some embodiments, the first-type data line DTm with the largest capacitance before the compensation structures are provided may not be provided with a compensation structure.

The display panel illustrated in FIG. 9B is a rectangular display panel. For example, as illustrated in FIG. 9B, considering the unequal lengths of data lines in the fan-out region FR (refer to FIG. 15), the closer the first compensation structure 81 is to the center line a0, the compensation amount thereof is greater. That is, the compensation amount of the first compensation structure 81 (the first compensation structure 811) close to the center line a0 is greater than the compensation amount of the first compensation structure 81 (the first compensation structure 811) away from the center line a0.

For example, in some embodiments, as illustrated in FIG. 9B, for the plurality of first-type data lines DTm located at one side of the center line a0, with respect to the edge of the display panel, the compensation amount of the first compensation structure 81 closer to the edge of the display panel is smaller. That is, the compensation amount of the first compensation structure 81 (the first compensation structure 811) close to the edge of the display panel is less than the compensation amount of the first compensation structure 81 (the first compensation structure 811) away from the edge of the display panel.

For example, as illustrated in FIG. 9B, for the plurality of second-type data lines DTn located at one side of the center line a0, each second-type data line DTn is connected to one second compensation structure 82, so that the plurality of second compensation structures 82 are arranged in the first direction X.

For example, as illustrated in FIG. 9B, the longer the length of the third portion DT03 of the second-type data line DTn, the greater the loading of the data line, and the smaller the compensation amount of the compensation structure.

For example, as illustrated in FIG. 9B, the farther the distance between the first portion DT01 of the second-type data line DTn and the center line a0, the smaller the compensation amount of the compensation structure of the data line.

The display panel illustrated in FIG. 9C is a display panel with rounded corners. As illustrated in FIG. 9C, the number of data lines at the positions corresponding to rounded corners is less than that of pixel units at other positions, and therefore, for the plurality of first-type data lines DTm located at one side of the center line a0, with respect to the edge of the display panel, the closer the first compensation structure 81 is to the edge of the display panel, the greater the compensation amount of the first compensation structure 81 is. That is, the compensation amount of the first compensation structure 81 (the first compensation structure 811) close to the edge of the display panel is greater than the compensation amount of the first compensation structure 81 (the first compensation structure 811) away from the edge of the display panel.

Figure 9D:
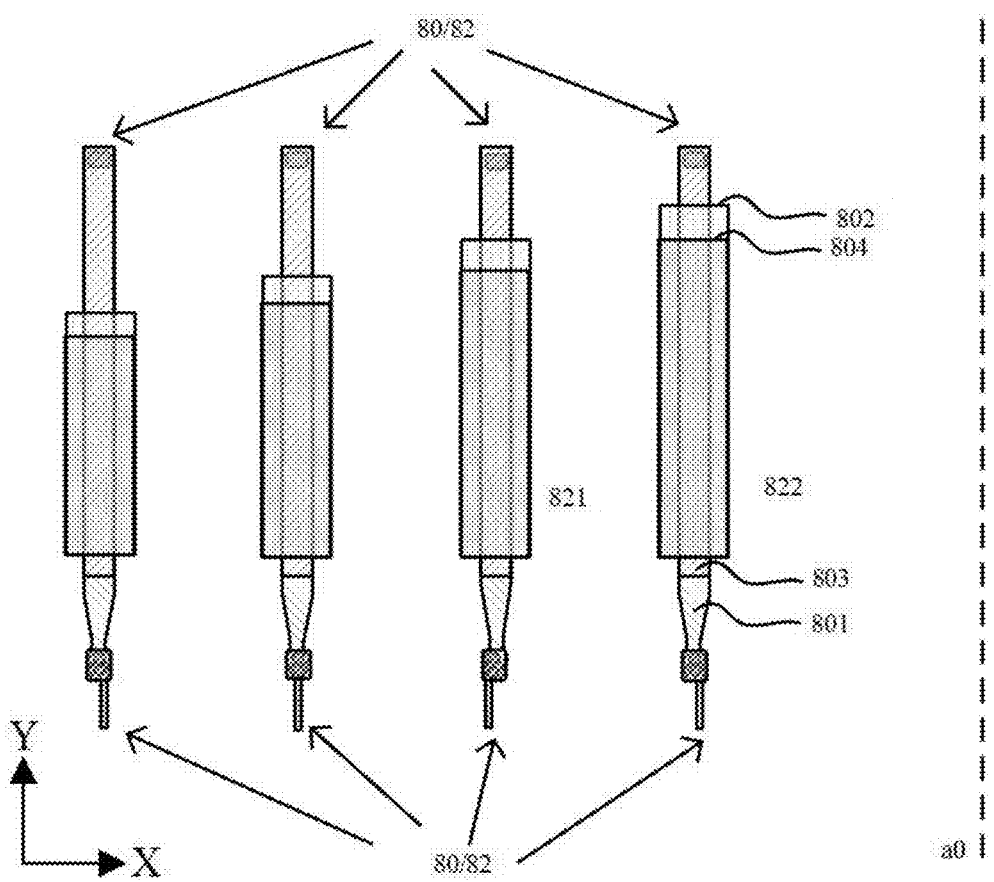
FIG. 9D is a schematic diagram of part of compensation structures in the display panel illustrated in FIG. 9B or FIG. 9C.
Figure 10A:
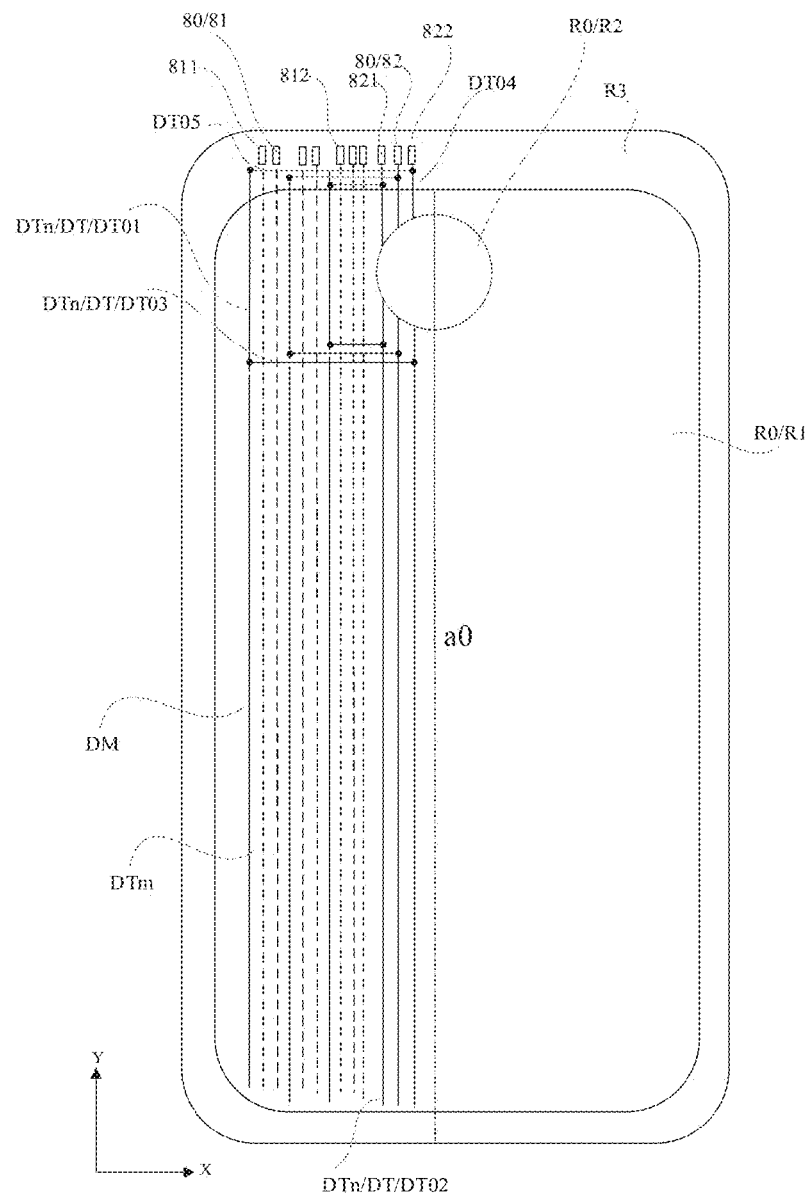
FIG. 10A is a schematic diagram of a display panel provided by an embodiment of the present disclosure.
Figure 10B:
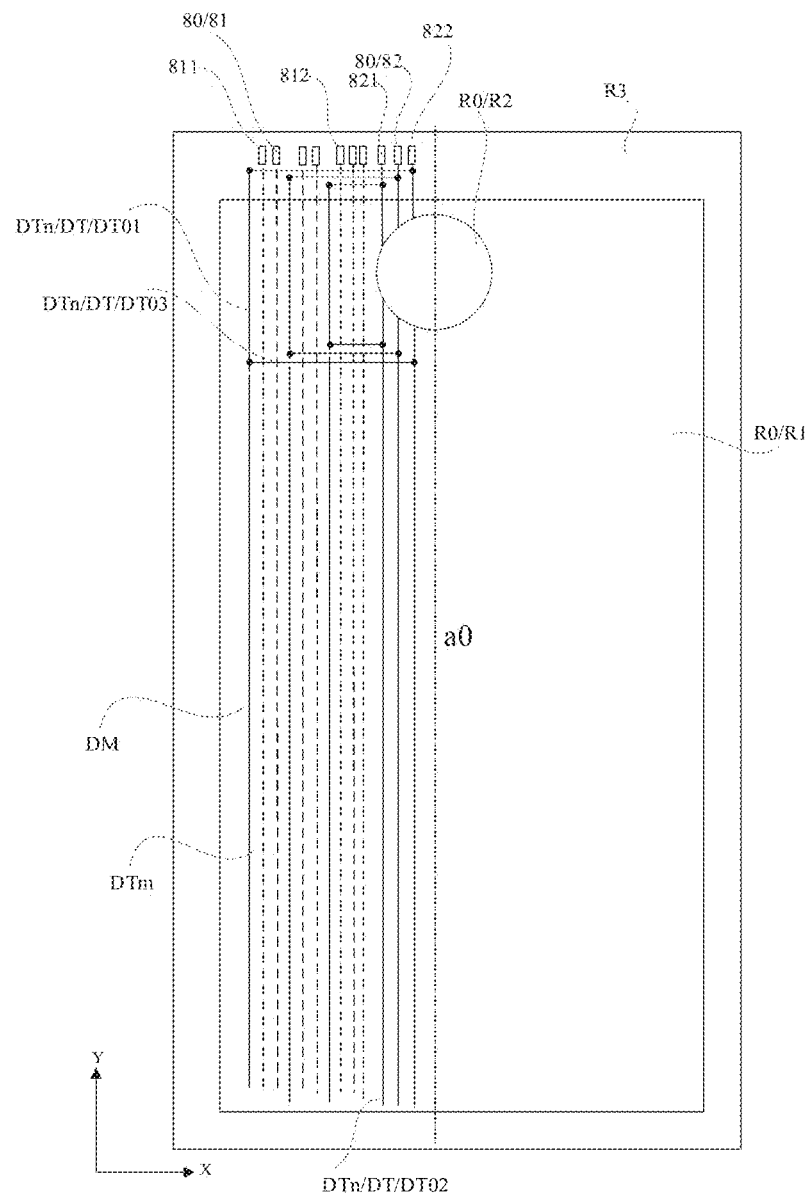
FIG. 10B is a schematic diagram of a display panel provided by another embodiment of the present disclosure.

FIG. 9D is a schematic diagram of part of compensation structures in the display panel illustrated in FIG. 9B or FIG. 9C. FIG. 9D merely illustrates the compensation structures (second compensation structures 82) of the second-type data lines DTn, and the arranging of the compensation amount of the compensation structures (first compensation structures 81) of the first-type data lines DTm can refer to the above description. As illustrated in FIG. 9B and FIG. 9D, the compensation amount of the second compensation structure 821 is less than the compensation amount of the second compensation structure 822. For example, in the display panel illustrated in FIG. 9B, at one side of the center line a0, the compensation amount of the compensation structure 80 (the second compensation structure 82) of the second-type data line DTn gradually changes, and for example, gradually increases or decreases in the first direction X. That is, at one side of the center line a0, the compensation amount of the compensation structure 80 (the second compensation structure 82) gradually increases in a direction from a position away from the center line a0 to a position close to the center line a0. In some other embodiments, at one side of the center line a0, the compensation amount of the compensation structure 80 (the second compensation structure 82) of the second-type data line DTn can also gradually decrease in the direction from the position away from the center line a0 to the position close to the center line a0. The arranging trend of the compensation amount of the compensation structure 80 (the second compensation structure 82) is related to the length of the third portion DT3.

In the embodiments of the present disclosure, the compensation amount of the compensation structure of the second-type data line DTn is inversely proportional to the length of the third portion DT3 of the second-type data line DTn, that is, the longer the length of the third portion DT3, the smaller the compensation amount of the compensation structure connected to the second-type data line DTn, so that the capacitance difference between data lines DT is smaller and the loading difference between data lines DT is smaller. Among the plurality of second-type data lines DTn, in the case where the length of the third portion DT3 gradually increases, the compensation amount of the compensation structure connected to the second-type data line DTn gradually decreases; and in the case where the length of the third portion DT3 gradually decreases, the compensation amount of the compensation structure connected to the second-type data line DTn gradually increases.

For example, in the embodiments of the present disclosure, the compensation amount of the compensation structure includes the compensation amount of the capacitance and/or the compensation amount of the resistance. In the case where the capacitance of each data line varies greatly, the capacitance is mainly compensated.

As illustrated in FIG. 10A and FIG. 10B, the first display region R1 surrounds the second display region R2, and the second compensation structure 82 is located at the position of the peripheral region R3 directly facing the second display region R2. For the part of the display panel located at one side of the center line a0, a plurality of first compensation structures 81 are adjacent to each other, a plurality of second compensation structures 82 are adjacent to each other, the plurality of first compensation structures 81 are located at one side of the plurality of second compensation structures 82, and the plurality of second compensation structures 82 are closer to the center line a0 than the plurality of first compensation structures 81 are. While in the display panels illustrated in FIG. 8-FIG. 9C, the second compensation structures 82 are located outside the position of the peripheral region R3 directly facing the second display region R2, and a plurality of second compensation structures 82 are distributed at intervals among the plurality of first compensation structures 81. FIG. 10A and FIG. 10B takes that the closer the second portion DT02 of the second-type data line DTn is to the center line a0, the larger the length of the third portion DT03 of the second-type data line DTn is as an example. In some other embodiments, it can be set that the closer the second portion DT02 of the second-type data line DTn is to the center line a0, the smaller the length of the third portion DT03 of the data line DTn is.

For example, the capacitance compensation unit includes at least one compensation capacitor, so as to compensate the capacitance of the data line connected thereto.

For example, the capacitance compensation unit includes a plurality of compensation capacitors, and the plurality of compensation capacitors are connected in parallel to increase the compensation amount of the capacitors.

Figure 11:
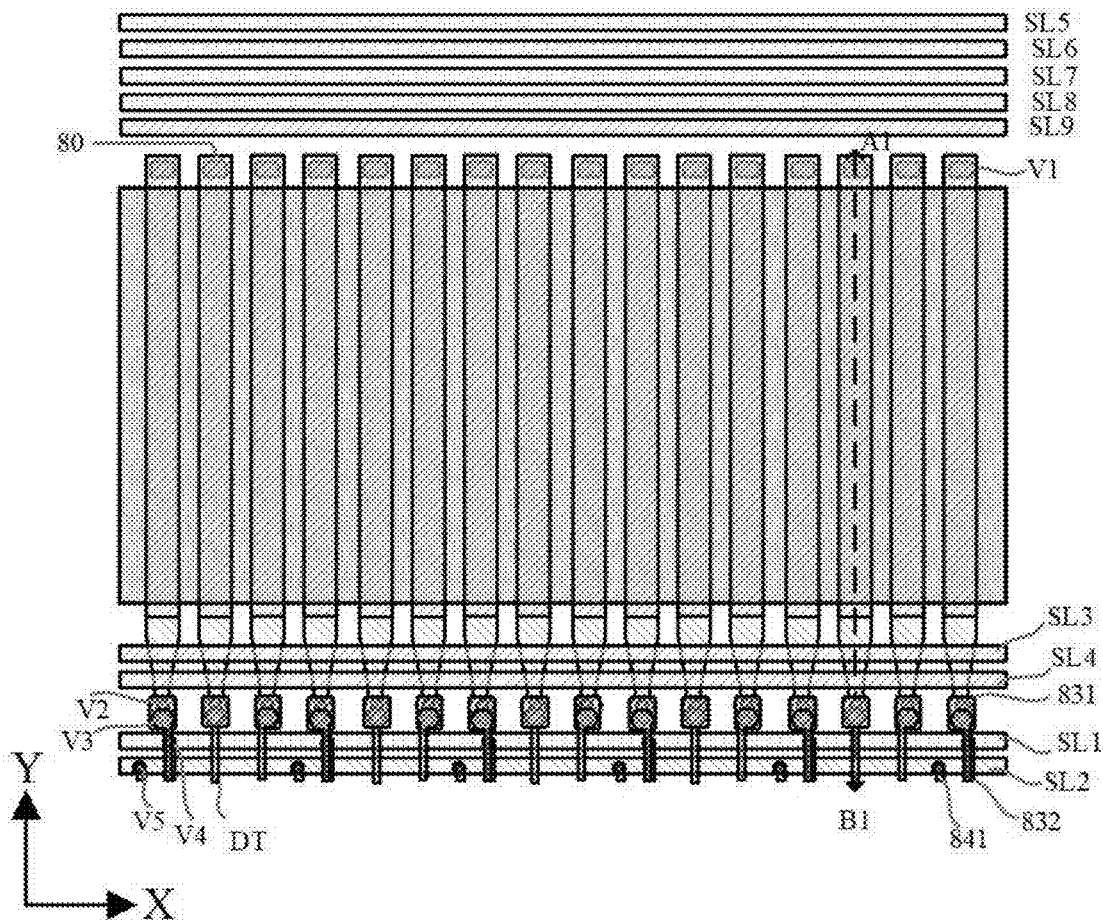
FIG. 11 is a schematic layout diagram of compensation units provided by an embodiment of the present disclosure.
Figure 12:
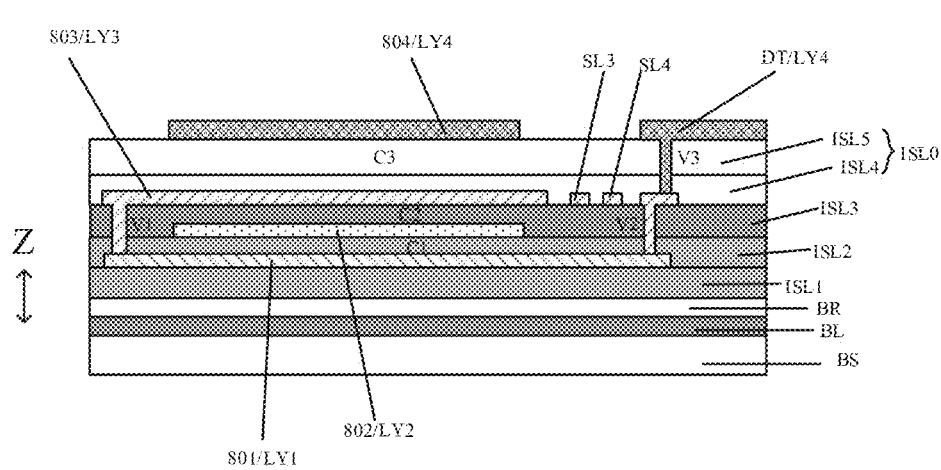
FIG. 12 is a cross-sectional view taken along line A1-B1 of FIG. 11.
Figure 13A:
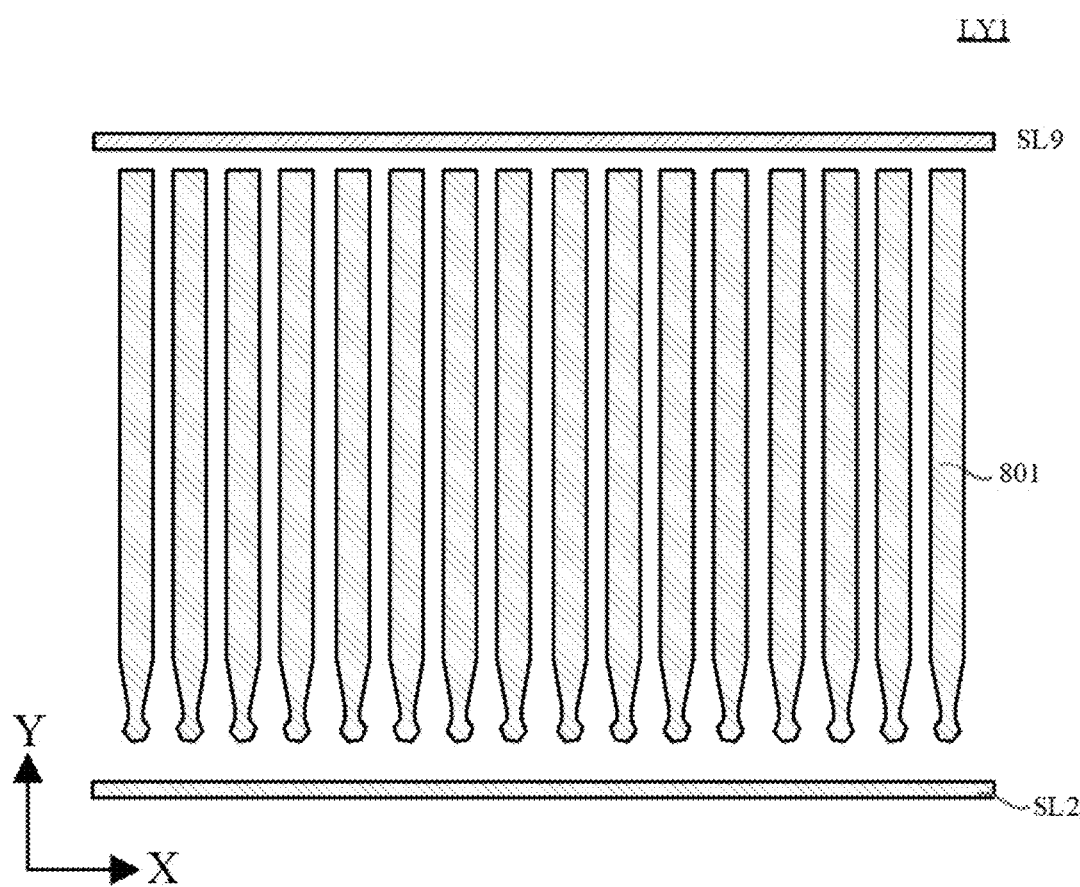
FIG. 13A is a plan view of a first conductive layer in FIG. 11.
Figure 13B:
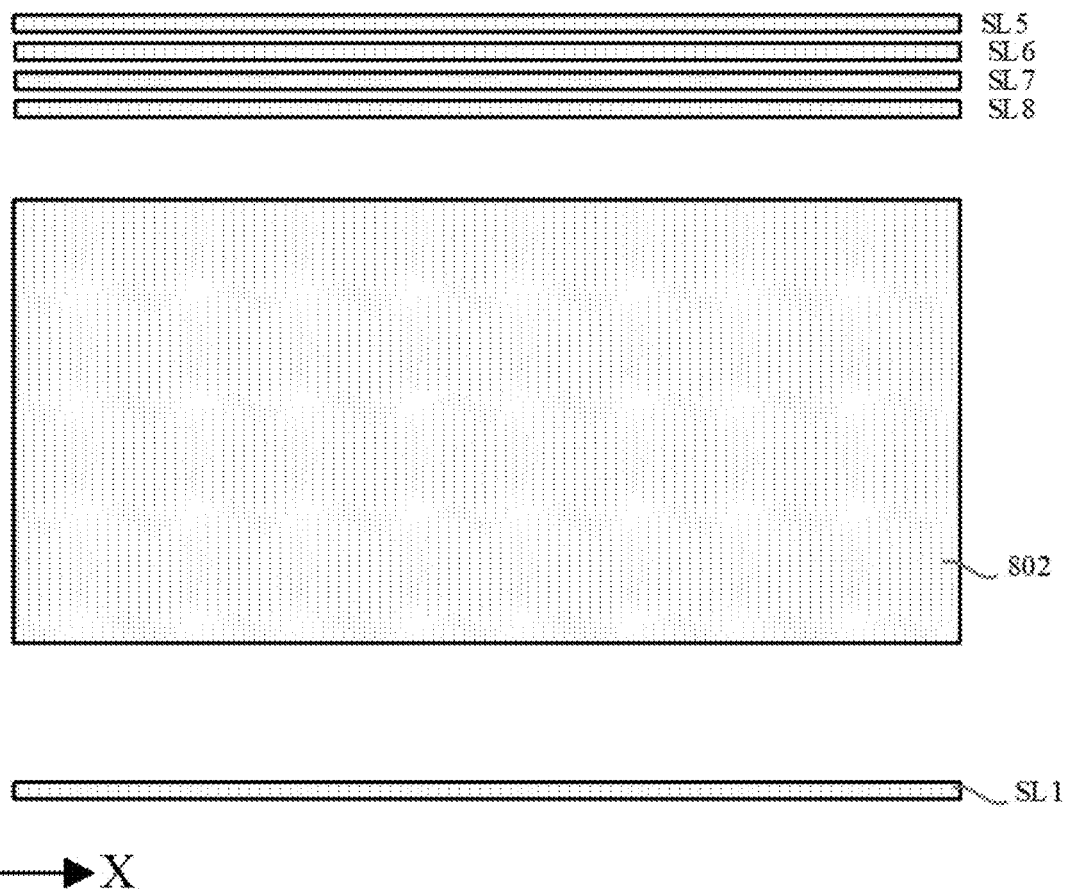
FIG. 13B is a plan view of a second conductive layer in FIG. 11.
Figure 13C:
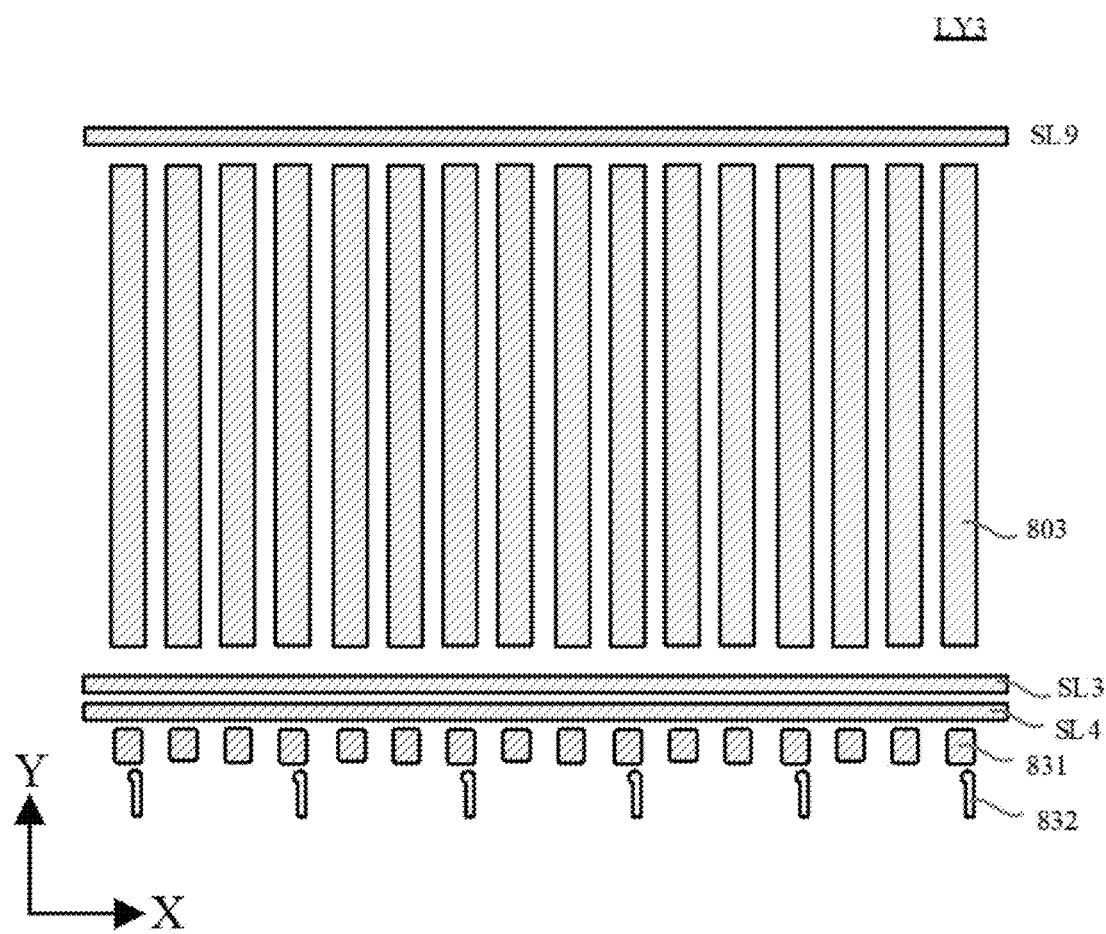
FIG. 13C is a plan view of a third conductive layer in FIG. 11.
Figure 13D:
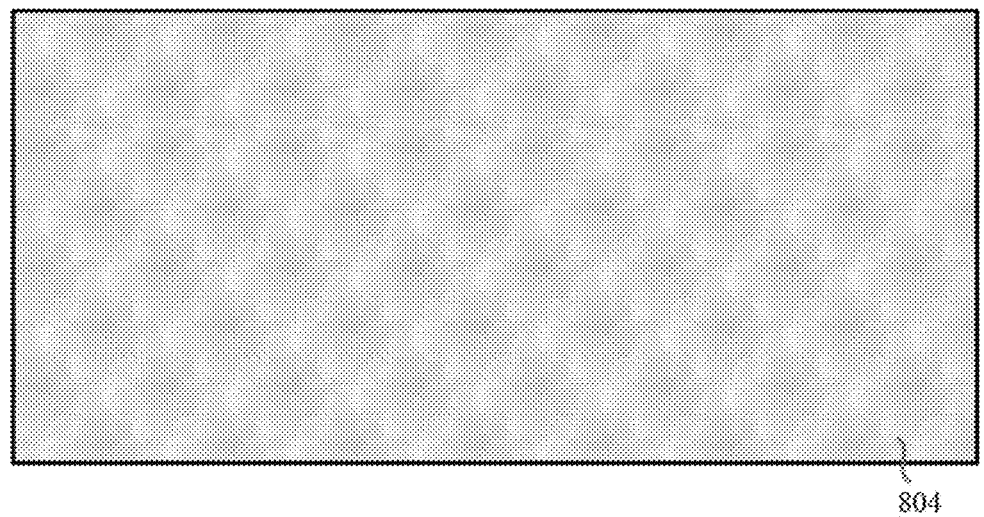
FIG. 13D is a plan view of a fourth conductive layer in FIG. 11.
Figure 13E:
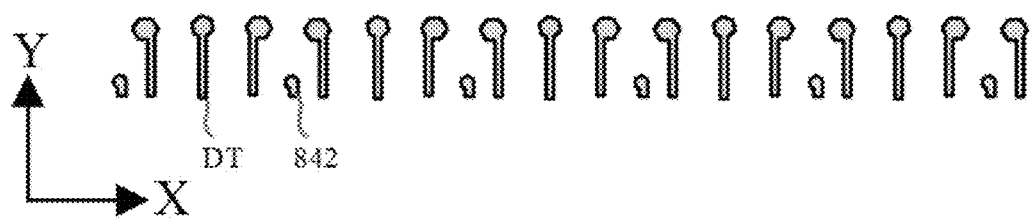
FIG. 13E is a plan view of via holes in FIG. 11.
Figure 13E:
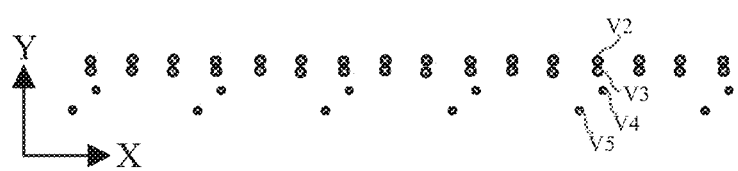
Figure 13F:
FIG. 13F is a plan view of via holes penetrating at least one of a first insulating layer, a second insulating layer, and a third insulating layer in FIG. 11.
Figure 13F:
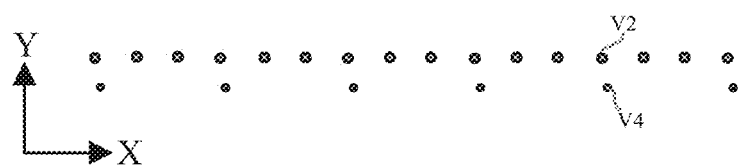
Figure 13G:
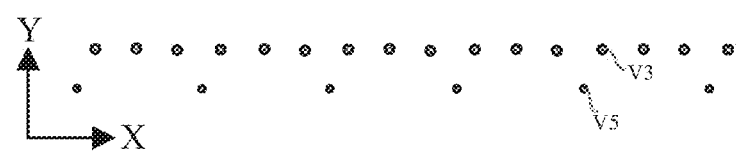
FIG. 13G is a plan view of via holes penetrating a fourth insulating layer and a fifth insulating layer in FIG. 11.

FIG. 11 illustrates a schematic layout diagram of a compensation unit provided by an embodiment of the present disclosure. FIG. 12 is a cross-sectional view taken along line A1-B1 of FIG. 11. FIG. 13A is a plan view of a first conductive layer in FIG. 11. FIG. 13B is a plan view of a second conductive layer in FIG. 11. FIG. 13C is a plan view of a third conductive layer in FIG. 11. FIG. 13D is a plan view of a fourth conductive layer in FIG. 11. FIG. 13E is a plan view of via holes in FIG. 11. FIG. 13F is a plan view of via holes penetrating at least one of a first insulating layer, a second insulating layer, and a third insulating layer in FIG. 11. FIG. 13G is a plan view of via holes penetrating a fourth insulating layer and a fifth insulating layer in FIG. 11. The display panel illustrated in FIG. 11 is illustrated by taking that one data line DT is connected to one compensation structure 80 as an example, and the embodiments of the present disclosure include but are not limited to this case. In some other embodiments, one data line DT can also be connected to a plurality of compensation structures 80.

For example, the compensation capacitor includes a compensation portion connected to the data line, and at least one compensation electrode-plate that forms the compensation capacitor with the compensation portion. For example, the compensation portion can be at least one of the first compensation portion 801 and the second compensation portion 803 described later. For example, the compensation electrode-plate can be at least one of the first electrode-plate 802 and the second electrode-plate 804 described later.

For example, referring to FIG. 11, FIG. 13A and FIG. 13C, the compensation structure 80 includes a resistance compensation unit, the resistance compensation unit includes a first compensation portion 801 connected to the data line DT and a second compensation portion 803 connected to the first compensation portion 801. Referring to FIG. 11 and FIG. 12, the first compensation portion 801 and the second compensation portion 803 are located in different layers, and the orthographic projection of the first compensation portion 801 on the base substrate BS at least partially overlaps with the orthographic projection of the second compensation portion 803 on the base substrate BS. The first compensation portion 801 and the second compensation portion 803 extend the length of the data line and compensate the resistance of the data line.

For example, as illustrated in FIG. 12 and FIG. 13E, the first compensation portion 801 is in contact with the second compensation portion 803. For example, the first compensation portion 801 and the second compensation portion 803 are connected through a via hole V1 penetrating the third insulating layer ISL3 and the second insulating layer ISL2.

For example, referring to FIG. 11, FIG. 12 and FIG. 13A-FIG. 13D, the compensation structure includes a capacitance compensation unit, and the capacitance compensation unit includes a first compensation portion 801, a first electrode-plate 802, a second compensation portion 803, and a second electrode-plate 804. The first compensation portion 801 is connected to the data line, the first compensation portion 801 is located in a first conductive layer LY1, the first electrode-plate 802 is located in a second conductive layer LY2, the second compensation portion 803 is located in a third conductive layer LY3, the second electrode-plate 804 is located in a fourth conductive layer LY4, the first conductive layer LY1 is located on a first insulating layer ISL1, a second insulating layer ISL2 is disposed between the first conductive layer LY1 and the second conductive layer LY2, a third insulating layer ISL3 is disposed between the second conductive layer LY2 and the third conductive layer LY3, and an insulating layer ISL0 is disposed between the third conductive layer LY3 and the fourth conductive layer LY4. For example, the insulating layer ISL0 includes a fourth insulating layer ISL4 and a fifth insulating layer ISL5, or the insulating layer ISL0 includes only one of the fourth insulating layer ISL4 and the fifth insulating layer ISL5. The first insulating layer ISL1 can also be referred to as a first gate insulating layer. The second insulating layer ISL2 can also be referred to as a second gate insulating layer. The third insulating layer ISL3 can also be referred to as an interlayer dielectric layer. The fourth insulating layer ISL4 can also be referred to as a passivation layer. The fifth insulating layer ISL5 can also be referred to as a planarization layer.

For example, in the case where the display substrate provided by the embodiments of the present disclosure includes a capacitance compensation unit, the compensation effect is better, which is more conducive to alleviating or eliminating mura. For example, in some embodiments, the patterns of the first electrode-plate 802 and the second electrode-plate 804 are the same, but they are not limited to this case, and can be set as needed. For example, the second electrode-plate 804 is located in the same layer as the shield electrode SE mentioned later. That is, both of the second electrode-plate 804 and the shield electrode SE are located in the fourth conductive layer LY4. For example, the first to fourth conductive layers LY1-LY4 illustrated in FIG. 11 and FIG. 12 are the first to fourth conductive layers LY1-LY4 in the display panels illustrated in FIG. 16B-FIG. 16E, FIG. 16G, FIG. 16H and FIG. 17, respectively. The entire structure of the display panel is not illustrated in each drawing.

For example, referring to FIG. 11, FIG. 12, FIG. 13A and FIG. 13C, the first compensation portion 801 and the second compensation portion 803 form a resistance compensation unit.

For example, one compensation structure may correspond to one capacitance compensation unit, and one compensation structure may correspond to one resistance compensation unit.

For example, referring to FIG. 11, FIG. 12, FIG. 13A and FIG. 13C, the orthographic projection of the first compensation portion 801 on the base substrate BS at least partially overlaps with the orthographic projection of the second compensation portion 803 on the base substrate BS.

For example, the width of the first compensation portion 801 in the first direction X is the same as the width of the second compensation portion 803 in the first direction X. The first direction X intersects with the extending direction of the first compensation portion 801 and intersects with the extending direction of the second compensation portion 803. For example, the first direction X is perpendicular to the extending direction of the first compensation portion 801 and is perpendicular to the extending direction of the second compensation portion 803, but it is not limited to this case.

For example, as illustrated in FIG. 12, the first compensation portion 801 and the second compensation portion 803 are connected through a via hole V1 penetrating both the third insulating layer ISL3 and the second insulating layer ISL2, so as to facilitate the formation of the resistance compensation unit and the capacitance compensation unit.

For example, the first compensation portion 801 overlaps with the first electrode-plate 802 to form a first compensation capacitor C1, the second compensation portion 803 overlaps with the first electrode-plate 802 to form a second compensation capacitor C2, the second compensation portion 803 overlaps with the second electrode-plate 804 to form a third compensation capacitor C3, and the first compensation capacitor C1, the second compensation capacitor C2, and the third compensation capacitor C3 are connected in parallel to increase the compensation amount of capacitance.

For example, referring to FIG. 11 and FIG. 13C, the third conductive layer LY3 further includes a signal line SL3, the signal line SL3 extends in the first direction X, and the orthographic projection of the signal line SL3 on the base substrate partially overlaps with the orthographic projection of the first compensation portion 801 on the base substrate.

For example, referring to FIG. 11 and FIG. 13C, the third conductive layer LY3 further includes a signal line SL4, the signal line SL4 extends in the first direction X, and the orthographic projection of the signal line SL4 on the base substrate partially overlaps with the orthographic projection of the first compensation portion 801 on the base substrate.

For example, one of the signal line SL3 and the signal line SL4 is a high-level signal line, and the other of the signal line SL3 and the signal line SL4 is a low-level signal line. Neither the signal line SL3 nor the signal line SL4 is connected to the data line DT. The high-level signal line is configured to provide a high level, the low-level signal line is configured to provide a low level, and the voltage of the high level is greater than the voltage of the low level.

For example, referring to FIG. 11, FIG. 12 and FIG. 13B, in order to facilitate manufacturing and the compensation of capacitance, the first electrode-plates 802 of the plurality of compensation structures are integrally formed as an integrated structure, and the second electrode-plates 804 of the plurality of compensation structures are integrally formed as an integrated structure.

For example, in order to facilitate the compensation of capacitance, both the first electrode-plate 802 and the second electrode-plate 804 are connected to a constant voltage terminal. For example, as illustrated in FIG. 16A, the constant voltage terminal includes at least one of a first power terminal TM1 and a second power terminal TM2. For example, the first power terminal TM1 is connected to a first power supply line PL1 illustrated in FIG. 16A, and the second power terminal TM2 is connected to a second power supply line PL2 illustrated in FIG. 16A.

For example, as illustrated in FIG. 9A and FIG. 9B, the display region R0 includes a first display region R1 and a second display region R2. The first display region R1 is located on at least one side of the second display region R2, and the data line DT is not located in the second display region R2.

Referring to FIG. 11 and FIG. 13C, the display panel includes a first connection structure 831. Referring to FIG. 11 and FIG. 13E, the first connection structure 831 is connected to the first compensation portion 801 through a via hole V2, and the data line DT is connected to the first connection structure 831 through a via hole V3. For example, referring to FIG. 12 and FIG. 13F, the via hole V2 is configured to connect structures in the first conductive layer LY1 and the third conductive layer LY3, so that the via hole V2 penetrates both the third insulating layer ISL3 and the second insulating layer ISL2. For example, referring to FIG. 12 and FIG. 13G, the via hole V3 is configured to connect structures in the fourth conductive layer LY4 and the third conductive layer LY3, so that the via hole V3 penetrates both the fourth insulating layer ISL4 and the fifth insulating layer ISL5. Similarly, the via hole V5 also penetrates both the fourth insulating layer ISL4 and the fifth insulating layer ISL5. For example, in some embodiments, the data line DT includes portions located in different layers. In some embodiments, the data line DT includes a portion located in the fourth conductive layer LY4 and a portion located in the third conductive layer LY3. In some embodiments, the third portion DT03 of the data line DT can be located in the second conductive layer LY2, but it is not limited thereto. For example, in some embodiments, the first connection structure 831 may not be provided, and the first portion DT01 of the data line is connected to the first compensation portion 801 through a via hole.

Referring to FIG. 11 and FIG. 13A, the display panel includes a signal line SL2. Referring to FIG. 11 and FIG. 13C, the display panel includes a signal line 841, and the signal line 841 is connected to the signal line SL2. For example, the signal line 841 can be the first power supply line PL1 mentioned later, but it is not limited thereto. Referring to FIG. 11 and FIG. 13E, the signal line 841 is connected to the signal line SL2 through a via hole V5.

Referring to FIG. 11 and FIG. 13B, the display panel includes a signal line SL1. Referring to FIG. 11 and FIG. 13C, the display panel includes a signal line 832, and the signal line 832 is connected to the signal line SL1. For example, the signal line 832 can be an initialization signal line mentioned later, but it is not limited thereto. Referring to FIG. 11 and FIG. 13E, the signal line 832 is connected to the signal line SL1 through a via hole V4. For example, the via hole V4 is configured to connect the signal line 832 in the third conductive layer LY3 and the signal line SL1 in the second conductive layer LY2, and therefore, the via hole V4 penetrates the third insulating layer ISL3.

Referring to FIG. 11 and FIG. 13C, the display panel includes a signal line SL9. As illustrated in FIG. 13C, the signal line SL9 is located in the third conductive layer LY3. Referring to FIG. 11 and FIG. 13B, the display panel further includes signal lines SL5 to SL8. As illustrated in FIG. 13B, the signal lines SL5 to SL8 are located in the second conductive layer LY2. For example, the signal lines SL5 to SL9 can be crack detection lines, but not limited thereto. It should be noted that the number and position of crack detection lines in the display panel are not limited to those illustrated in the figure, but can be set as needed. Of course, the display panel may not be provided with crack detection lines.

It should be noted that the embodiments of the present disclosure are illustrated by taking the display panel illustrated in FIG. 11 as an example. Those skilled in the art can make changes and modifications based on the description of FIG. 11 to obtain novel embodiments. For example, on the basis of the display panel illustrated in FIG. 11, it is possible to adjust the layer in which an element is disposed, and to add or remove part of signal lines, etc.

FIG. 14A-FIG. 14G are schematic diagrams of compensation structures in some display panels provided by some embodiments of the present disclosure. FIG. 14H is a schematic diagram of a compensation structure in a display panel provided by an embodiment of the present disclosure. FIG. 14I is a schematic diagram of a compensation structure in a display panel provided by an embodiment of the present disclosure. FIG. 14J is an enlarged schematic diagram of the compensation structures in FIG. 14I.

Figure 14A:
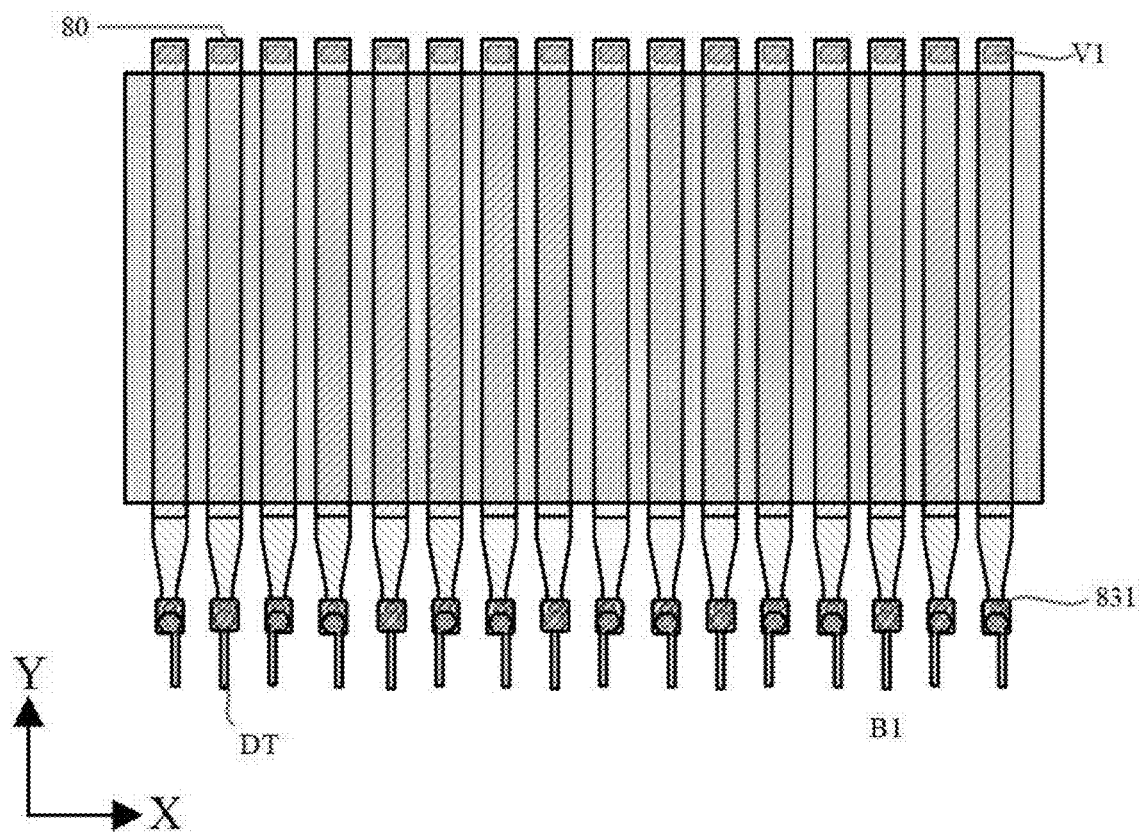
FIG. 14A-FIG. 14G are schematic diagrams of compensation structures in some display panels provided by some embodiments of the present disclosure.

Compared with the display panel illustrated in FIG. 11, the display panel illustrated in FIG. 14A retains the compensation structure 80, but removes the signal lines SL1-SL9 and the structures connected to the signal lines. That is, in the display panel provided by the embodiments of the present disclosure, the arrangement of the surrounding structure of the compensation structure 80 may not adopt the situation illustrated in FIG. 11.

Figure 14B:
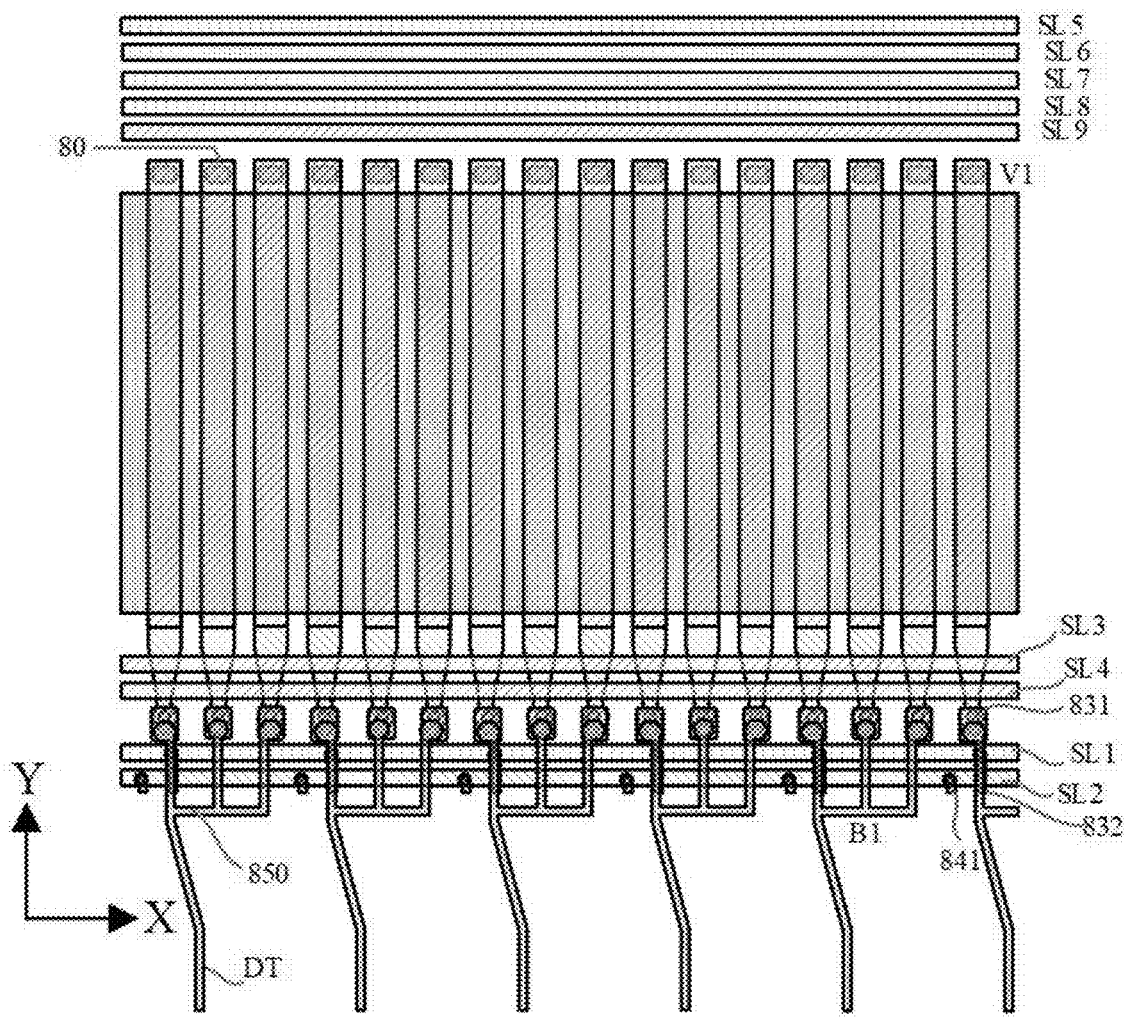

Compared with the display panel illustrated in FIG. 11, in the display panel illustrated in FIG. 14B, one data line DT is connected to three compensation structures 80. Of course, the number of compensation structures 80 connected to one data line DT is not limited in the embodiments of the present disclosure, and one data line DT can be connected to one compensation structure 80 or one data line DT can be connected to a plurality of compensation structures 80. In the case where one data line DT is connected to a plurality of compensation structures 80, the capacitors of the plurality of compensation structures are connected in parallel, which can further increase the total capacitance of the compensation structures connected to the data line.

Figure 14C:
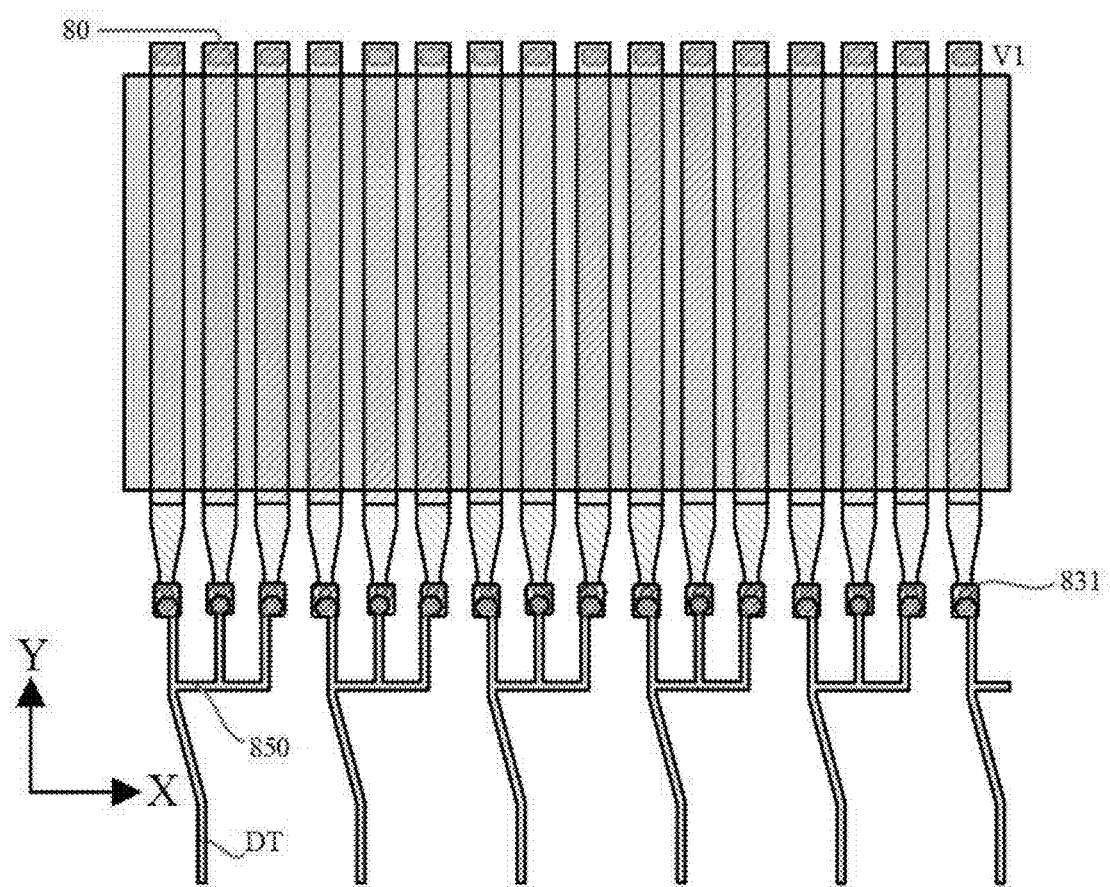

Compared with the display panel illustrated in FIG. 14B, the display panel illustrated in FIG. 14C retains the compensation structure 80, while the signal lines SL1-SL9 and the structures connected to the signal lines are removed. That is, in the display panel provided by the embodiments of the present disclosure, the arrangement of the surrounding structure of the compensation structure 80 may not adopt the situation illustrated in FIG. 11.

Figure 14D:
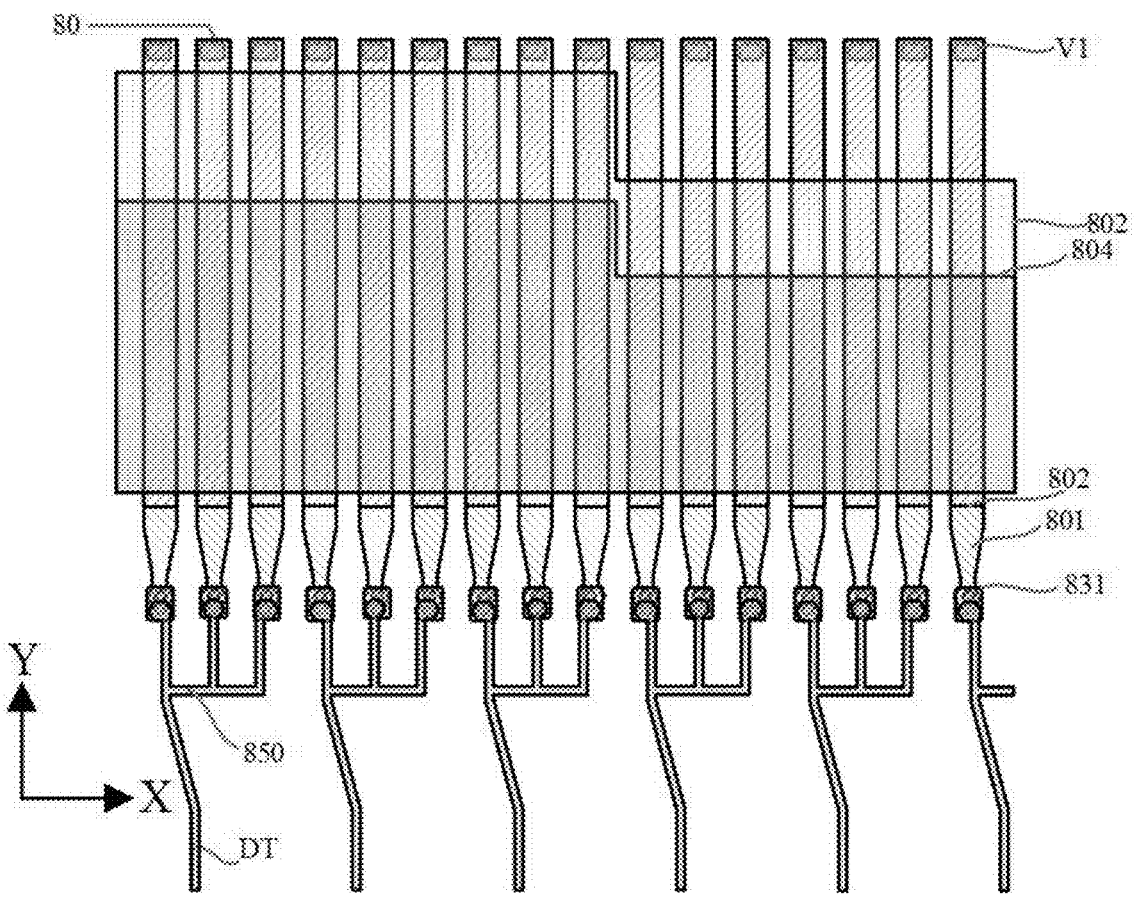

As illustrated in FIG. 14D, the compensation amount of the compensation structure 80 can be adjusted by adjusting the size of the first electrode-plate 802 or the second electrode-plate 804 in the second direction Y. As illustrated in FIG. 14D, in two compensation structures 80 with different compensation amounts, the first compensation portions 801 have the same size and have the same shape, and the second compensation portions 803 have the same size and have the same shape.

Figure 14E:
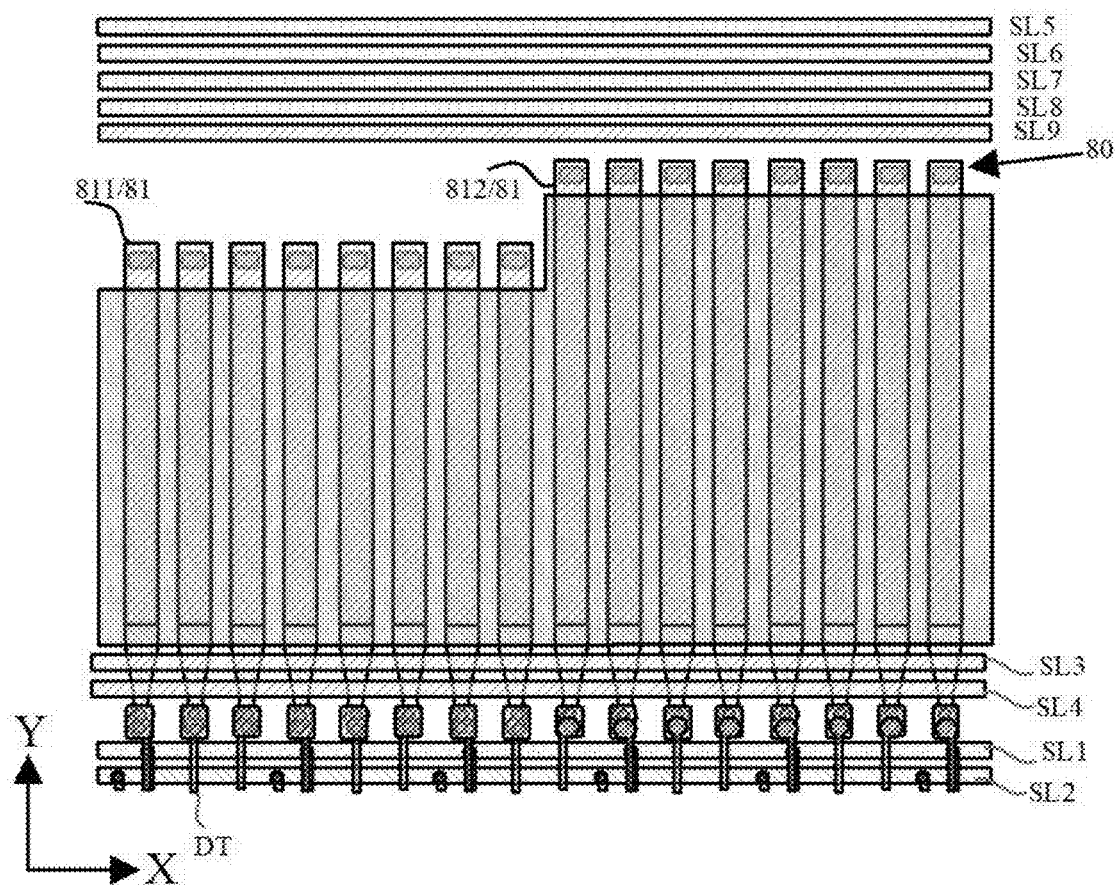

FIG. 14E is a schematic diagram of a display panel provided by an embodiment of the present disclosure. As illustrated in FIG. 14E, the compensation amounts of the compensation structures (compensation units) of different data lines can be different. In some embodiments of the present disclosure, in order to facilitate the arranging of the compensation structure, the data lines can be divided into groups, and the compensation amounts of data lines in one group are the same, but the compensation amounts of data lines in different groups are different. For example, each group of data lines can include at least one data line. For example, the data lines in each group are adjacent data lines. For example, each group of first-type data lines includes a plurality of first-type data lines. For example, each group of second-type data lines includes at least one second-type data line.

Figure 14F:
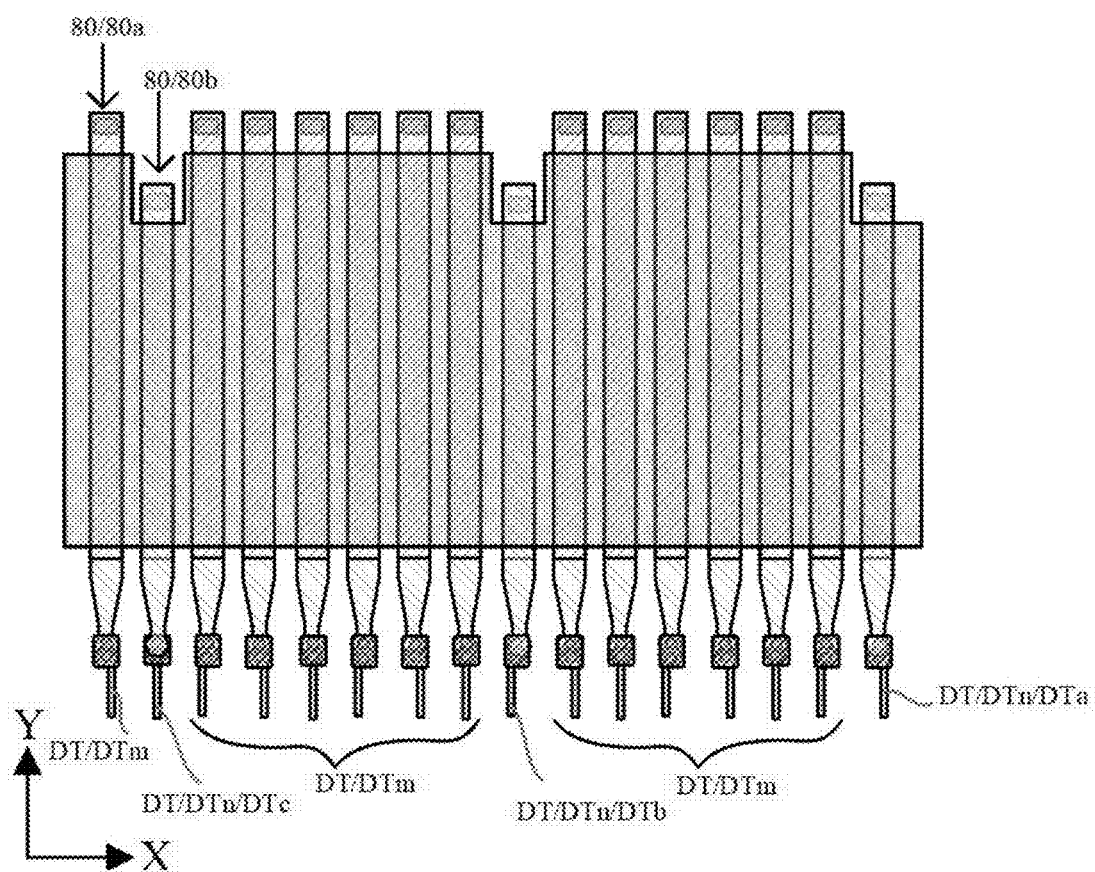
Figure 14G:
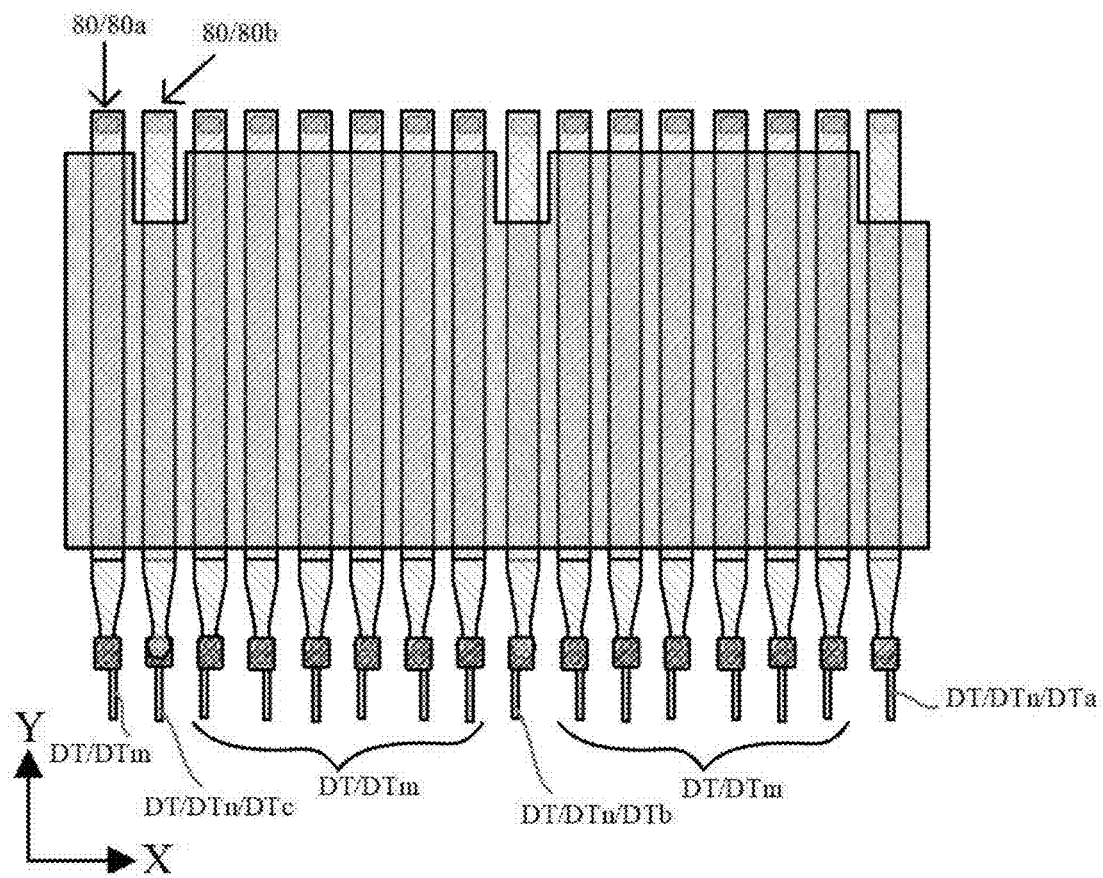
Figure 14H:
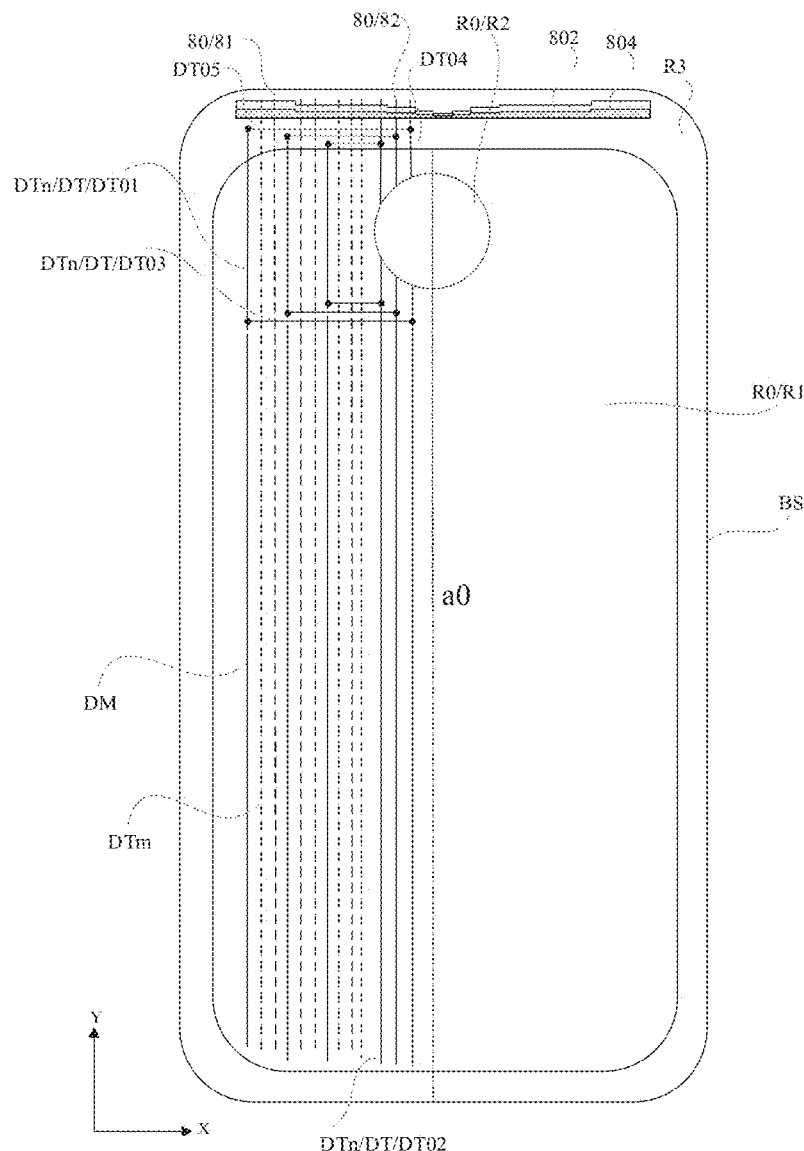
FIG. 14H is a schematic diagram of a display panel provided by an embodiment of the present disclosure.
Figure 14I:
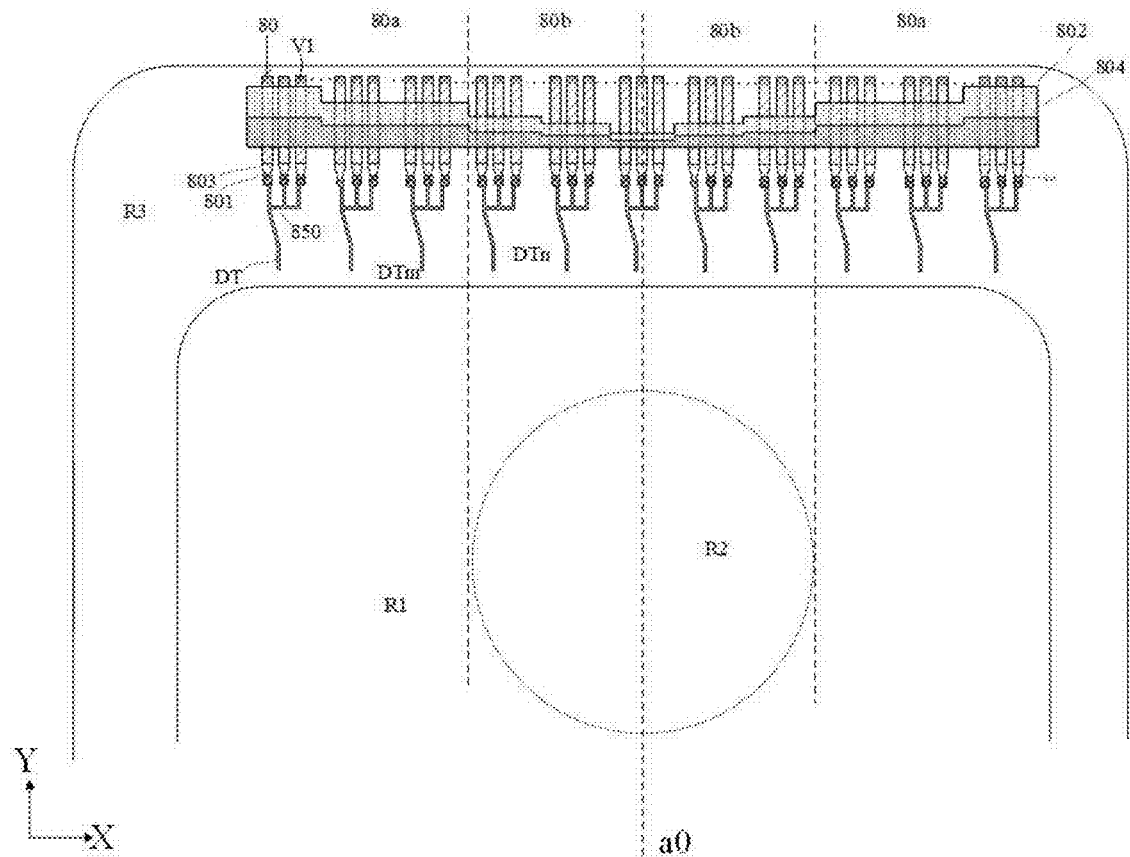
FIG. 14I is a schematic diagram of compensation structures in a display panel provided by an embodiment of the present disclosure.
Figure 14J:
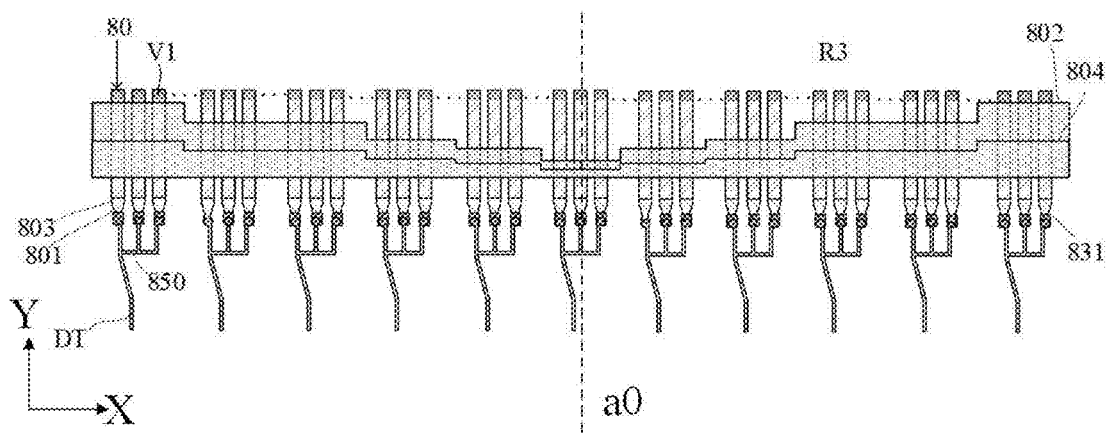
FIG. 14J is an enlarged schematic diagram of the compensation structures in FIG. 14I.

FIG. 14F is a schematic diagram of a display panel provided by an embodiment of the present disclosure. FIG. 14G is a schematic diagram of a display panel provided by an embodiment of the present disclosure. As illustrated in FIG. 14F and FIG. 14G, the compensation amount of the compensation structure 80a (first compensation structure 80a) of the first-type data line DTm is different from the compensation amount of the compensation structure 80b (second compensation structure 80b) of the second-type data line DTn. For example, as illustrated in FIG. 14F and FIG. 14G, the compensation amount of the first compensation structure 80a of the first-type data line DTm is different from the compensation amount of the second compensation structure 80b of the second-type data line DTn adjacent to the first-type data line DTm. For example, the compensation amount of the first compensation structure 80a is greater than the compensation amount of the second compensation structure 80b.

As illustrated in FIG. 14F and FIG. 14G, the second-type data lines DTn includes a data line DTa, a data line DTb, and a data line DTc, and the compensation amount of the second compensation unit 80b connected to the second-type data line DTn is less than the compensation amount the first compensation unit 80a connected to the first-type data line DTm. FIG. 14F and FIG. 14G are illustrated by taking that the compensation amounts of the compensation units 80 connected to the data line DTa, the data line DTb, and the data line DTc are the same as an example. In some other embodiments, the compensation amounts of the compensation units 80 connected to the data line DTa, the data line DTb, and the data line DTc can be different. In FIG. 14G, the remaining data lines DT, other than the data line DTa, the data line DTb, and the data line DTc, are first-type data lines DTm.

Compared with the display panel illustrated in FIG. 14F, in the display panel illustrated in FIG. 14G, in two compensation structures 80 with different compensation amounts, the first compensation portions 801 have the same size and have the same shape, and the second compensation portions 803 have the same size and have the same shape. For example, as illustrated in FIG. 14G, in two compensation structures 80 with different compensation amounts, the via holes V1 are located on a straight line. However, in the display panel illustrated in FIG. 14F, the via holes V1 are staggered.

In the display panel illustrated in FIG. 14H-FIG. 14J, the orthographic projection of the first electrode-plate 802 on the base substrate at least partially overlaps with the orthographic projection of the second electrode-plate 804 on the base substrate. For example, the orthographic projection of the second electrode-plate 804 on the base substrate falls within the orthographic projection of the first electrode-plate 802 on the base substrate. In some embodiments, the orthographic projection of the first electrode-plate 802 on the base substrate can also coincide with the orthographic projection of the second electrode-plate 804 on the base substrate. In the display panel provided by the embodiments of the present disclosure, in order to facilitate the application of signals, the first electrode-plates 802 of different compensation structures 80 are integrally formed as an integrated structure. For example, in the display panel provided by the embodiments of the present disclosure, in order to facilitate the application of signals, the second electrode-plates 804 of different compensation structures 80 are integrally formed as an integrated structure.

For example, as illustrated in FIG. 14H to FIG. 14J, at one side of the center line a0 of the display panel, the size of the first electrode-plate 802 in the second direction Y gradually changes. For example, the size of the first electrode-plate 802 in the second direction Y gradually changes in a stepwise manner. As illustrated in FIG. 14H-FIG. 14J, at one side of the center line a0 of the display panel, the size of the first electrode-plate 802 in the second direction Y gradually decreases from the position away from the center line a0 to the position close to the center line a0. Of course, in some other embodiments, at one side of the center line a0 of the display panel, the size of the first electrode-plate 802 in the second direction Y can also gradually increase from the position away from the center line a0 to the position close to the center line a0. The second electrode-plate 804 can have the same arranging trend as the first electrode-plate 802.

As illustrated in FIG. 14H, for the second-type data line DTn, the length of the third portion DT03 gradually changes. The closer the second portion DT02 is to the center line a0, the greater the length of the third portion DT03 is. According to that the compensation amount of the compensation structure 82 (second compensation structure 82), is inversely proportional to the length of the third portion DT03, the closer the second compensation structure 82 is to the center line a0, the smaller the compensation amount thereof is.

As illustrated in FIG. 14H-FIG. 14J, the first electrode-plate 802 is symmetrically arranged with respect to the center line a0, and the second electrode-plate 804 is symmetrically arranged with respect to the center line a0.

As illustrated in FIG. 10A and FIG. 14H, the second display region R2 is surrounded by the first display region R1. The second-type data line DTn further includes a fourth portion DT04 and a fifth portion DT05. The fourth portion DT04 extends in the second direction Y, the fifth portion DT05 extends in the first direction X, and the first portion DT01 and the fourth portion DT04 are connected through the fifth portion DT05. The fifth portion DT05 is located in the peripheral region R3. For example, in some embodiments, the first portion DT01 and the fourth portion DT04 are located in the same layer, and the fifth portion DT05 is not located in the same layer as the first portion DT01 or the fourth portion DT04. For example, in some embodiments, the fifth portion DT05 is located in the fourth conductive layer or the second conductive layer, and the first portion DT01 and the fourth portion DT04 are located in the third conductive layer, but it is not limited to this case.

The layer in which each portion of the second-type data line DTn is located can be set as needed, as long as two portions connected through a via hole are located in different layers. For example, for each portion of the second-type data line DTn, two portions with different extending directions are located in different layers. Of course, other manners can also be adopted. Each of the first portion DT01 to the fifth portion DT05 illustrated in the figure can also include sub-portions located in different layers.

As illustrated in FIG. 10A and FIG. 14H, the fifth portion DT05 is located in the peripheral region R3, and the fourth portion DT04 extends from the display region R0 to the peripheral region R3. As illustrated in FIG. 10A and FIG. 14H, the fourth portion DT04 extends from one side of the first display region R1, opposite to the side of the second display region R2 where the second portion DT02 is located, to the peripheral region R3.

As illustrated in FIG. 10A and FIG. 14H, the plurality of first-type data lines DTm and first portions DT01 of the plurality of second-type data lines DTn are arranged at intervals. The number of first-type data lines DTm arranged between adjacent first portions DT01 is not limited to that illustrated in the figure, but can be set as needed.

For example, in the embodiments of the present disclosure, for the second-type data line DTn, the compensation structure is provided at the position of the peripheral region R3 corresponding to the fourth portion DT04, while the compensation structure of the second-type data line DTn is not provided at the position corresponding to the first portion DT01 of the second-type data line DTn. For example, at the position corresponding to the first portion DT01 of the second-type data line DTn, a compensation structure of the first-type data line DTn can be arranged. Of course, in the display panel without the fourth portion DT04 and the fifth portion DT05 (as illustrated in FIG. 9A-FIG. 9C), for the second-type data line DTn, the compensation structure is provided at the position of the peripheral region R3 corresponding to the first portion DT01.

As illustrated in FIG. 14B, FIG. 14C, FIG. 14D, FIG. 14I and FIG. 14J, the display panel further includes a second connection structure 850, and the data line DT is connected to a plurality of compensation structures 80 through the second connection structure 850. The second connection structure 850 can include a plurality of branches. For example, each branch is connected to one compensation structure 80. For example, the second connection structure 850 can be integrated with the portion of the data line DT close the second connection structure 850, but it is not limited to this case, and the second connection structure 850 can also be located in a different layer from the portion of the data line DT close to the second connection structure 850. The second connection structure 850 is made of a conductive material. For example, the second connection structure 850 can be located in the first conductive layer LY1, the second conductive layer LY2, the third conductive layer LY3 or the fourth conductive layer LY4. FIG. 14I does not illustrate the portion of the data line DT located in the first display region R1.

In the embodiments of the present disclosure, the compensation amount of the compensation structure can be adjusted by adjusting at least one of the first compensation portion 801, the first electrode-plate 802, the second compensation portion 803 or the second electrode-plate 804. For example, the compensation amount of the compensation structure can be adjusted by adjusting the length and width of the first compensation portion 801 and those of the second compensation portion 803, or by adjusting the opposing area of the first electrode-plate 802 and the first compensation portion 801, the opposing area of the first electrode-plate 802 and the second compensation portion 803, or the opposing area of the second electrode-plate 804 and the second compensation portion 803.

Figure 15:
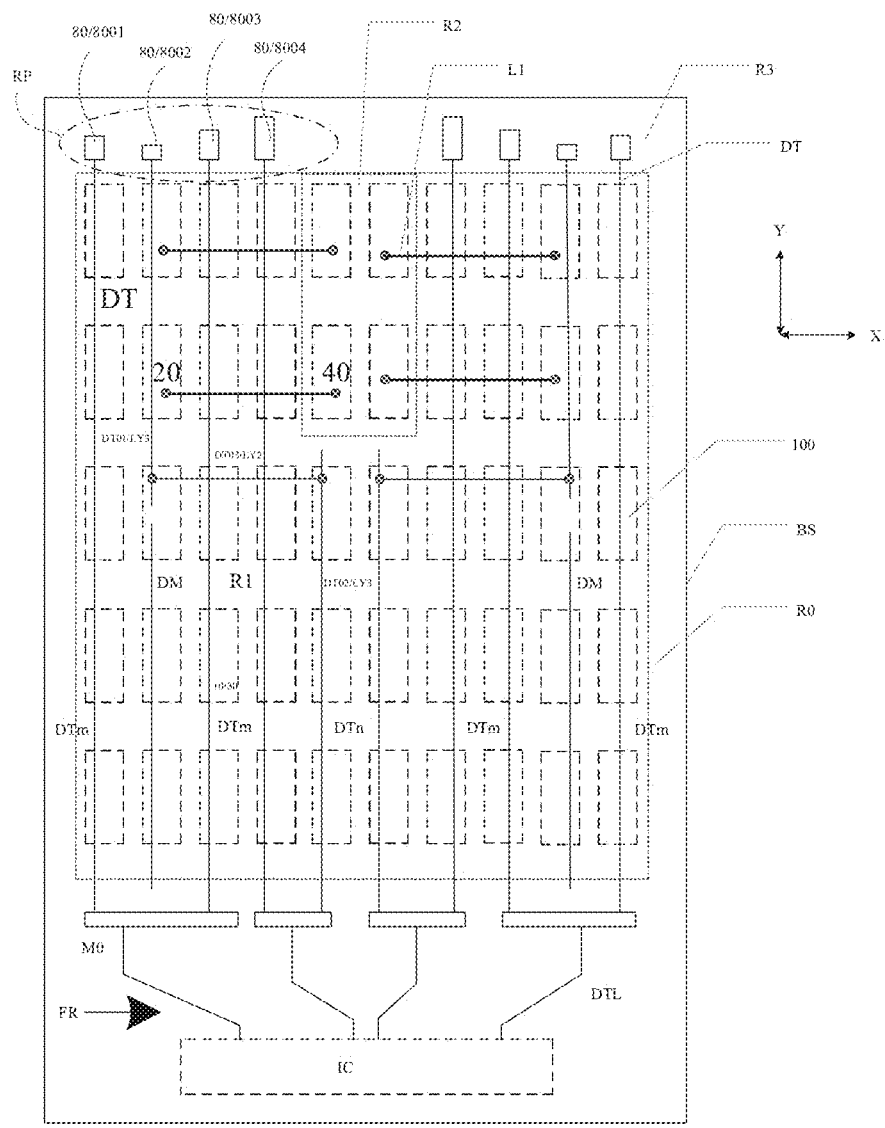
FIG. 15 is a schematic diagram of a display panel provided by an embodiment of the present disclosure.

FIG. 15 is a schematic diagram of a display panel provided by an embodiment of the present disclosure. As illustrated in FIG. 15, the compensation structure includes a compensation unit 8001, a compensation unit 8002, a compensation unit 8003, and a compensation unit 8004. In FIG. 15, the compensation amount of the compensation structure 80 is represented by the length of the compensation structure 80 in the second direction. As illustrated in FIG. 15, the compensation amounts of the compensation structures 80 are different. As illustrated in FIG. 15, the compensation amount of the compensation structure 8002 connected to the second-type data line DTn is less than the compensation amount of either of the compensation structures 8001, 8003 and 8004 connected to the first-type data lines DTm. As illustrated in FIG. 15, due to the length difference between the data lines in the fan-out region FR, the compensation amount of the compensation structure 8001 is less than the compensation amount of the compensation structure 8003, and the compensation amount of the compensation structure 8003 is less than the compensation amount of the compensation structure 8004. For example, for the compensation structure 80 connected to the first-type data line DTm, the closer the first-type data line DTm is to the edge of the display panel, the smaller the compensation amount of the compensation structure 80 connected to the first-type data line DTm; and the closer the first-type data line DTm is to the center line a0 of the display panel, the greater the compensation amount of the compensation structure 80 connected to the first-type data line DTm.

FIG. 15 further illustrates a data selector MO. As illustrated in FIG. 15, one end of a data transmission line DTL is connected to at least two data lines DT through the data selector MO, and the other end of the data transmission line DTL is connected to an integrated circuit IC. The data line DT is configured to input data signals to a plurality of pixel units 100. The data transmission line DTL can be regarded as a part of the data line DT. For example, the data line DT is configured to input data signals to a column of pixel units 100. For example, one data transmission line DTL inputs data signals to the data lines DT connected thereto at different time periods through the data selector MO. FIG. 15 takes that one data transmission line DTL is connected to two data lines DT through the data selector MO as an example, but it is not limited to this case. FIG. 15 illustratively illustrates components such as the data selector MO, the pixel units 100, the data line DT, the data transmission line DTL, etc. The number of each component is not limited to that illustrated in the figure. FIG. 1 illustrates a display region R1 and a peripheral region R2 located on at least one side of the display region R1. As illustrated in FIG. 1, a plurality of data lines DT are arranged in the first direction X, and each data line DT extends in the second direction Y. The arranging of the data selector MO is beneficial to obtaining a display panel with high frame rate and high refresh rate. As illustrated in FIG. 15, the fan-out region FR is located in the peripheral region R3.

For example, the position of the compensation structure 80 in the display panel provided by the embodiments of the present disclosure can be within the dashed border RP illustrated in FIG. 15. Of course, the arranging position of the compensation structure 80 can also be as illustrated in FIG. 14H and FIG. 14I. For example, the data line DT can be formed of multiple portions located in different layers, and the layer in which each portion is located can be set as needed. For example, the first portion DT01 of the data line DT can be located in the third conductive layer LY3. The third portion DT03 of the data line DT can be located in the second conductive layer LY2 or the fourth conductive layer LY4. The second portion DT02 of the data line DT can be located in the third conductive layer LY3.

For example, as illustrated in FIG. 15, the data line DT extends from the first display region R1 to the peripheral region R3. In some accompanying drawings, only a part of the data lines DT are illustrated, but not all of the data lines. As illustrated in FIG. 14H, for the second-type data line DTn, the fourth portion DT04 is connected to the compensation structure 80. As illustrated in FIG. 9A-FIG. 10B, for the second-type data line DTn, the first portion DT01 is connected to the compensation structure 80.

For example, referring to FIG. 3, the pixel unit 100 includes a first pixel unit 101 and a second pixel unit 102. A pixel circuit (first pixel circuit 10) and a light-emitting element (first light-emitting element 30) of the first pixel unit 101 are both located in the first display region R1, a pixel circuit (second pixel circuit 20) of the second pixel unit 102 is located in the first display region R1, a light-emitting element (second light-emitting element 40) of the second pixel unit 102 is located in the second display region R2, and the pixel circuit (second pixel circuit 20) of the second pixel unit 102 is connected to the light-emitting element (second light emitting element 40) of the second pixel unit 102 through a conductive line L1. Referring to FIG. 5E, the orthographic projection of the conductive line L1 on the base substrate BS partially overlaps with the orthographic projection of the pixel circuit (first pixel circuit 10) of the first pixel unit 101 on the base substrate BS.

For example, referring to FIG. 5B, the light-emitting area of the first light-emitting element 30 is greater than the light-emitting area of the second light-emitting element 40, and the resolution of the first display region R1 is the same as the resolution of the second display region R2.

Referring to FIG. 6, FIG. 8-FIG. 9C, FIG. 10A-FIG. 10B, FIG. 14H and FIG. 15, the display panel further includes a dummy data line DM, the dummy data line DM is a disconnected data line, the dummy data line DM is disconnected from the first portion DT01 of the second-type data line DTn, and the dummy data line DM is located between two first-type data lines DTm and disconnected from the first portion DT01 of one second-type data line DTn located between the two first-type data lines DTm. A part of the second portion DT02 of the second-type data line DTn and the third portion DT03 of the second-type data line DTn are not located between the two first-type data lines DTm. As illustrated in FIG. 15, the dummy data line DM is not connected to the data selector MO. As illustrated in FIG. 15, the dummy data line DM is not connected to the integrated circuit IC. For example, the dummy data line DM can be connected to a constant voltage line, but it is not limited to this case. For example, the pixel circuit overlapping with the dummy data line DM can be a dummy pixel circuit, and the dummy pixel circuit is not connected to a light-emitting element.

As illustrated in FIG. 9D, FIG. 14D and FIG. 14H-FIG. 14J, the orthographic projection of the first electrode-plate 802 on the base substrate partially overlaps with, but do not coincide with, the orthographic projection of the second electrode-plate 804 on the base substrate. Of course, the orthographic projection of the first electrode-plate 802 on the base substrate can also coincide with the orthographic projection of the second electrode-plate 804 on the base substrate in these figures. In the display panels illustrated in other figures, in terms of the compensation structure, the orthographic projection of the first electrode-plate 802 on the base substrate coincide with the orthographic projection of the second electrode-plate 804 on the base substrate, but of course, they can also be set to be non-coincident.

The embodiments of the present disclosure are illustrated by taking that each compensation structure includes three capacitors connected in parallel as an example, but it is not limited to this case, and more capacitors connected in parallel can be arranged as needed. In some other embodiments, each compensation structure can include one or two of three capacitors connected in parallel. That is, as illustrated in FIG. 12, the display panel can include one or two of the first compensation capacitor C1, the second compensation capacitor C2, and the third compensation capacitor C3. For example, the capacitance of the first compensation capacitor C1 is greater than the capacitance of the third compensation capacitor C3, and the capacitance of the second compensation capacitor C2 is greater than the capacitance of the third compensation capacitor C3. For example, the capacitance of the first compensation capacitor C1 is greater than the capacitance of the second compensation capacitor C2. For example, the compensation amount of the compensation capacitor is related to the opposing area of the compensation electrode-plates and the material and thickness of the insulating layer between the compensation electrode-plates.

Figure 16C:
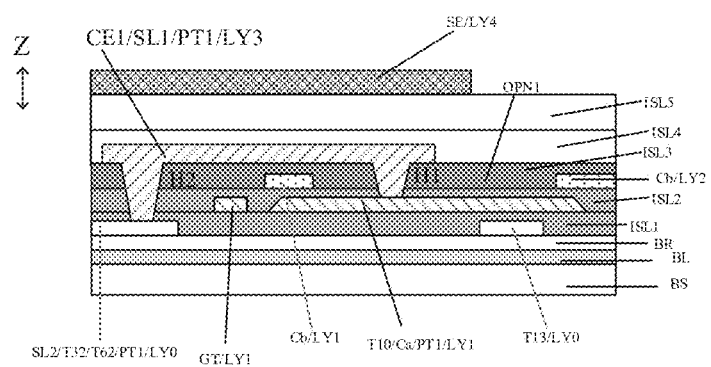
FIG. 16C is a cross-sectional view taken along line A-B of FIG. 16B.
Figure 16D:
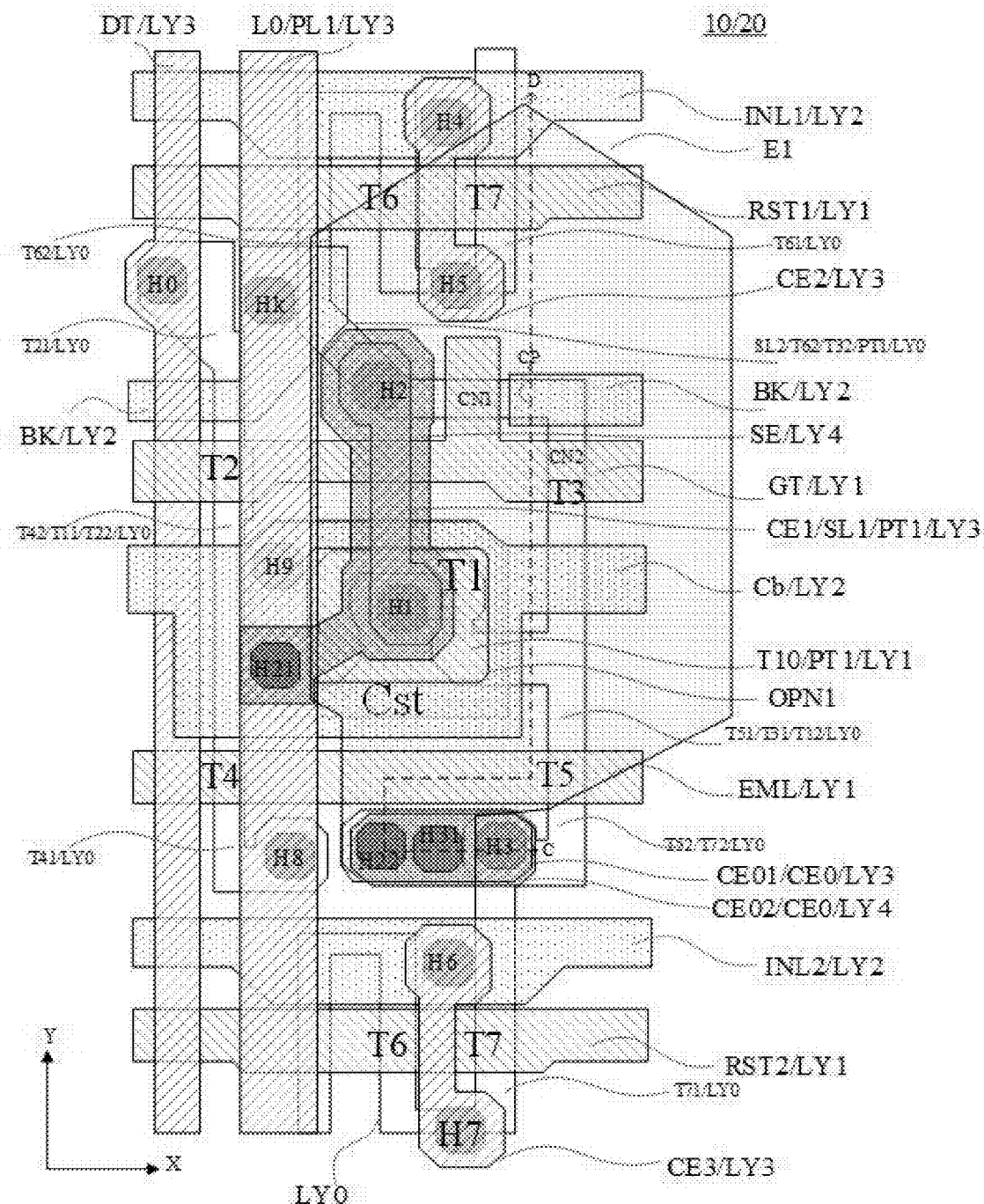
FIG. 16D is a layout diagram of a pixel circuit provided by an embodiment of the present disclosure.
Figure 16E:
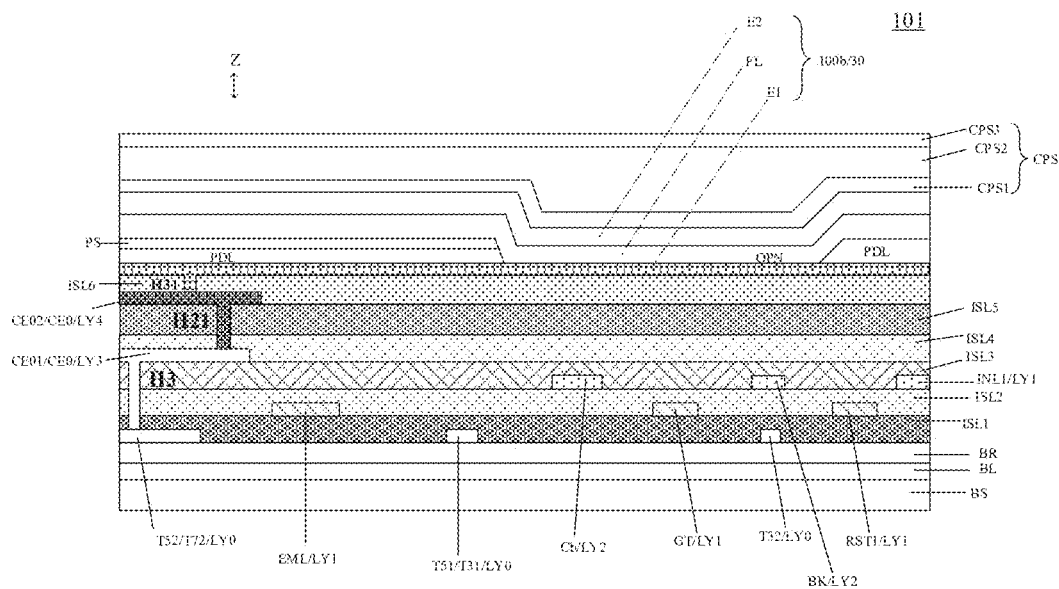
FIG. 16E is a cross-sectional view taken along line C-D of FIG. 16D.
Figure 16F:
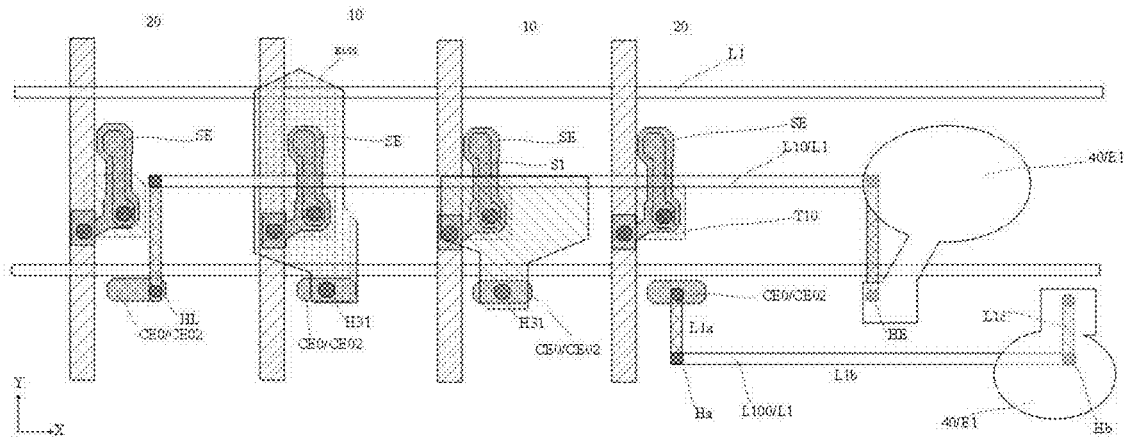
FIG. 16F is a partial schematic diagram of a display panel provided by an embodiment of the present disclosure.

FIG. 16A is a schematic diagram of a pixel circuit in a display panel provided by an embodiment of the present disclosure. FIG. 16B is a layout diagram of a pixel circuit in a display panel provided by an embodiment of the present disclosure. FIG. 16C is a cross-sectional view taken along line A-B of FIG. 16B. FIG. 16D is a layout diagram of a pixel circuit in a display panel provided by an embodiment of the present disclosure. FIG. 16E is a cross-sectional view taken along line C-D of FIG. 16D. FIG. 16F is a partial schematic diagram of a display panel provided by an embodiment of the present disclosure.

The pixel circuit illustrated in FIG. 16A may be a low temperature polysilicon (LTPS) AMOLED pixel circuit commonly used in the related art.

FIG. 16A illustrates a pixel circuit of one pixel unit of the display panel. As illustrated in FIG. 16A, the pixel unit 100 includes the pixel circuit 100a and the light-emitting element 100b. The pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1 and a second electrode E2, and a light-emitting function layer located between the first electrode E1 and the second electrode E2. For example, the first electrode E1 is an anode, and the second electrode E2 is a cathode. Generally, the threshold compensation transistor T3 and the first reset transistor T6 reduce leakage current by adopting double-gate thin film transistors (TFT).

As illustrated in FIG. 16A, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 16A, the driving transistor T1 is electrically connected to the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light emitting diode (OLED), and the light-emitting element 100b emits red light, green light, blue light, or white light under the driving of its corresponding pixel circuit 100a. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited to this. The number of pixel units included in a pixel and the light output of each pixel unit can be determined according to needs.

For example, as illustrated in FIG. 16A, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 16A, the pixel circuit 100a further includes the threshold compensation transistor T3, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as illustrated in FIG. 16A, the display panel further includes the light-emitting control signal line EML, and the pixel circuit 100a further includes the first light-emitting control transistor T4 and the second light-emitting control transistor T5. A gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100b.

As illustrated in FIG. 16A, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. For example, the first initialization signal line INT1 and the second initialization signal line INT2 are connected to each other and are input with the same initialization signal, but it is not limited to this. In some embodiments, the first initialization signal line INT1 and the second initialization signal line INT2 may also be insulated from each other and configured to input signals respectively.

For example, as illustrated in FIG. 16A, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100b. For example, as illustrated in FIG. 16A, a gate electrode T60 of the first reset transistor T6 is connected to the first reset control signal line RST1, and a gate electrode T70 of the second reset transistor T7 is connected to the second reset control signal line RST2.

As illustrated in FIG. 16A, the first power supply line PL1 is configured to provide the first voltage signal VDD to the pixel circuit 100a. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as illustrated in FIG. 16A, the display panel further includes the second power supply line PL2, and the second power supply line PL2 is connected to a second electrode 201 of the light-emitting element 100b.

FIG. 16A illustrates a first node N1, a second node N2, a third node N3, and a fourth node N4. For example, in some embodiments, referring to FIG. 5C, FIG. 5E, and FIG. 16A, a capacitor is formed between the first node N1 and the conductive line L1, and a capacitor is formed between the conductive line L1 and the fourth node N4, that is, the conductive line L1 is coupled with the first node N1 and the fourth node N4, respectively, resulting in brightness differences and display defects (for example, forming stripes (Mura)), which affects the display quality.

As illustrated in FIG. 16B, the pixel circuit includes the driving transistor T1, and the driving transistor includes the gate electrode T10. Referring to FIG. 16B and FIG. 16C, the second electrode Cb of the storage capacitor Cst has an opening OPN1, and one end of the connecting electrode CE1 is connected to the gate electrode T10 of the driving transistor T1 through the opening OPN1. The connection electrode CE1 may also be referred to as a first gate signal line SL1. As illustrated in FIG. 16B, the first gate signal line SL1 is connected to the gate electrode T10 of the driving transistor T1.

As illustrated in FIG. 16B, the first gate signal line SL1 is connected to the second gate signal line SL2. The gate electrode T10 of the driving transistor T1, the first gate signal line SL1, and the second gate signal line SL2 constitute a gate signal portion PT1. The potentials on the gate signal portion PT1 are the same. Of course, in other embodiments, the second gate signal line SL2 may not be provided, in this case, the gate electrode T10 of the driving transistor T1 and the first gate signal line SL1 constitute the gate signal portion PT1. For example, the second gate signal line SL2 is the second electrode T62 of the first reset transistor T6.

Referring to FIG. 16B and FIG. 16C, in order to stabilize the potentials on the gate signal portion PT1, the display panel provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS. As illustrated in FIG. 16B, the shield electrode SE is connected to first power supply line PL1 through via hole H21.

Referring to FIG. 16B to FIG. 16D, in order to make the shield electrode play a better shielding effect and increase the shielding amount, the orthographic projection of the first gate signal line SL1 on the base substrate BS completely falls within the orthographic projection of the shield electrode SE on the base substrate BS.

For example, in order to alleviate display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 μm. Because the area occupied by the pixel unit is limited, the distance of the shield electrode SE beyond the first gate signal line SL1 can be defined. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 μm.

As illustrated in FIG. 16B, the display panel further includes a block BK, and the block BK is connected to the first power supply line PL1. The threshold compensation transistor T3 includes a first channel CN1 and a second channel CN2, and the first channel CN1 and the second channel CN2 are connected by a conductive connection portion CP. The orthographic projection of the block BK on the base substrate BS at least partially overlaps with the orthographic projection of the conductive connection portion CP of the threshold compensation transistor T3 on the base substrate BS. As illustrated in FIG. 16B, the block BK of the pixel unit of the adjacent column is used to shield the conductive connection portion CP of the threshold compensation transistor T3 of the pixel unit of the current column.

Figure 16G:
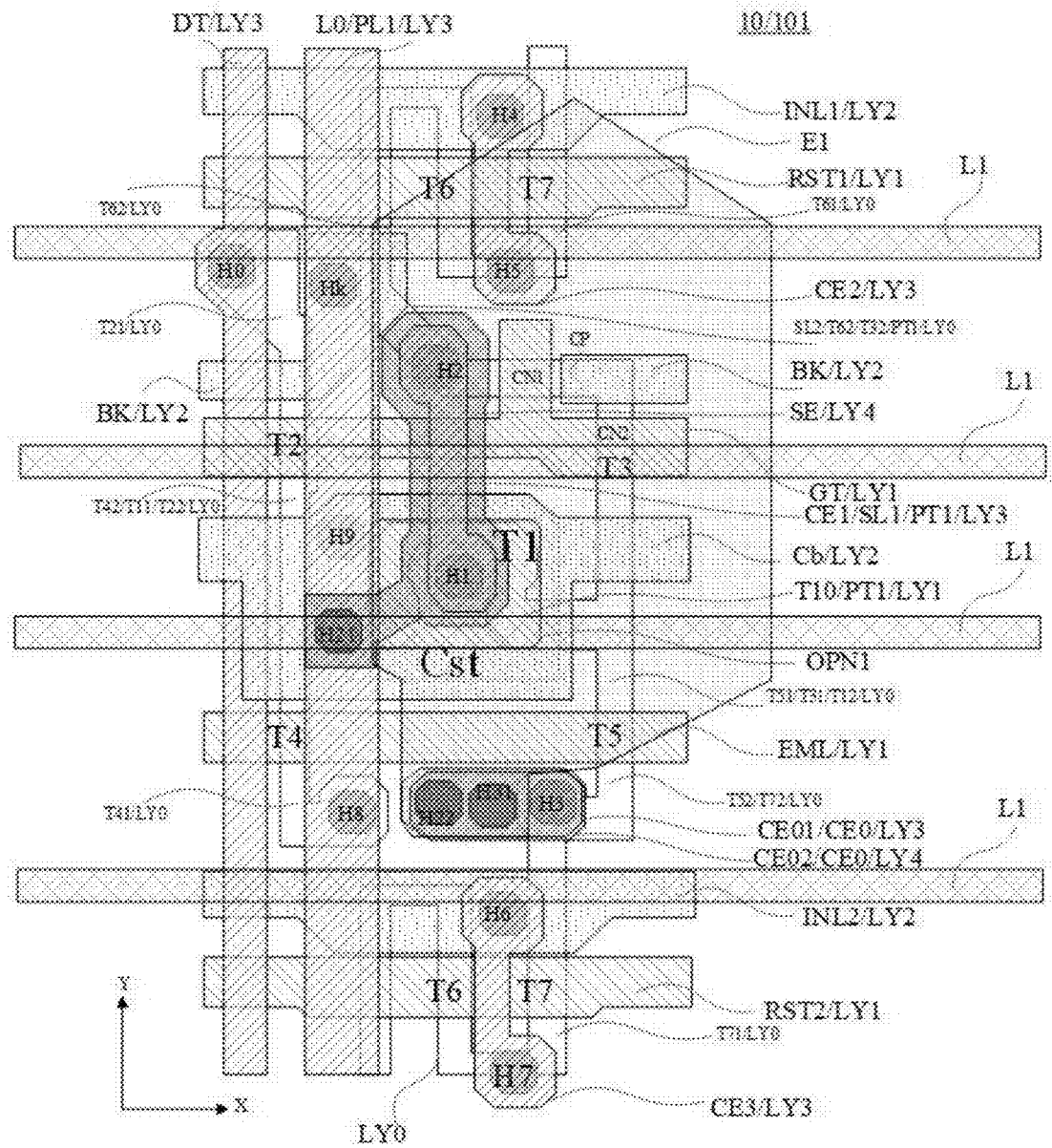
FIG. 16G is a partial schematic diagram of a display panel provided by an embodiment of the present disclosure.
Figure 16H:
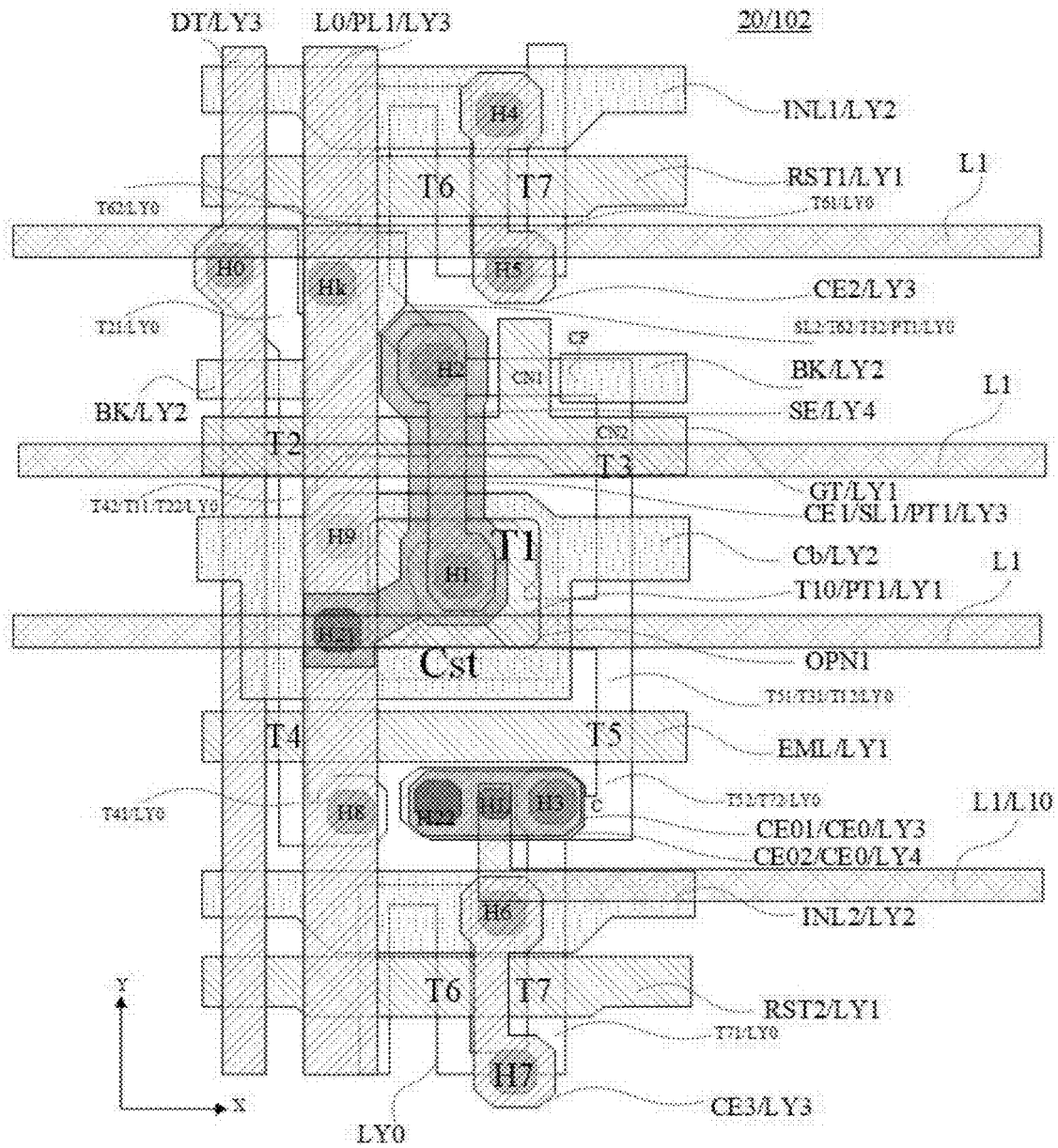
FIG. 16H is a partial schematic diagram of a display panel provided by an embodiment of the present disclosure.
Figure 17:
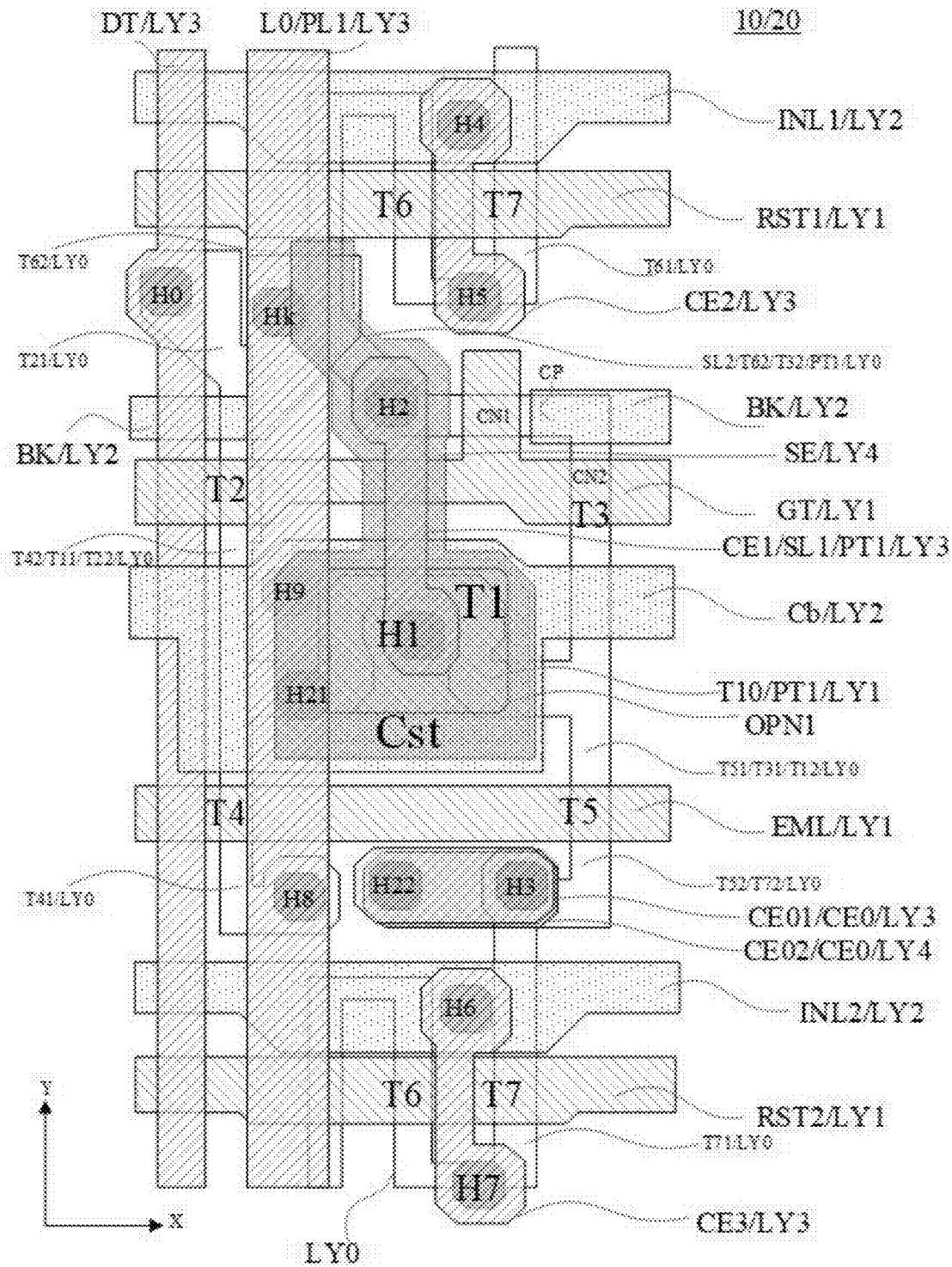
FIG. 17 is a layout diagram of a first pixel circuit or a second pixel circuit in a display panel provided by an embodiment of the present disclosure.

For example, as illustrated in FIG. 16B, FIG. 16G, and FIG. 16H, in the case where the display panel includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. For further example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 μm. For example, the boundary of the orthographic projection of the block BK on the base substrate BS exceeds the boundary of the orthographic projection of the second gate signal line SL2 on the base substrate BS by a distance greater than or equal to 2.33 μm. Of course, in other embodiments, the shield electrode SE can also be used to replace the role of the block BK, or the orthographic projection of the second gate signal line SL2 on the base substrate BS not only falls within the orthographic projection of the block BK on the base substrate BS, but also falls within the orthographic projection of the shield electrode SE on the base substrate BS (as illustrated in FIG. 17).

For example, the material of the first gate signal line SL1 is different from the material of the second gate signal line SL2. For example, the material of the first gate signal line SL1 includes a metal, and the material of the second gate signal line SL2 includes a conductive material formed by conducting a semiconductor material.

For example, as illustrated in FIG. 16B and FIG. 16D, in order to save wiring, the first power supply line PL1 serves as the constant voltage line L0. In other embodiments, in order to save wiring, the first initialization signal line INL1 can also be used as the constant voltage line or the second initialization signal line INL2 can also be used as the constant voltage line. Examples of the constant voltage line L0 are not limited to the first power supply line PL1, the first initialization signal line INL1, and the second initialization signal line INL2, and any signal line that provides a constant voltage in the pixel circuit can be used as the constant voltage line L0. The embodiment of the present disclosure takes the first power supply line PL1 as the constant voltage line L0 as an example for description, and in the case where a signal line that provides a constant voltage other than the first power supply line PL1 is used as the constant voltage line L0, the shape of the shield electrode SE may be adjusted so that it is connected to the signal line supplying a constant voltage.

As illustrated in FIG. 16F, the conductive line L1 includes a first portion L1a, a second portion L1b, and a third portion L1c. Both the first portion L1a and the third portion L1c extend in the second direction Y, and the second portion L1b extends in the first direction X. For example, the first portion L1*a* and the third portion L1*c* are located in the same conductive line pattern layer, and the second portion Lib is located in another conductive line pattern layer. The gray-filled regions in FIG. 16F represent via holds used to connect different parts of the conductive line.

FIG. 16F illustrates a via hole Ha and a via hole Hb. The first portion L1*a* and the second portion L1*b* are connected by the via hole Ha that penetrates the insulating layer, and the second portion L1*b* and the third portion L1*c* are connected by the via hole Hb that penetrates the insulating layer. For example, FIG. 16F illustrates three conductive lines L1, and the conductive line L10 and the conductive line L100 have a similar structure.

Of course, in other embodiments, the entire conductive line may be located on the same conductive line pattern layer. That is, the first portion L1*a*, the second portion Lib, and the third portion L1*c* are all located on the same conductive line pattern layer. For example, in other embodiments, three adjacent conductive lines L1 in the second direction Y are respectively located on the first conductive line pattern layer, the second conductive line pattern layer, and the third conductive line pattern layer. The arranging of the conductive lines can be determined according to needs.

As illustrated in FIG. 16F, the orthographic projection of the conductive line L1 on the base substrate BS partially overlaps with the orthographic projection of the pixel circuit (the first pixel circuit 10) of the first pixel unit 101 on the base substrate BS. As illustrated in FIG. 16F, the shield electrode SE is located between the conductive line L1 and the first gate signal line SL1. In the embodiment of the present disclosure, after the pixel circuit is formed, the shield electrode SE is formed, then the conductive line L1 is formed, and then the light-emitting element is formed, so that the shield electrode SE is located between the conductive line L1 and the first gate signal line SL1, and the shield electrode SE is located between the conductive line L1 and the gate electrode T10 of the driving transistor (referring to FIG. 16G and FIG. 16H).

For the sake of clarity, only a part of the structure of the pixel circuit is illustrated in FIG. 16F. The conductive line L1 is disposed in the auxiliary region, and the conductive line L1 is not disposed in the region other than the auxiliary region of the first display region, so that the orthographic projection of the pixel circuit (the first pixel circuit), which is in the region of the first display region except the auxiliary region, on the base substrate BS does not overlap with the orthographic projection of the conductive line L1 on the base substrate BS.

As illustrated in FIG. 16F, the orthographic projection of the conductive line L1 on the base substrate BS partially overlaps with the orthographic projection of the first gate signal line SL1 in the pixel circuit of the first pixel unit 101 on the base substrate BS.

FIG. 16F illustrates a via hole HL and a via hole HE. As illustrated in FIG. 16F, one end of the conductive line L10 is connected to the second pixel circuit 20 through the via hole HL, and the other end of the conductive line L10 is connected to the first electrode E1 of the second light-emitting element 40 through the via hole HE.

Referring to FIG. 16C and FIG. 16E, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connecting electrode CE01, and the connecting electrode CE01 is connected to the second electrode T52 of the second light-emitting control transistor T5 through a via hole H3 penetrating the first insulating layer ISL1, the second insulating layer ISL2, and the third insulating layer ISL3. A fourth insulating layer ISL4 and a fifth insulating layer ISL5 are disposed on the third conductive layer LY3, and a fourth conductive layer LY4 is disposed on the fourth insulating layer ISL4 and the fifth insulating layer ISL5. The fourth conductive layer LY4 includes a connecting electrode CE02, and the connecting electrode CE02 is connected to the connecting electrode CE01 through a via hole H22 that penetrates the fourth insulating layer ISL4 and the fifth insulating layer ISL5. A sixth insulating layer ISL6 is disposed on the fourth conductive layer LY4, and the light-emitting element 100*b* (the second light-emitting element 30) is connected to the connection electrode CE02 through a via hole H31 (as illustrated in FIG. 16D and FIG. 16E) penetrating the sixth insulating layer ISL6. The light-emitting element 100*b* includes a first electrode E1, a second electrode E2, and a light-emitting function layer FL located between the first electrode E1 and the second electrode E2. For example, the connecting element CE0 includes the connecting electrode CE01 and the connecting electrode CE02.

As illustrated in FIG. 16B, one end of the connecting electrode CE1 is connected to the gate electrode T10 of the driving transistor T1 through a via hole H1, and the other end of the connecting electrode CE1 is connected to the second electrode T62 of the first reset transistor T6 through a via hole H2. One end of the connecting electrode CE2 is connected to the first initialization signal line INL1 through a via hole H4, and the other end of the connecting electrode CE2 is connected to the first electrode T61 of the first reset transistor T6 through a via hole H5. One end of the connecting electrode CE3 is connected to the second initialization signal line INL2 through a via hole H6, and the other end of the connecting electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display panel, a self-aligned process is adopted, and a semiconductor patterned layer is subject to a conductor process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, and a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain electrode region (the second electrode T72) of the second reset transistor T7 are formed. The portion of the semiconductor pattern layer covered by the first conductive layer LY1 retains semiconductor characteristics, and can form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as illustrated in FIG. 16B, the second electrode T72 of the second reset transistor T7 and the second electrode T52 of the second light-emitting control transistor T5 are formed as an integrated structure; the first electrode T51 of the second light-emitting control transistor T5, the second electrode T12 of the driving transistor T1, and the first electrode T31 of the threshold compensation transistor T3 are formed as an integrated structure; the first electrode T11 of the driving transistor T1, the second electrode T22 of the data writing transistor T2, and the second electrode T42 of the first light-emitting control transistor T4 are formed as an integrated structure; and the second electrode T32 of the threshold compensation transistor T3 and the second electrode T62 of the first reset transistor T6 are formed as an integrated structure. In some embodiments, as illustrated in FIG. 16B, the first electrode T71 of the second reset transistor T7 and the first electrode T61 of the first reset transistor T6 may be formed as an integrated structure.

For example, the channel regions of the transistors used in the embodiment of the present disclosure may adopt monocrystalline silicon, polycrystalline silicon (such as low temperature polysilicon), or metal oxide semiconductor materials (such as IGZO, AZO, etc.). In one embodiment, the transistors are all P-type low temperature polysilicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is a metal oxide semiconductor material (such as IGZO, AZO, etc.). The metal oxide semiconductor thin film transistor has a lower leakage current, which can help reduce the leakage current of the gate electrode of the driving transistor T1.

For example, the transistors adopted in the embodiments of the present disclosure may include various structures, such as a top gate type, a bottom gate type, or a dual-gate structure. In one embodiment, the threshold compensation transistor T3 and the first reset transistor T6, which are directly connected to the gate electrode of the driving transistor T1, are dual-gate thin film transistors, which can help reduce the leakage current of the gate electrode of the driving transistor T1.

For example, as illustrated in FIG. 16E, the display panel further includes a pixel definition layer PDL and a spacer PS. The pixel definition layer PDL has an opening OPN, and the opening OPN is configured to define the light-emitting area (light exit region, effective light-emitting area) of the pixel unit. The spacer PS is configured to support a fine metal mask when forming the light-emitting function layer FL.

For example, the opening OPN is the light exit region of the pixel unit. The light-emitting function layer FL is located on the first electrode E1 of the light-emitting element 100b, and the second electrode E2 of the light-emitting element 100b is located on the light-emitting function layer FL. As illustrated in FIG. 16E, an encapsulation layer CPS is disposed on the light-emitting element 100b. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode E1 is the anode of the light-emitting element 100b, and the second electrode E2 is the cathode of the light-emitting element 100b, but it is not limited thereto.

FIG. 16G is a partial schematic diagram of a display panel provided by an embodiment of the present disclosure. FIG. 16G illustrates a plurality of conductive lines L1. For example, the conductive line L1 extends in the first direction X, and the plurality of conductive lines L1 are arranged in the second direction Y, but it is not limited thereto. FIG. 16G illustrates four conductive lines L1. However, the number of the conductive lines L1 can be determined as required. The pixel unit illustrated in FIG. 16G is the first pixel unit 101, and the pixel circuit illustrated in FIG. 16G is the first pixel circuit 10. The display panel provided by the embodiment of the present disclosure further includes a first pixel unit 101 that does not overlap with the conductive line L1. For example, the first pixel unit 101 that does not overlap with the conductive line L1 is located in the first display region except the auxiliary region. Each conductive line L1 illustrated in FIG. 16G is used to connect the second pixel circuit 20 and the second light-emitting element 40 respectively located on the left and right sides of the first pixel unit 101.

FIG. 16H is a partial schematic diagram of a display panel provided by an embodiment of the present disclosure. FIG. 16H illustrates a plurality of conductive lines L1. For example, the conductive line L1 extends in the first direction X, and the plurality of conductive lines L1 are arranged in the second direction Y, but it is not limited thereto. FIG. 16G illustrates four conductive lines L1. However, the number of the conductive lines L1 can be determined as required. The pixel unit illustrated in FIG. 16G is the second pixel circuit 20 of the second pixel unit 102. As illustrated in FIG. 16H, one of the conductive lines L1 is connected to the second pixel unit 102, and the remaining conductive lines L1 are not connected to the second pixel unit 102. For example, the conductive line L10 (one of the plurality of conductive lines L1) is connected to the connection element CE0 of the second pixel unit 102 through the via hole HL penetrating the insulating layer. For further example, the conductive line L10 is connected to the connection electrode CE02 of the connection element CE0 of the second pixel unit 102 through the via hole HL penetrating the insulating layer. The conductive line L10 is used to connect to the first electrode E1 of the second light-emitting element 40 located in the second display region.

FIG. 17 is a layout diagram of a first pixel circuit or a second pixel circuit in a display panel provided by an embodiment of the present disclosure. For example, as illustrated in FIG. 17, the orthographic projection of the gate electrode T10 of the driving transistor T1 on the base substrate BS falls within the orthographic projection of the shield electrode SE on the base substrate BS.

For example, as illustrated in FIG. 17, in the case where the display panel includes the second gate signal line SL2, the second gate signal line SL2 is connected to the first gate signal line SL1, and the orthographic projection of the second gate signal line SL2 on the base substrate BS also falls within the orthographic projection of the shield electrode SE on the base substrate BS. For further example, the boundary of the orthographic projection of the shield electrode SE on the base substrate BS exceeds the boundary of the orthographic projection of the second gate signal line SL2 on the base substrate BS. For example, the boundary of the orthographic projection of the shield electrode SE on the base substrate BS exceeds the boundary of the orthographic projection of the second gate signal line SL2 on the base substrate BS by a distance greater than or equal to 1.75 μm. For example, the boundary of the orthographic projection of the shield electrode SE on the base substrate BS exceeds the boundary of the orthographic projection of the second gate signal line SL2 on the base substrate BS by a distance greater than or equal to 2.33 μm.

For example, as illustrated in FIG. 17, the orthographic projections of the gate electrode T10 of the driving transistor T1, the first gate signal line SL1, and the second gate signal line SL2 on the base substrate BS all fall into the orthographic projection of the shield electrode SE on the base substrate BS.

For example, as illustrated in FIG. 17, the orthographic projection of the shield electrode SE on the base substrate BS partially overlaps with the orthographic projection of the second gate signal line SL2 on the base substrate BS, and the orthographic projection of the block BK on the base substrate BS partially overlaps with the orthographic projection of the second gate signal line SL2 on the base substrate BS. Thus, in the display panel illustrated in FIG. 17, the shield electrode SE and the block BK form a double-layer shield for the second gate signal line SL2.

For example, as illustrated in FIG. 17, the orthographic projection of the shield electrode SE on the base substrate BS partially overlaps with the orthographic projection of the block BK on the base substrate BS.

Of course, in other embodiments, the block BK may not be provided, or the orthographic projection of the block BK on the base substrate BS does not overlap with the orthographic projection of the second gate signal line SL2 on the base substrate BS.

For example, as illustrated in FIG. 16B and FIG. 16D, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in other embodiments, the block BK may not be provided, or the orthographic projection of the block BK on the base substrate BS dose not overlap with the orthographic projection of the second gate signal line SL2 on the base substrate BS.

For example, as illustrated in FIG. 16B and FIG. 16D, the block BK on the left extends to a pixel unit on the left side of the pixel unit illustrated in the figure, in order to shield the conductive connection portion CP of the threshold compensation transistor T3, while the block BK on the right is extended from the block BK connected to a pixel unit on the right side of the pixel unit illustrated in the figure.

As illustrated in FIG. 16B, FIG. 16D, and FIG. 17, the channel of each transistor as well as the first electrode and the second electrode on both sides of the channel are located in the active layer LY0; the first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1; the first initialization signal line INL1, the second electrode Cb of the storage capacitor Cst, and the second initialization signal line INL2 are located in the second conductive layer LY2; the data line DT, the first power supply line PL1, the connecting electrode CE1, the connecting electrode CE2, the connecting electrode CE3, and the connecting electrode CE01 are located in the third conductive layer LY3; and the shield electrode SE is located in the fourth conductive layer LY4. As illustrated in FIG. 16B, FIG. 16D, and FIG. 17, the first initialization signal line INL1, the first reset control signal line RST1, the gate line GT, the light-emitting control signal line EML, the second initialization signal line INL2, and the second reset control signal lines RST2 all extend in the first direction X. As illustrated in FIG. 16B, FIG. 16D, and FIG. 17, the data line DT and the first power supply line PL1 both extend in the second direction Y.

In the embodiments of the present disclosure, an orthographic projection of an element A on the base substrate BS falls within an orthographic projection of an element B on the base substrate BS means that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, in some embodiments of the present disclosure, each pixel circuit 100a is provided with any one of the shield electrodes SE described above. That is, both the first pixel circuit 10 of the first pixel unit 101 and the second pixel circuit 20 of the second pixel unit 102 are provided with any one of the shield electrodes SE described above. FIG. 16F illustrates that the first pixel circuit 10 of the first pixel unit 101 includes the shield electrode SE, and the second pixel circuit 20 of the second pixel unit 102 includes the shield electrode SE. Of course, the shield electrode SE may also take other forms, for example, the shield electrode illustrated in FIG. 16F can also be replaced with the shield electrode illustrated in FIG. 17 or the shield electrode illustrated in FIG. 17.

For example, the transistors in the pixel circuit of the embodiment of the present disclosure are all thin film transistors. For example, the first conductive layer LY1, the second conductive layer LY2, the third conductive layer LY3, and the fourth conductive layer LY4 are all made of metal materials. For example, the first conductive layer LY1 and the second conductive layer LY2 are formed of metal materials such as nickel and aluminum, etc., but are not limited thereto. For example, the third conductive layer LY3 and the fourth conductive layer LY4 are formed of materials such as titanium, aluminum, etc., but are not limited thereto. For example, the third conductive layer LY3 and the fourth conductive layer LY4 are respectively a structure formed by three sub-layers of Ti/AL/Ti, but are not limited thereto. For example, the base substrate may be a glass substrate or a polyimide substrate, but it is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer ISL5, and the sixth insulating layer ISL6 are all made of insulating materials. The materials of the first electrode E1 and the second electrode E2 of the light-emitting element can be selected as required. In some embodiments, the first electrode E1 may adopt at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 may adopt a metal of low work function, for example at least one of magnesium and silver, but is not limited thereto.

For example, in the embodiments of the present disclosure, the thickness of the fifth insulating layer ISL5 is greater than the thickness of at least one of the fourth insulating layer ISL4, the third insulating layer ISL3, the second insulating layer ISL2 or the first insulating layer ISL1. In some embodiments, the thickness of the fifth insulating layer ISL5 is greater than the thickness of each of the fourth insulating layer ISL4, the third insulating layer ISL3, the second insulating layer ISL2 and the first insulating layer ISL1. For example, the buffer layer BL, the isolation layer BR, the first insulating layer ISL1, the second insulating layer ISL2, the third insulating layer ISL3, the fourth insulating layer ISL4 and the fifth insulating layer ISL5 are all made of insulating materials. At least one of the buffer layer BL, the isolation layer BR, the first insulating layer ISL1, the second insulating layer ISL2, the third insulating layer ISL3 and the fourth insulating layer ISL4 is made of an inorganic insulating material, and the fifth insulating layer ISL5 can be made of an organic material. For example, the inorganic insulating material includes at least one of silicon oxide, silicon nitride or silicon oxynitride, but is not limited thereto. For example, the organic material includes resin, but is not limited thereto.

For example, referring to the layout diagrams and the cross-sectional views of the embodiment of the present disclosure, the display panel provided by at least one embodiment of the present disclosure can be manufactured by the following method.

(1) Forming a buffer layer BL and an isolation layer BR on the base substrate BS.
(2) Forming a semiconductor film on the isolation layer BR.
(3) Patterning the semiconductor film to form a semiconductor pattern layer.
(4) Forming a first insulating film on the semiconductor pattern layer.
(5) Forming a first conductive film on the first insulating film, and patterning the first conductive film to form the first conductive layer LY1.
(6) Doping the semiconductor pattern layer by using the first conductive layer LY1 as a mask, so as to form the active layer LY0.
(7) Forming a second insulating film on the first conductive layer LY1.
(8) Forming a second conductive film on the second insulating layer ISL2, and patterning the second conductive film to form the second conductive layer LY2.
(9) Forming a third insulating film on the second conductive layer LY2.
(10) Patterning at least one of the first insulating film, the second insulating film, and the third insulating film to simultaneously form via holes, the first insulating layer ISL1, the second insulating layer ISL2, and the third insulating layer ISL3.
(11) Forming a third conductive film, patterning the third conductive film to form the third conductive layer LY3, and the components in the third conductive layer LY3 being connected to the components located under the third conductive layer LY3 through the via holes.
(12) Forming a fourth insulating film and a fifth insulating film, and patterning the fourth insulating film and the fifth insulating film to simultaneously form via holes, the fourth insulating layer and the fifth insulating layer.
(13) Forming a fourth conductive film, and patterning the fourth conductive film to form the fourth conductive layer LY4.
(14) Forming at least one insulating layer and at least one transparent conductive layer, and the transparent conductive layer including the conductive lines L1.
(15) Forming a first electrode E1 of the light-emitting element.
(16) Forming a pixel definition layer and a spacer.
(17) Forming a light-emitting function layer.
(18) Forming a second electrode E2 of the light-emitting element.
(19) Forming an encapsulation layer CPS.

At least one embodiment of the present disclosure provides a display device including any one of the above-mentioned display panels.

Figure 18A:
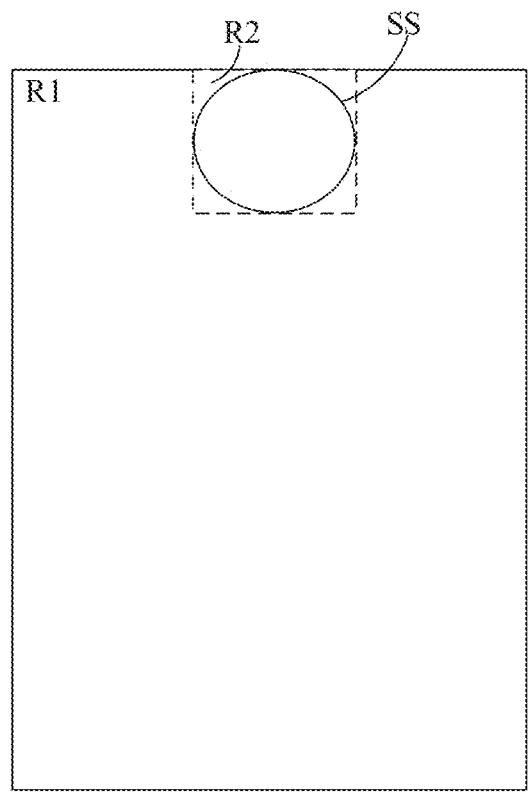
FIG. 18A and FIG. 18B are schematic diagrams of a display device provided by an embodiment of the present disclosure.
Figure 18B:
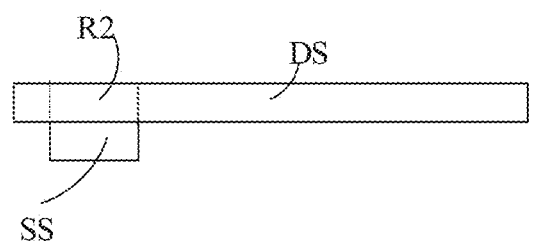

FIG. 18A and FIG. 18B are schematic diagrams of a display device provided by an embodiment of the disclosure. As illustrated in FIG. 18A and FIG. 18B, a photosensitive sensor SS is located on one side of a display panel DS and located in a second display region R2. The ambient light propagates through the second display region R2 and can be sensed by the photosensitive sensor SS. As illustrated in FIG. 18B, the side of the display panel where the photosensitive sensor SS is not provided is a display side, and images can be displayed on the display side.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

Figure 19:
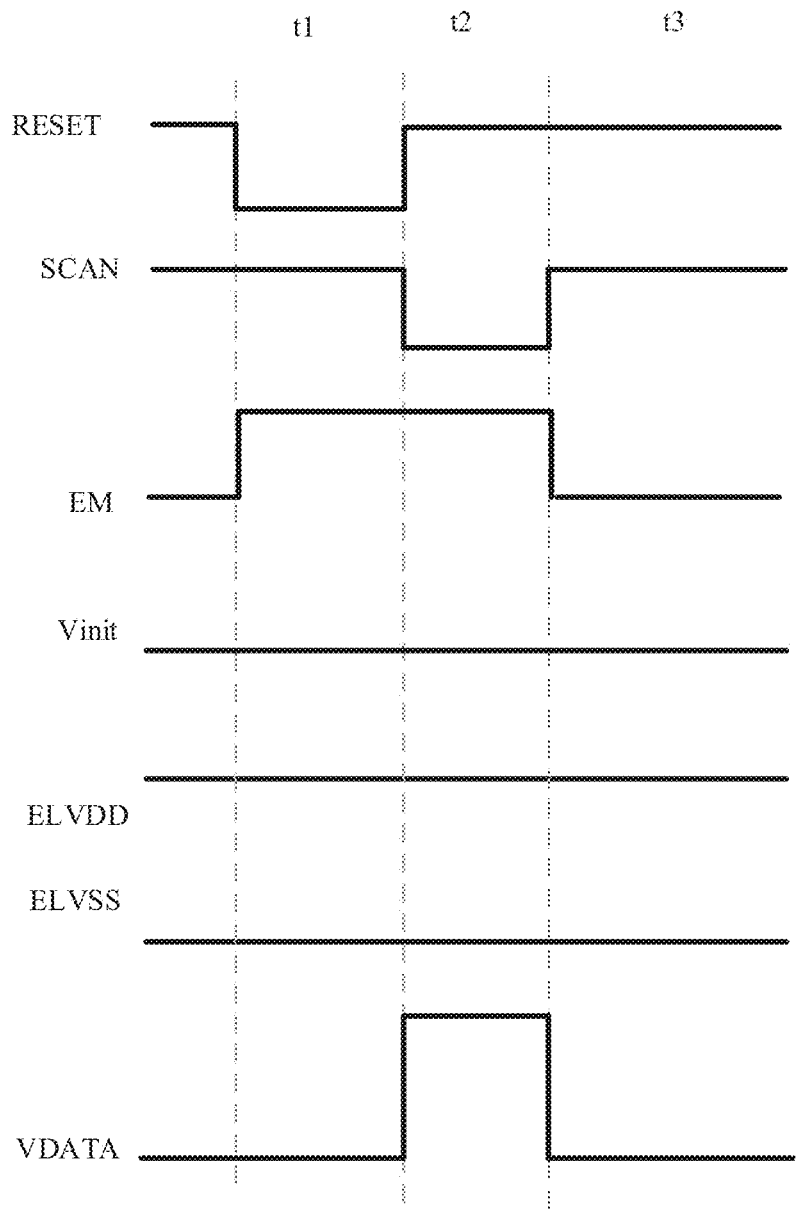
FIG. 19 is a working timing chart of the pixel circuit illustrated in FIG. 6A.

FIG. 19 is a working timing diagram of the pixel circuit illustrated in FIG. 16A. As illustrated in FIG. 19, during one frame of display period, the driving method of the pixel unit includes a first reset stage t1, a data writing, threshold compensation and second reset stage t2, and a light-emitting stage t3. When the reset control signal RESET is at a low level, the gate electrode of the driving transistor T1 is reset, and when the scan signal SCAN is at a low level, the first electrode E1 (for example, the anode) of the light-emitting element 100b is reset. For example, as illustrated in FIG. 16A, when the scan signal SCAN is at a low level, the data voltage VDATA is written, and the threshold voltage Vth of the driving transistor T1 is obtained at the same time, and the data voltage VDADA containing the data information on the data line is stored in the capacitor Cst. When the light-emitting control signal line EML is at a low level, the light-emitting element 100b emits light, and the voltage of the first node N1 (node of the gate electrode) is maintained by the storage capacitor Cst (the light-emitting stability of the light-emitting element 100*b*). In the driving process of the pixel circuit 10, in the light-emitting stage, the storage capacitor is used to maintain the voltage signal, so that the potential of the signal holding terminal can be kept constant, and a voltage is formed between the gate electrode and the source electrode of the driving transistor, thereby controlling the driving transistor to form a driving current, and then driving the light-emitting element 100*b* to emit light.

As illustrated in FIG. 19, in the reset stage t1, the light-emitting control signal EM is set to a turn-off voltage, the reset control signal RESET is set to a turn-on voltage, and the scan signal SCAN is set to the turn-off voltage.

As illustrated in FIG. 19, in the data writing, threshold compensation and second reset stage t2, the light-emitting control signal EM is set to the turn-off voltage, the reset control signal RESET is set to the turn-off voltage, and the scan signal SCAN is set to the turn-on voltage.

As illustrated in FIG. 19, in the light-emitting stage t3, the light-emitting control signal EM is set to the turn-on voltage, the reset control signal RESET is set to the turn-off voltage, and the scan signal SCAN is set to the turn-off voltage.

As illustrated in FIG. 19, the first voltage signal ELVDD and the second voltage signal ELVSS are both constant voltage signals. For example, the level of the initialization signal Vinit is between the level of the first voltage signal ELVDD and the level of the second voltage signal ELVSS.

For example, the turn-on voltage in the embodiment of the present disclosure refers to a voltage that can electrically connect the first electrode and the second electrode of the corresponding transistor (the transistor is in ON state), and the turn-off voltage refers to a voltage that can electrically disconnect the first electrode and the second electrode of the corresponding transistor (the transistor is in OFF state). In the case where the transistor is a P-type transistor, the turn-on voltage is a low voltage (for example, 0V), and the turn-off voltage is a high voltage (for example, 5V); and in the case where the transistor is an N-type transistor, the turn-on voltage is a high voltage (for example, 5V) and the turn-off voltage is a low voltage (for example, 0V). The driving waveforms illustrated in FIG. 19 are all explained by taking the P-type transistor as an example. For example, the turn-on voltage is a low voltage (for example, 0V), and the turn-off voltage is a high voltage (for example, 5V), but it is not limited to this.

Please refer to FIG. 16A and FIG. 19 together. In the first reset stage t1, the light-emitting control signal EM is of the turn-off voltage, the reset control signal RESET is of the turn-on voltage, and the scan signal SCAN is of the turn-off voltage. At this time, the first reset transistor T6 is in an ON state, and the second reset transistor T7, the data writing transistor T2, the threshold compensation transistor T3, the first light-emitting control transistor T4, and the second light-emitting control transistor T5 are in an OFF state. The first reset transistor T6 transmits the first initialization signal (initialization voltage Vinit) Vinit1 to the gate electrode of the driving transistor T1, and the first initialization signal Vinit1 is stored by the storage capacitor Cst. The driving transistor T1 is reset, and the data stored during the last (previous frame) light-emitting is erased.

In the data writing, threshold compensation, and second reset stage t2, the light-emitting control signal EM is of the turn-off voltage, the reset control signal RESET is of the turn-off voltage, and the scan signal SCAN is of the turn-on voltage. At this time, the data writing transistor T2 and the threshold compensation transistor T3 are in the ON state, the second reset transistor T7 is in the ON state, and the second reset transistor T7 transmits the second initialization signal (initialization voltage Vinit) Vinit2 to the first electrode E1 of the light-emitting element 100*b* to reset the light-emitting element 100*b*. The first light-emitting control transistor T4, the second light-emitting control transistor T5, and the first reset transistor T6 are in the OFF state. At this time, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, thereby charging the gate electrode of the driving transistor T1. After the charging is completed, the voltage of the gate electrode of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation to the gate electrode of the driving transistor T1 according to the scan signal SCAN. During this stage, the voltage difference across the storage capacitor Cst is ELVDD−VDATA−Vth.

In the light-emitting stage t3, the light-emitting control signal EM is of the turn-on voltage, the reset control signal RESET is of the turn-off voltage, and the scan signal SCAN is of the turn-off voltage. The first light-emitting control transistor T4 and the second light-emitting control transistor T5 are in the ON state, while the data writing transistor T2, the threshold compensation transistor T3, the first reset transistor T6 and the second reset transistor T7 are in the OFF state. The first voltage signal ELVDD is transmitted to the first electrode of the driving transistor T1 through the first light-emitting control transistor T4, the voltage of the gate electrode of the driving transistor T1 is maintained at VDATA+Vth, and the light-emitting current I flows into the light-emitting element 100*b* through the first light-emitting control transistor T4, the driving transistor T1, and the second light-emitting control transistor T5, and then the light-emitting element 100*b* emits light. That is, the first light-emitting control transistor T4 and the second light-emitting control transistor T5 receive the light-emitting control signal EM, and control the light-emitting element 100*b* to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Among them, $$K = 0.5 \; \mu_n \, \text{Cox} \frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (that is, the first electrode of the driving transistor T1 in this embodiment) of the driving transistor T1.

It can be seen from the above formula that the current flowing through the light-emitting element 100*b* is independent of the threshold voltage of the driving transistor T1. Therefore, the pixel circuit compensates the threshold voltage of the driving transistor T1 very well.

For example, the ratio of the duration of the light-emitting stage t3 to the display period of one frame can be adjusted. In this way, the luminous brightness can be controlled by adjusting the ratio of the duration of the light-emitting stage t3 to the display period of one frame. For example, by controlling a scan driving circuit in the display panel or an additional driving circuit, the ratio of the duration of the light-emitting stage t3 to the display period of one frame can be adjusted.

For example, the embodiments of the present disclosure are not limited to the specific pixel circuit illustrated in FIG. 16A, and other pixel circuits that can realize compensation for the driving transistor may be adopted. Based on the description and teaching of the implementation manner in the present disclosure, other arranging manners that a person of ordinary skill in the art can easily think of without creative work fall within the protection scope of the present disclosure.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching process, or may include other processes for forming predetermined patterns such as printing process and inkjet process. The photolithography process refers to the process including film formation, exposure, development, etc., using photoresist, mask, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
a base substrate, having a display region and a peripheral region, wherein the peripheral region is located on at least one side of the display region;
a pixel unit, located on the base substrate, and comprising a pixel circuit and a light-emitting element, wherein the pixel circuit is configured to drive the light-emitting element, the pixel circuit comprises a driving transistor and a data writing transistor, and the driving transistor is connected to the data writing transistor;
a data line, connected to the data writing transistor, and configured to provide a data signal to the pixel circuit; and
a compensation structure, connected to the data line, and located in the peripheral region, wherein the compensation structure comprises at least one of a resistance compensation unit or a capacitance compensation unit,
wherein the compensation structure comprises a capacitance compensation unit, the capacitance compensation unit comprises a first compensation portion, a first electrode-plate, a second compensation portion, and a second electrode-plate, the first compensation portion is connected to the data line, the first compensation portion overlaps with the first electrode-plate to form a first compensation capacitor, and the second compensation portion overlaps with the first electrode-plate to form a second compensation capacitor, the second compensation portion overlaps with the second electrode-plate to form a third compensation capacitor, and the first compensation capacitor, the second compensation capacitor, and the third compensation capacitor are connected in parallel.

2. The display panel according to claim 1, wherein the capacitance compensation unit comprises a plurality of compensation capacitors, and the plurality of compensation capacitors are connected in parallel.

3. The display panel according to claim 1, wherein the compensation structure comprises a resistance compensation unit, the resistance compensation unit comprises the first compensation portion connected to the data line and the second compensation portion connected to the first compensation portion, the first compensation portion and the second compensation portion are located in different layers, and an orthographic projection of the first compensation portion on the base substrate at least partially overlaps with an orthographic projection of the second compensation portion on the base substrate.

4. The display panel according to claim 1, wherein the first compensation portion is located in a first conductive layer, the first electrode-plate is located in a second conductive layer, the second compensation portion is located in a third conductive layer, and the second electrode-plate is located in a fourth conductive layer,
the first conductive layer is located on a first insulating layer, a second insulating layer is disposed between the first conductive layer and the second conductive layer, a third insulating layer is disposed between the second conductive layer and the third conductive layer, and a planarization layer is disposed between the third conductive layer and the fourth conductive layer.

5. The display panel according to claim 1, wherein the first compensation portion and the second compensation portion form the resistance compensation unit.

6. The display panel according to claim 1, wherein an orthographic projection of the first compensation portion on the base substrate at least partially overlaps with an orthographic projection of the second compensation portion on the base substrate.

7. The display panel according to claim 1, wherein a width of the first compensation portion in a first direction is same as a width of the second compensation portion in the first direction,
the first direction intersects with an extending direction of the first compensation portion and intersects with an extending direction of the second compensation portion,
the first compensation portion and the second compensation portion are connected through a via hole.

8. The display panel according to claim 1, further comprising a first connection structure, wherein the data line is connected to the first compensation portion through the first connection structure.

9. The display panel according to claim 4, wherein the third conductive layer further comprises a signal line, the signal line extends in a first direction, and an orthographic projection of the signal line on the base substrate overlaps with an orthographic projection of the first compensation portion on the base substrate.

10. The display panel according to claim 1, wherein the first electrode-plate and the second electrode-plate are both connected to a constant voltage terminal, and the constant voltage terminal includes at least one of a first power terminal and a second power terminal.

11. The display panel according to claim 1, further comprising a second connection structure, wherein the data line is connected to a plurality of capacitance compensation units through the second connection structure, and capacitors of the plurality of capacitance compensation units connected to the data line are connected in parallel.

12. The display panel according to claim 1, wherein first electrode-plates of different capacitance compensation units are of an integrated structure, or second electrode-plates of different capacitance compensation units are of an integrated structure.

13. The display panel according to claim 12, wherein a plurality of capacitance compensation units are arranged in a first direction; at one side of a center line of the display panel, a size of the first electrode-plate in a second direction gradually changes, and a size of the second electrode-plate in the second direction gradually changes; the first direction intersects with the second direction, and the center line is parallel with the second direction.

14. A display panel, comprising:
a base substrate, having a display region and a peripheral region, wherein the peripheral region is located on at least one side of the display region;
a pixel unit, located on the base substrate, and comprising a pixel circuit and a light-emitting element, wherein the pixel circuit is configured to drive the light-emitting element, the pixel circuit comprises a driving transistor and a data writing transistor, and the driving transistor is connected to the data writing transistor;
a data line, connected to the data writing transistor, and configured to provide a data signal to the pixel circuit; and
a compensation structure, connected to the data line, and located in the peripheral region, wherein the compensation structure comprises at least one of a resistance compensation unit or a capacitance compensation unit, wherein the data line comprises a first-type data line and a second-type data line, the compensation structure comprises a first compensation structure and a second compensation structure, and a compensation amount of the first compensation structure connected to the first-type data line is greater than a compensation amount of the second compensation structure connected to the second-type data line.

15. The display panel according to claim 14, wherein a plurality of first-type data lines and a plurality of first compensation structures are provided, the plurality of first compensation structures are arranged in sequence, and among the plurality of first compensation structures, the closer the first compensation structure is to an edge of the display panel, the smaller the compensation amount of the first compensation structure is.

16. The display panel according to claim 14, wherein a plurality of second-type data lines and a plurality of second compensation structures are provided, each of the plurality of second-type data lines comprises a first portion, a second portion, and a third portion, the first portion and the second portion are connected through the third portion, an extending direction of the third portion is different from an extending direction of the first portion, and the extending direction of the third portion is different from an extending direction of the second portion, the third portion is located in the display region, and a compensation amount of the second compensation structure is inversely proportional to a length of the third portion.

17. The display panel according to claim 1, wherein the display region comprises a first display region and a second display region, the first display region is located on at least one side of the second display region, and the data line is not located in the second display region, wherein
the pixel unit comprises a first pixel unit and a second pixel unit,
the pixel circuit and the light-emitting element of the first pixel unit are both located in the first display region,
the pixel circuit of the second pixel unit is located in the first display region, the light-emitting element of the second pixel unit is located in the second display region,
the pixel circuit of the second pixel unit is connected to the light-emitting element of the second pixel unit through a conductive line, and
an orthographic projection of the conductive line on the base substrate partially overlaps with an orthographic projection of the pixel circuit of the first pixel unit on the base substrate.

18. A display device, comprising the display panel according to claim 7.

19. The display device according to claim 18, further comprising a photosensitive sensor, wherein the photosensitive sensor is located on one side of the display panel.

20. The display panel according to claim 1, wherein first electrode-plates of different capacitance compensation units are of an integrated structure, second electrode-plates of different capacitance compensation units are of an integrated structure, a size of the integrated structure of the first electrode-plates of different capacitance compensation units in a second direction gradually changes in a stepwise manner, and a size of the integrated structure of the second electrode-plates of different capacitance compensation units in the second direction gradually changes in a stepwise manner.

* * * * *